(12) United States Patent
Mizoguchi et al.

(10) Patent No.: US 8,035,107 B2
(45) Date of Patent: Oct. 11, 2011

(54) METHOD FOR MANUFACTURING DISPLAY DEVICE

(75) Inventors: Takafumi Mizoguchi, Kanagawa (JP); Mayumi Mikami, Kanagawa (JP); Yumiko Saito, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 15 days.

(21) Appl. No.: 12/368,759

(22) Filed: Feb. 10, 2009

(65) Prior Publication Data

US 2009/0212296 A1 Aug. 27, 2009

(30) Foreign Application Priority Data

Feb. 26, 2008 (JP) ................................. 2008-043856

(51) Int. Cl.
*H01L 29/786* (2006.01)
(52) U.S. Cl. ............... 257/71; 438/22; 438/29; 438/151
(58) Field of Classification Search .................... 438/22, 438/728, 754, 29, 151, 158, 704; 257/71, 257/232, E21.414, E21.533, E29.273; 345/629; 349/47
See application file for complete search history.

(56) References Cited

U.S. PATENT DOCUMENTS

| | | | |
|---|---|---|---|
| 4,409,134 A | 10/1983 | Yamazaki | |
| 6,008,065 A | 12/1999 | Lee et al. | |
| 6,100,950 A * | 8/2000 | Tanaka | 349/47 |
| 6,485,997 B2 | 11/2002 | Lee et al. | |
| 6,493,048 B1 | 12/2002 | Baek et al. | |
| 6,635,581 B2 | 10/2003 | Wong | |
| 7,223,643 B2 | 5/2007 | Ohnuma et al. | |
| 2001/0049064 A1 | 12/2001 | Lee et al. | |
| 2006/0290867 A1 | 12/2006 | Ahn et al. | |
| 2007/0002249 A1 | 1/2007 | Yoo et al. | |
| 2007/0126969 A1 | 6/2007 | Kimura et al. | |

(Continued)

FOREIGN PATENT DOCUMENTS

JP 64-084669 3/1989

(Continued)

OTHER PUBLICATIONS

C.W. Kim et al.; "42.1: A Novel Four-Mask-Count Process Architecture for TFT-LCDs"; *SID Digest '00 : SID International Symposium Digest of Technical Papers*; pp. 1006-1009; 2000.

*Primary Examiner* — Marcos D Pizarro Crespo
*Assistant Examiner* — Sue Tang
(74) *Attorney, Agent, or Firm* — Fish & Richardson P.C.

(57) ABSTRACT

A first conductive film, a first insulating film, a semiconductor film, an impurity semiconductor film, a second conductive film, and a first resist mask are formed; first etching is performed to expose at least a surface of the first conductive film; second etching accompanied by side etching is performed on part of the first conductive film to form a gate electrode layer; a second resist mask is formed; third etching is performed to form a source and drain electrode layers, a source and drain regions, and a semiconductor layer; a second insulating film is formed; an opening portion is formed in the second insulating film to partially expose the source or drain electrode layer; a pixel electrode is selectively formed in the opening portion and over the second insulating film; and a supporting portion formed using the gate electrode layer is formed in a region overlapping with the opening portion.

14 Claims, 44 Drawing Sheets

U.S. PATENT DOCUMENTS

| | | |
|---|---|---|
| 2007/0139571 A1 | 6/2007 | Kimura |
| 2007/0146591 A1 | 6/2007 | Kimura et al. |
| 2007/0210344 A1* | 9/2007 | Arao et al. .................. 257/232 |
| 2007/0222936 A1 | 9/2007 | Shih |
| 2009/0152559 A1 | 6/2009 | Miyairi et al. |
| 2009/0233389 A1* | 9/2009 | Miyairi et al. ................ 438/22 |

FOREIGN PATENT DOCUMENTS

| | | |
|---|---|---|
| JP | 03-011744 | 1/1991 |
| JP | 03-161938 | 7/1991 |
| JP | 2003-179069 | 6/2003 |
| JP | 2007-133371 | 5/2007 |
| WO | 2008/099528 | 8/2008 |

* cited by examiner 100 102 104 106 108 110 112

114

116C 116B 116A

METHOD FOR MANUFACTURING DISPLAY DEVICE

BACKGROUND OF THE INVENTION

1. Field of the Invention

The present invention relates to a method for manufacturing a display device.

2. Description of the Related Art

In recent years, thin film transistors each formed using a semiconductor thin film with a thickness of several nm to several hundred nm over a substrate having an insulating surface, such as a glass substrate, have attracted attention. Thin film transistors have been widely used for ICs (integrated circuits) and electronic devices typified by electrooptic devices. Thin film transistors have been rapidly developed particularly as switching elements for display devices typified by liquid crystal display devices, EL (electroluminescent) display devices, and the like. In an active matrix liquid crystal display device, a voltage is applied between a selected pixel electrode connected to a switching element and a counter electrode corresponding to the selected pixel electrode, whereby a liquid crystal layer disposed between the selected pixel electrode and the counter electrode is subjected to optical modulation, which is perceived by a viewer as a display pattern. Here, an active matrix liquid crystal display device refers to a liquid crystal display device adopting a method in which pixel electrodes arranged in matrix are driven by switching elements to display a display pattern on a screen.

The range of uses of such an active matrix liquid crystal display devices described above has been increased and thus, demands for a larger size of a screen, higher definition, and a higher aperture ratio have been increased. Further, higher reliability of an active matrix liquid crystal display device is required and high productivity and reduction in manufacturing cost are required for a method for manufacturing the active matrix liquid crystal display device. Simplification of a process is one way for increasing productivity and reducing manufacturing cost.

In an active matrix liquid crystal display device, thin film transistors are mainly used as switching elements. In manufacturing thin film transistors, it is important that the number of photomasks to be used for photolithography be reduced in order to simplify a process. For example, when one more photomask is required, the following steps are further required: application of a resist, prebaking, light exposure, development, postbaking, and the like, and steps before and after the above steps, such as formation of a film, etching, removal of a resist, cleaning, and drying. Thus, even when only one more photomask is used in a manufacturing process, the number of steps is significantly increased. In order to reduce the number of photomasks used in a manufacturing process, many techniques have been developed.

Thin film transistors are broadly classified into top gate thin film transistors in each of which a channel formation region is provided below a gate electrode and bottom gate thin film transistors in each of which a channel formation region is provided above a gate electrode. It is known that the number of photomasks used in a process for manufacturing a bottom gate thin film transistor is smaller than that in a process for manufacturing a top gate thin film transistor. A bottom gate thin film transistor is generally manufactured using three photomasks.

Further, as conventional techniques for reducing the number of photomasks, complicated techniques such as backside light exposure, resist reflow, and a lift off method are often used and a particular apparatus is required in many cases. It has been concerned that using such complicated techniques may cause various problems, which leads to reduction in yield and the like. Further, the number of photomasks has been reduced at the cost of electric characteristics of a thin film transistor in many cases.

As a typical means for reducing the number of photomasks in a process for manufacturing thin film transistors, a technique using a multi-tone mask (referred to as a half-tone mask or a gray-tone mask) is widely known. As a technique for reducing manufacturing steps by using a multi-tone mask, for example, Patent Document 1 (Japanese Published Patent Application No. 2003-179069 is given. By using a multi-tone mask, a bottom gate thin film transistor can be manufactured using two photomasks.

SUMMARY OF THE INVENTION

However, even in the case where a bottom gate thin film transistor is manufactured using the above multi-tone mask, one photomask is required to be used for patterning a gate electrode layer and it has been difficult to further reduce the number of photomasks. That is, at least two photomasks are required for manufacturing a bottom gate thin film transistor.

In view of the above problems, an object of the invention to be disclosed is to provide a method for manufacturing a thin film transistor without using another photomask for patterning a gate electrode layer. Further, another object of the invention to be disclosed is to reduce the number of photomasks to be used for manufacturing a thin film transistor as compared to that of photomasks used conventionally, without using a complicated technique, in particular, to reduce the number of photomasks to be used for a photolithography method as compared to that of photomasks used conventionally, without using a complicated technique, in manufacturing a thin film transistor used for a pixel of a display device. Further, another object of the invention to be disclosed is to reduce the number of photomasks to be used in a process for manufacturing a thin film transistor and a display device including the thin film transistor, without reducing yield and reliability.

It is particularly preferable that the above manufacturing method be applied to form a thin film transistor provided for a pixel of a display device. Therefore, another object of the invention to be disclosed is to provide a method for manufacturing a display device with higher yield and higher reliability by using photomasks the number of which is smaller than that of a conventional method.

According to a method for manufacturing a thin film transistor according to one aspect of the invention to be disclosed, a first conductive film is formed, a thin film stack in which an insulating film, a semiconductor film, an impurity semiconductor film, and a second conductive film are stacked in this order is formed over the first conductive film, first etching is performed to pattern at least the thin film stack with the first conductive film exposed, and second etching is performed to pattern at least the first conductive film. Here, the second etching is performed under the condition by which the first conductive film is subjected to side etching.

Here, as the first etching, dry etching or wet etching may be adopted and a highly anisotropic etching (physical etching) method is preferably adopted. By adopting a highly anisotropic etching method as the first etching, processing precision of a pattern can be improved. Note that in the case of adopting dry etching, the first etching can be performed through one step, whereas in the case of adopting wet etching, the first etching may be performed through a plurality of steps. Therefore, dry etching is preferably adopted as the first etching.

As the second etching, dry etching or wet etching may be adopted and a highly isotropic etching (chemical etching) method is preferably adopted. By adopting a highly isotropic etching (chemical etching) method as the second etching, the first conductive film can be subjected to side etching. Therefore, wet etching is preferably adopted as the second etching.

Here, since the second etching is performed under the condition by which side etching of the first conductive film is also performed, the first conductive film is reduced in size so that side surfaces of the first conductive film are on the inner side than side surfaces of the patterned thin film stack. Accordingly, the side surfaces of the first conductive film which has been subjected to the second etching are on the inner side than the side surfaces of the patterned thin film stack. Further, the distances between the side surfaces of the patterned first conductive film and the side surfaces of the patterned thin film stack are mostly uniform.

Note that the pattern of the first conductive film refers to a top layout of a metal wiring used for forming, for example, a gate electrode, a gate wiring, a capacitor electrode, and a capacitor wiring.

Although the thin film transistor formed as described above can be applied to a display device, the thin film transistor does not easily keep a mechanical balance since a cavity is provided below an opening portion at which one of the source electrode and the drain electrode of the thin film transistor and a pixel electrode are connected to each other, which leads to reduction in yield and reliability. Therefore, in the display device to which a mode of the invention to be disclosed is applied, a supporting portion is provided below this connecting portion.

Another aspect of the invention to be disclosed is a method for manufacturing a display device, which includes a step of forming a first conductive film, a first insulating film, a semiconductor film, an impurity semiconductor film, and a second conductive film sequentially; a step of forming a first resist mask over the second conductive film; a step of performing first etching on the first insulating film, the semiconductor film, the impurity semiconductor film, and the second conductive film by using the first resist mask so that at least a surface of the first conductive film is exposed; a step of performing second etching accompanied by side etching on a portion of the first conductive film to form a gate electrode layer; a step of forming a second resist mask over the second conductive film; a step of performing third etching on the second conductive film, the impurity semiconductor film, and a portion of the semiconductor film by using the second resist mask to form a source electrode layer, a drain electrode layer, a source region, a drain region, and a semiconductor layer so that a thin film transistor is formed; a step of removing the second resist mask; a step of forming a second insulating film so that it covers the thin film transistor; a step of forming an opening portion in the second insulating film so that the source electrode layer or the drain electrode layer is partially exposed; and a step of selectively forming a pixel electrode in the opening portion and over the second insulating film, wherein a supporting portion formed using the gate electrode layer is formed in a region overlapping with the opening portion.

Another aspect of the invention to be disclosed is a method for manufacturing a display device, which includes a step of forming a first conductive film, a first insulating film, a semiconductor film, an impurity semiconductor film, and a second conductive film sequentially; a step of forming a first resist mask over the second conductive film; a step of performing first etching on the first insulating film, the semiconductor film, the impurity semiconductor film, and the second conductive film by using the first resist mask so that at least a surface of the first conductive film is exposed; a step of forming a second resist mask over the second conductive film; a step of performing second etching accompanied by side etching on a portion of the first conductive film to form a gate electrode layer after forming the second resist mask; a step of performing third etching on the second conductive film, the impurity semiconductor film, and a portion of the semiconductor film by using the second resist mask to form a source electrode layer, a drain electrode layer, a source region, a drain region, and a semiconductor layer so that a thin film transistor is formed; a step of removing the second resist mask; a step of forming a second insulating film so that it covers the thin film transistor; a step of forming an opening portion in the second insulating film so that the source electrode layer or the drain electrode layer is partially exposed; and a step of selectively forming a pixel electrode in the opening portion and over the second insulating film, wherein a supporting portion formed using the gate electrode layer is formed in a region overlapping with the opening portion.

Another aspect of the invention to be disclosed is a method for manufacturing a display device, which includes a step of forming a first conductive film, a first insulating film, a semiconductor film, an impurity semiconductor film, and a second conductive film sequentially; a step of forming a first resist mask having a depressed portion over the second conductive film; a step of performing first etching on the first insulating film, the semiconductor film, the impurity semiconductor film, and the second conductive film by using the first resist mask so that at least a surface of the first conductive film is exposed; a step of performing second etching accompanied by side etching on a portion of the first conductive film to form a gate electrode layer; a step of exposing the second conductive film overlapping with the depressed portion of the first resist mask by reducing the first resist mask in size and forming a second resist mask; a step of performing third etching on the second conductive film, the impurity semiconductor film, and a portion of the semiconductor film by using the second resist mask to form a source electrode layer, a drain electrode layer, a source region, a drain region, and a semiconductor layer so that a thin film transistor is formed; a step of removing the second resist mask; a step of forming a second insulating film so that it covers the thin film transistor; a step of forming an opening portion in the second insulating film so that the source electrode layer or the drain electrode layer is partially exposed; and a step of selectively forming a pixel electrode in the opening portion and over the second insulating film, wherein a supporting portion formed using the gate electrode layer is formed in a region overlapping with the opening portion.

Another aspect of the invention to be disclosed is a method for manufacturing a display device, which includes a step of forming a first conductive film, a first insulating film, a semiconductor film, an impurity semiconductor film, and a second conductive film sequentially; a step of forming a first resist mask having a depressed portion over the second conductive film; a step of performing first etching on the first insulating film, the semiconductor film, the impurity semiconductor film, and the second conductive film by using the first resist mask so that at least a surface of the first conductive film is exposed; a step of exposing the second conductive film overlapping with the depressed portion of the first resist mask by reducing the first resist mask in size and forming a second resist mask; a step of performing second etching accompanied by side etching on a portion of the first conductive film to form a gate electrode layer after forming the second resist mask; a step of performing third etching on the second conductive film, the impurity semiconductor film, and a portion of the semiconductor film by using the second resist mask to form a source electrode layer, a drain electrode layer, a source region, a drain region, and a semiconductor layer so that a thin film transistor is formed; a step of removing the second resist mask; a step of forming a second insulating film so that it covers the thin film transistor; a step of forming an opening portion in the second insulating film so that the source electrode layer or the drain electrode layer is partially exposed; and a step of selectively forming a pixel electrode in the opening portion and over the second insulating film, wherein a supporting portion formed using the gate electrode layer is formed in a region overlapping with the opening portion.

In the case where any of the methods for manufacturing a display device, according to the above modes, is adopted and the first resist mask has a depressed portion, the first resist mask is preferably formed using a multi-tone mask. By using a multi-tone mask, a resist mask having a depressed portion can be formed through a simple process.

By adopting any of the methods for manufacturing a display device, according to the above modes, an element region is formed by the first etching, and side surfaces of the gate electrode layer can be provided on the inner side than side surfaces of the element region so that the distances between the side surfaces of the gate electrode layer and the side surfaces of the element region are mostly uniform by the second etching.

In any of the methods for manufacturing a display device, in which the first etching and the second etching are adopted, according to the above modes, dry etching and wet etching are preferably performed as the first etching and the second etching, respectively. Processing by the first etching is preferably performed highly precisely and processing by the second etching is required to be accompanied by side etching. For highly precise processing, dry etching is preferable and wet etching which utilizes chemical reaction is more likely to cause side etching than dry etching.

In any of the methods for manufacturing a display device, according to the above structures, the second insulating film is preferably formed by stacking an insulating film formed by a CVD method or a sputtering method and an insulating film formed by a spin coating method. It is particularly preferable that a silicon nitride film be formed by a CVD method or a sputtering method and an organic resin film be formed by a spin coating method. By thus forming a protective insulating film, the thin film transistor can be protected from an impurity element or the like which may adversely affect electric characteristics of the thin film transistor and planarity of a surface on which a pixel electrode is formed can be improved, so that reduction in yield can be prevented.

In a display device manufactured by any of the methods for manufacturing a display device, according to the above modes, a portion of the gate electrode layer overlaps with the opening portion. The portion of the gate electrode layer overlaps with the opening portion, so that the layered film can be supported and thus the display device can be prevented from being broken under its own weight. Further, the vicinity of an end portion of a gate electrode can have a lower dielectric constant (low-k) since cavity is provided adjacent to the side surface of the gate electrode layer.

Note that a "film" refers to what is formed over an entire surface and is not patterned. A "layer" refers to what is patterned into a desired form with a resist mask or the like. However, when referring to each layer of a layered film, a "film" and a "layer" are used without being particularly distinguished from each other in some cases.

Note that etching is preferably performed so that "unintentional etching" is not caused as much as possible.

Note that a "gate wiring" refers to a wiring connected to a gate electrode of a thin film transistor. A gate wiring is formed using a gate electrode layer. Further, a gate wiring may be referred to as a scan line.

Further, a "source wiring" refers to a wiring connected to a source electrode or a drain electrode of a thin film transistor. A source wiring is formed using a source electrode layer or a drain electrode layer. Further, a source wiring may be referred to as a signal line.

According to the invention to be disclosed, another photomask is not required for patterning a gate electrode and thus, the number of steps for manufacturing a thin film transistor can be significantly reduced. Further, a thin film transistor manufactured by the invention disclosed herein can be applied to a display device, so that the number of steps for manufacturing a display device can also be significantly reduced.

Specifically, according to the invention to be disclosed, the number of photomasks can be reduced. A thin film transistor can also be manufactured using one photomask (multi-tone mask). Thus, the number of steps for manufacturing a thin film transistor or a display device can be significantly reduced.

Further, complicated steps such as backside light exposure, resist reflow, and a lift-off method, are not required to be performed unlike in a conventional technique aimed at reduction of the number of photomasks. Therefore, the number of manufacturing steps can be significantly reduced without reducing yield of a thin film transistor, and the number of steps for manufacturing a display device can be significantly reduced.

Further, in a conventional technique, the number of photomasks is reduced at the cost of electric characteristics; however, according to the invention to be disclosed, the steps for manufacturing a thin film transistor can be significantly reduced without changing electric characteristics of a thin film transistor.

Further, manufacturing cost can be significantly reduced by the above advantageous effects.

In addition to the above advantageous effects, a thin film transistor included in a display device is mechanically stable; therefore, a manufacturing process of a display device can be simplified without reducing yield and reliability.

Note that a thin film transistor manufactured by the invention to be disclosed has a cavity adjacent to an end portion of a gate electrode layer; therefore, a leakage current generated between a gate electrode and a drain electrode is small.

DETAILED DESCRIPTION OF THE INVENTION

Figure 1A:
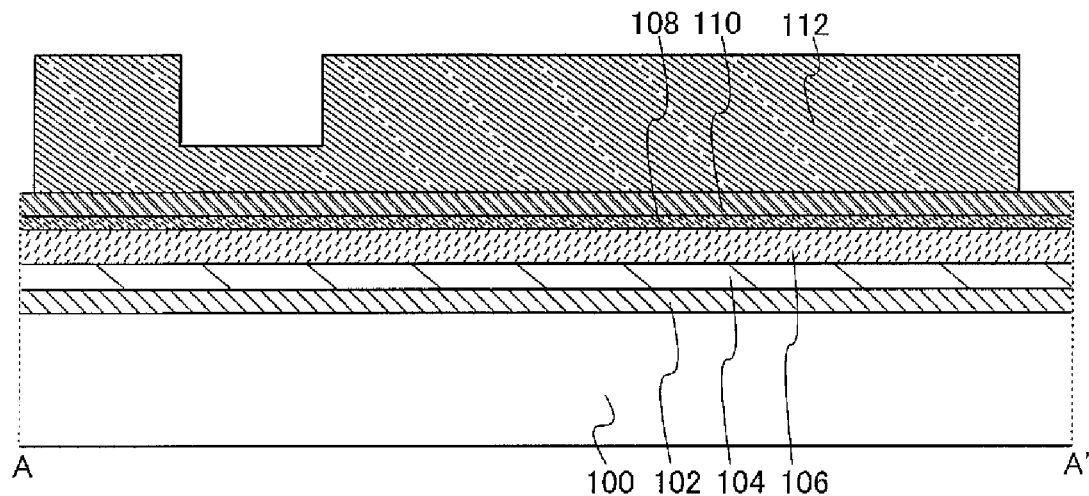
FIG. 1A to 1C illustrate an example of a method for manufacturing a thin film transistor and a display device.
Figure 1B:
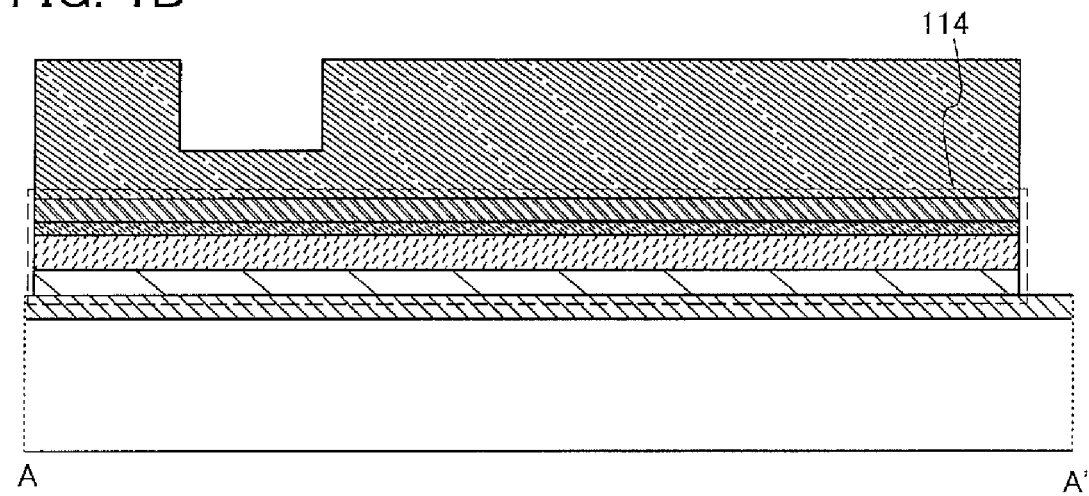
Figure 1C:
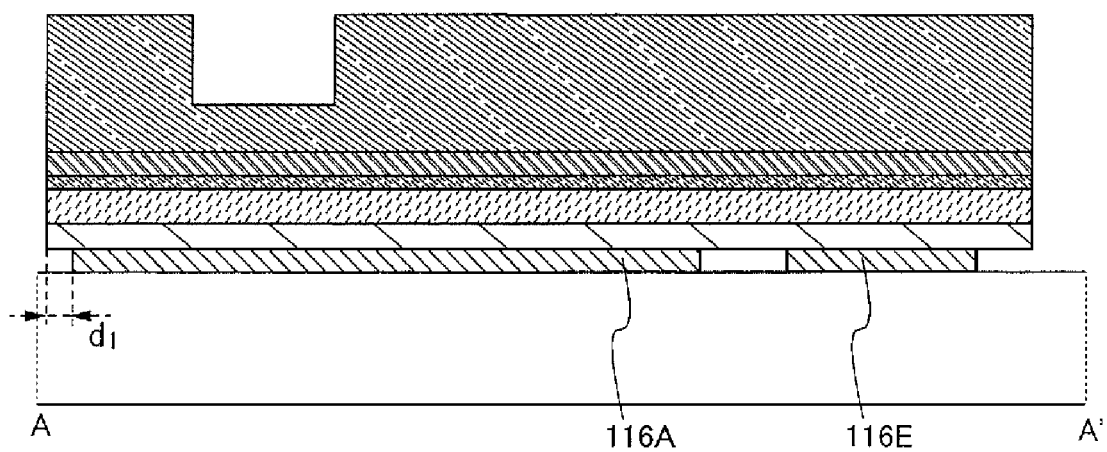

The embodiment modes of the invention to be disclosed will be described with reference to the drawings. However, the invention disclosed herein is not limited to the following description because it will be easily understood by those skilled in the art that various changes and modifications can be made to the modes and their details without departing from the spirit and scope of the invention disclosed herein. Therefore, the invention disclosed herein should not be construed as being limited to the description in the following embodiment modes. Note that in describing a structure of the invention disclosed herein with reference to the drawings, common reference numerals are used for the same parts throughout the drawings. Further, the same hatched patterns are applied to the same parts, and the same parts are not especially denoted by reference numerals in some cases. Further, in a top plan view, an insulating film is omitted for convenience.

Embodiment Mode 1

In this embodiment mode, an example of a method for manufacturing a thin film transistor and an example of a method for manufacturing a display device in which thin film transistors obtained by the above method are arranged in matrix will be described with reference to FIGS. 1A to 1C, FIGS. 2A to 2C, FIGS. 3A to 3C, FIGS. 4A to 4C, FIGS. 5A to 5C, FIGS. 6A to 6C, FIGS. 7A to 7C, FIGS. 8A to 8C, FIGS. 9A to 9C, FIGS. 10A to 10C, FIGS. 11A to 11C, FIGS. 12A to 12C, FIGS. 13A to 13C, FIGS. 14A to 14C, FIGS. 15A to 15C, FIG. 16, FIG. 17. FIG. 18, FIG. 19, FIG. 20, FIG. 21, FIG. 22, FIGS. 23A to 23C, FIGS. 24A-1 to 24B-2, FIG. 25, FIG. 26, and FIG. 27.

Figure 20:
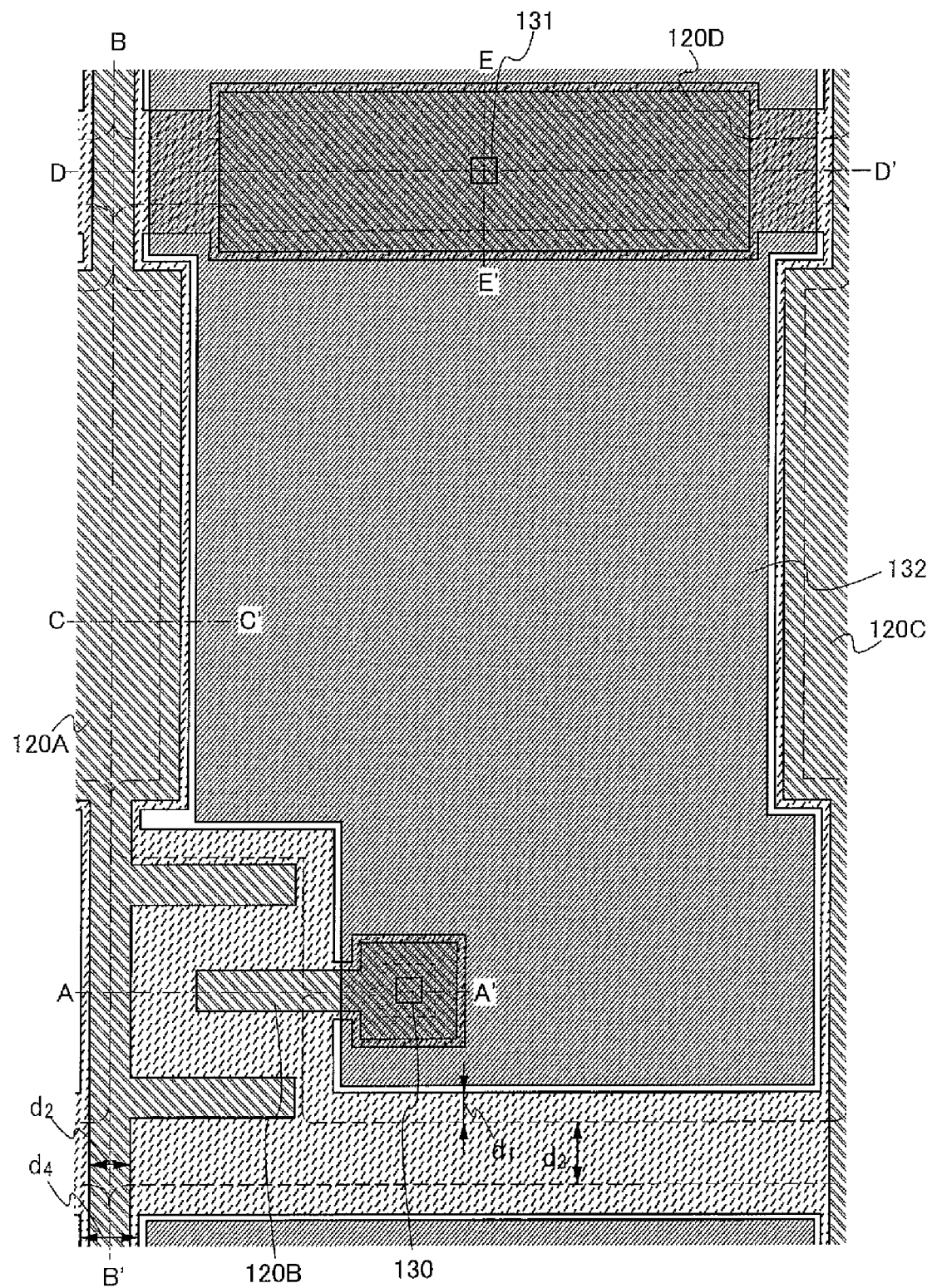
FIG. 20 illustrates an example of a method for manufacturing a thin film transistor and a display device.

Note that FIG. 16, FIG. 17, FIG. 18, FIG. 19, and FIG. 20 illustrate top plan views of a thin film transistor according to this embodiment mode, and FIG. 20 is a completion view in which components are formed up to a pixel electrode. FIGS. 1A to 1C, FIGS. 2A to 2C, and FIGS. 3A to 3C are cross-sectional views along A-A' in FIG. 16, FIG. 17, FIG. 18, FIG. 19, and FIG. 20. FIGS. 4A to 4C, FIGS. 5A to 5C, and FIGS. 6A to 6C are cross-sectional views along B-B' in FIG. 16, FIG. 17, FIG. 18, FIG. 19, and FIG. 20. FIGS. 7A to 7C, FIGS. 8A to 8C, and FIGS. 9A to 9C are cross-sectional views along C-C' in FIG. 16, FIG. 17, FIG. 18, FIG. 19, and FIG. 20. FIGS. 10A to 10C, FIGS. 11A to 11C, and FIGS. 12A to 12C are cross-sectional views along D-D' in FIG. 16, FIG. 17, FIG. 18, FIG. 19, and FIG. 20. FIGS. 13A to 13C, FIGS. 14A to 14C, and FIGS. 15A to 15C are cross-sectional views along E-E' in FIG. 16, FIG. 17, FIG. 18, FIG. 19, and FIG. 20.

First, a first conductive film 102, a first insulating film 104, a semiconductor film 106, an impurity semiconductor film 108, and a second conductive film 110 are formed over a substrate 100. Each of the films may have a single-layer structure or a layered structure in which a plurality of films are stacked.

The substrate 100 is an insulating substrate. As the substrate 100, a glass substrate or a quartz substrate can be used. In this embodiment mode, a glass substrate is used.

The first conductive film 102 is formed using a conductive material. The first conductive film 102 can be formed using a conductive material such as a metal material such as titanium, molybdenum, chromium, tantalum, tungsten, aluminum, copper, neodymium, niobium, or scandium or an alloy material containing any of the above materials as its main component. Note that the material of the first conductive film 102 is required to be a material which has heat resistance high enough to withstand a subsequent step (such as formation of the first insulating film 104) and which is not unintentionally etched or eroded through a subsequent step (such as etching of the second conductive film 110). The first conductive film 102 is not limited to a specific material as long as this requirement is met.

Note that the first conductive film 102 can be formed by, for example, a sputtering method or a CVD method (including a thermal CVD method, a plasma CVD method, and the like). Note that the method for forming the first conductive film 102 is not limited to a particular method.

Further, the first insulating film 104 serves as a gate insulating film.

The first insulating film 104 is formed using an insulating material. The first insulating film 104 can be formed using, for example, an oxide film of silicon, a nitride film of silicon, an oxynitride film of silicon, or a nitride oxide film of silicon. Note that the material of the first insulating film 104 is required to be a material which has heat resistance and which is not unintentionally etched or eroded through a subsequent step, similarly to the material of the first conductive film 102. The first insulating film 104 is not limited to a specific material as long as this requirement is met.

Note that the first insulating film 104 can be formed by, for example, a sputtering method or a CVD method (including a thermal CVD method, a plasma CVD method, and the like), and the method for forming the first insulating film 104 is not limited to a particular method.

The semiconductor film 106 is formed using a semiconductor material. The semiconductor film 106 can be formed using, for example, amorphous silicon formed with a silane gas. Note that the material of the semiconductor film 106 is required to be a material which has heat resistance and which is not unintentionally etched or eroded through a subsequent step, similarly to the material of the first conductive film 102 or the like. The semiconductor film 106 is not limited to a specific material as long as this requirement is met. Therefore, germanium may be used. Note that there is no particular limitation on crystallinity of the semiconductor film 106.

Note that the semiconductor film 106 can be formed by, for example, a sputtering method or a CVD method (including a thermal CVD method, a plasma CVD method, and the like). Note that the method for forming the semiconductor film 106 is not limited to a particular method.

The impurity semiconductor film 108 is a semiconductor film containing an impurity element imparting one conductivity type and formed with a semiconductor material gas to which an impurity element imparting one conductivity type is added, or the like. The impurity semiconductor film 108 is, for example, a silicon film containing phosphorus or boron, which is formed with a silane gas containing phosphine (chemical formula: $PH_3$) or diborane (chemical formula: $B_2H_6$). Note that the material of the impurity semiconductor film 108 is required to be a material which has heat resistance and which is not unintentionally etched or eroded through a subsequent step, similarly to the material of the first conductive film 102 or the like. The impurity semiconductor film 108 is not limited to a particular material as long as this requirement is met. Note that there is no particular limitation on crystallinity of the impurity semiconductor film 108.

Note that in the case of manufacturing an n-channel thin film transistor, phosphorus, arsenic, or the like may be used as the impurity element imparting one conductivity type, which is to be added. That is, a silane gas used for formation of the impurity semiconductor film 108 may contain phosphine, arsine (chemical formula: $AsH_3$), or the like at a desired concentration. On the other hand, in the case of manufacturing a p-channel thin film transistor, boron or the like may be used as the impurity element imparting one conductivity type, which is to be added. That is, a silane gas used for formation of the impurity semiconductor film 108 may contain diborane or the like at a desired concentration.

Note that the impurity semiconductor film 108 can be formed by, for example, a CVD method (including a thermal CVD method, a plasma CVD method, and the like). Note that the method for forming the impurity semiconductor film 108 is not limited to a particular method.

The second conductive film 110 is formed using a material which is a conductive material (a material mentioned as the material of the first conductive film 102) but is different from the material used for the first conductive film 102. Here, the "different material" refers to a material having a different main component. Specifically, a material which is not easily etched by second etching described later is preferably selected. Further, the material of the second conductive film 110 is required to be a material which has heat resistance and is not unintentionally etched or eroded in a subsequent step, similarly to the material of the first conductive film 102 or the like. Accordingly, the material of the second conductive film 110 is not limited to a particular material as long as this requirement is met.

Note that the second conductive film 110 can be formed by, for example, a sputtering method or a CVD method (including a thermal CVD method, a plasma CVD method, and the like). Note that the method for forming the second conductive film 110 is not limited to a particular method.

Next, a first resist mask 112 is formed over the second conductive film 110 (see FIG. 1A, FIG. 4A, FIG. 7A, FIG. 10A, and FIG. 13A). The first resist mask 112 is a resist mask having a depressed portion or a projected portion. In other words, the first resist mask 112 can also be referred to as a resist mask including a plurality of regions (here, two regions) having different thicknesses. In the first resist mask 112, a thick region is referred to as a projected portion of the first resist mask 112 and a thin region is referred to as a depressed portion of the first resist mask 112.

In the first resist mask 112, a projected portion is formed in a region where a source or drain electrode layer 120 is formed, and a depressed portion is formed in a region where the source or drain electrode layer 120 is not provided and a semiconductor layer is exposed.

The first resist mask 112 can be formed using a common multi-tone mask. Here, multi-tone masks will be described below with reference to FIGS. 24A-1 to 24B-2.

A multi-tone mask is a mask capable of light exposure with multi-level light intensity, and typically, light exposure is performed with three levels of light intensity to provide an exposed region, a half-exposed region, and an unexposed region. By using the multi-tone mask, one-time light exposure and development process allows a resist mask with plural thicknesses (typically, two levels of thicknesses) to be formed. Therefore, by using a multi-tone mask, the number of photomasks can be reduced.

Figures 1, 24A:
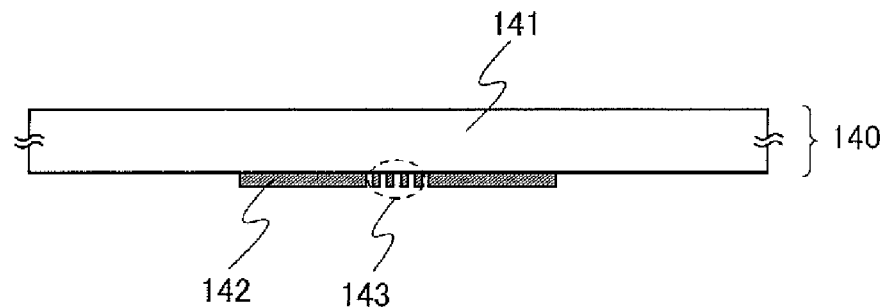
FIGS. 24A-1 to 24B-2 illustrate multi-tone masks.
Figures 2, 24A:
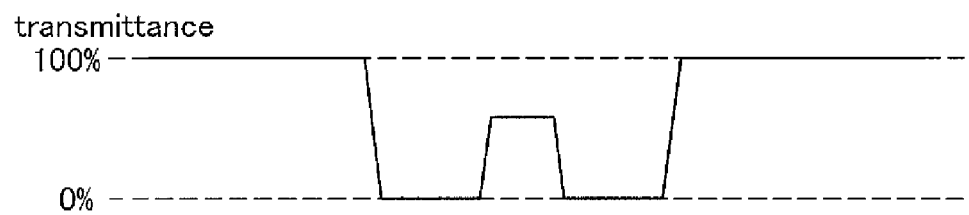
Figures 1, 24B:
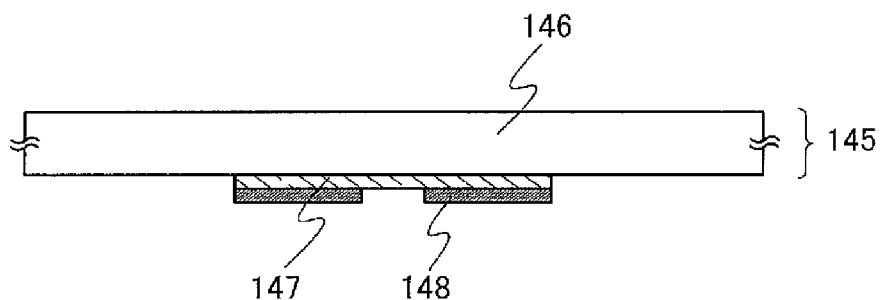
Figures 2, 24B:
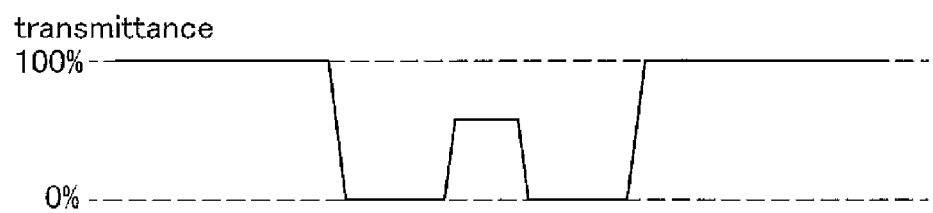

FIG. 24A-1 and FIG. 24B-1 are cross-sectional views of typical multi-tone masks. A gray-tone mask 140 is illustrated in FIG. 24A-1 and a half-tone mask 145 is illustrated in FIG. 24B-1.

The gray-tone mask 140 illustrated in FIG. 24A-1 includes a light-shielding portion 142 formed using a light-shielding film on a substrate 141 having a light-transmitting property, and a diffraction grating portion 143 provided with a pattern of the light-shielding film.

The diffraction grating portion 143 has slits, dots, mesh, or the like provided at intervals less than or equal to the resolution limit of light used for light exposure so that the light transmittance is controlled. Note that the slits, dots, or mesh of the diffraction grating portion 143 may be provided regularly or irregularly As the substrate 141 having a light-transmitting property, quartz or the like can be used. The light-shielding film for forming the light-shielding portion 142 and the diffraction grating portion 143 may be formed using a metal film and preferably provided using chromium, chromium oxide, or the like.

In the case where the gray-tone mask 140 is irradiated with light for light exposure, as illustrated in FIG. 24A-2, the transmittance in the region overlapping with the light-shielding portion 142 is 0%, and the transmittance in the region where both the light-shielding portion 142 and the diffraction grating portion 143 are not provided is 100%. Further, the transmittance at the diffraction grating portion 143 is approximately in the range of 10 to 70%, which can be adjusted by the interval of slits, dots, or mesh of the diffraction grating, or the like.

The half-tone mask 145 illustrated in FIG. 24B-1 includes a semi-light-transmitting portion 147 formed using a semi-light-transmitting film on a substrate 146 having a light-transmitting property, and a light-shielding portion 148 formed using a light-shielding film.

The semi-light-transmitting portion 147 can be formed using a film of MoSiN, MoSi, MoSiO, MoSiON, CrSi, or the like. The light-shielding portion 148 may be formed using a metal film similarly to the light-shielding film of the gray-tone mask and preferably provided using chromium, chromium oxide, or the like.

In the case where the half-tone mask 145 is irradiated with light for light exposure, as illustrated in FIG. 24B-2, the transmittance in the region overlapping with the light-shielding portion 148 is 0%, and the transmittance in the region where both the light-shielding portion 148 and the semi-light-transmitting portion 147 are not provided is 100%. Further, the transmittance in the semi-light-transmitting portion 147 is approximately in the range of 10 to 70%, which can be adjusted by the kind, the thickness, or the like of a material to be formed.

By light exposure using the multi-tone mask and development, the first resist mask 112 which includes regions having different thicknesses can be formed.

Next, first etching is performed using the first resist mask 112. That is, the first insulating film 104, the semiconductor film 106, the impurity semiconductor film 108, and the second conductive film 110 are etched to form a thin film stack 114 (see FIG. 1B, FIG. 4B, FIG. 7B, FIG 10B, FIG. 13B, and FIG. 16). At this time, at least a surface of the first conductive film 102 is preferably exposed. In this specification, this etching step is referred to as first etching. As the first etching, either dry etching or wet etching may be adopted. Note that in the case of adopting dry etching, the first etching can be performed through one step, whereas in the case of adopting wet etching, the first etching is preferably performed through a plurality of steps because the etching rate varies depending on the kind of a film to be etched and it is difficult to perform the etching through one step.

Here, the first etching may be performed under the following condition. For example, dry etching is performed at three levels as the first etching in the case where the first conductive film 102 is a molybdenum film with a thickness of 150 nm, the first insulating film 104 is a silicon nitride film with a thickness of 300 nm, the semiconductor film 106 is an amorphous silicon film with a thickness of 150 nm, the impurity semiconductor film 108 is an amorphous silicon film containing phosphorus with a thickness of 50 nm, and the second conductive film 110 is a tungsten film with a thickness of 300 nm. In the first etching, first, etching is performed by supplying an RF power of 500 W for 260 seconds under the conditions that the flow ratio of a mixed gas is 40 sccm: 40 sccm: 20 sccm ($CL_2$: $CF_4$: $O_2$) and the pressure in a chamber is 13.3 Pa. Next, etching is performed by supplying an RF power of 500 W for 240 seconds under the conditions that only a $Cl_2$ gas with a flow rate of 100 sccm is used and the pressure in a chamber is 13.3 Pa. Finally, an RF power of 1000 W is supplied for 400 seconds, for another 200 seconds, and further, for still another 400 seconds under the conditions that only a $CHF_3$ gas with a flow rate of 100 sccm is used and the pressure in a chamber is 13.3 Pa. Thus, the first etching can be performed.

Next, second etching is performed using the first resist mask 112. That is, the first conductive film 102 is etched to form a gate electrode layer 116 (see FIG. 1C, FIG. 4C, FIG. 7C, FIG. 10C, FIG. 13C, and FIG. 17). In this specification, this etching step is referred to as second etching.

Note that the gate electrode layer 116 forms a gate wiring, a capacitor wiring, and a supporting portion. In the case where the gate electrode layer is referred to as a gate electrode layer 116A, the gate electrode layer serving as a gate wiring is denoted. In the case where the gate electrode layer is referred to as a gate electrode layer 116B, a gate electrode layer 116D or a gate electrode layer 116E, the gate electrode layer serving as a supporting portion is denoted. In the case where the gate electrode layer is referred to as a gate electrode layer 116C, the gate electrode layer serving as a capacitor wiring is denoted. These gate electrode layers are collectively referred to as the gate electrode layer 116.

The second etching is performed under the etching conditions by which a side surface of the gate electrode layer 116 formed from the first conductive film 102 is provided on the inner side than a side surface of the thin film stack 114. In other words, the second etching is performed so that the side surface of the gate electrode layer 116 is in contact with a bottom surface of the thin film stack 114 (etching is performed so that the width of the gate electrode layer 116 is smaller than that of the thin film stack 114 in cross section along A-A'). Further, the second etching is performed under the conditions by which the etching rate with respect to the second conductive film 110 is low and the etching rate with respect to the first conductive film 102 is high. In other words, the second etching is performed under the conditions by which the etching selectivity of the first conductive film 102 to the second conductive film 110 is high. By performing the second etching under such conditions, the gate electrode layer 116 can be formed.

Note that there is no particular limitation on the shape of the side surface of the gate electrode layer 116. For example, the shape may be a tapered shape. The shape of the side surface of the gate electrode layer 116 is determined depending on the conditions such as a chemical used in the second etching.

Here, the phrase "the conditions by which the etching rate with respect to the second conductive film 110 is low and the etching rate with respect to the first conductive film 102 is high" or "the conditions by which the etching selectivity of the first conductive film 102 with respect to the second conductive film 110 is high" refers to conditions meeting the following first requirement and second requirement.

The first requirement is that the gate electrode layer 116 is left in a portion necessarily provided with the gate electrode layer 116. The portion necessarily provided with the gate electrode layer 116 refers to regions indicated by dotted lines in FIG. 17, FIG. 11, FIG. 19, and FIG. 20. That is, it is necessary that the gate electrode layer 116 be left so as to form a gate wiring, a capacitor wiring, and a supporting portion after the second etching. In order that the gate electrode layer may form the gate wiring and the capacitor wiring, the second etching is required to be performed so as not to disconnect these wirings. As illustrated in FIGS. 1A to 1C and FIG. 20, the side surface of the gate electrode layer 116 is preferably provided on the inner side than the side surface of the thin film stack 114 by a distance $d_1$, and the distance $d_1$ may be set as appropriate according to the layout by a practitioner.

The second requirement is that a width $d_3$ of the gate wiring or the capacitor wiring formed using the gate electrode layer 116 and a minimum width $d_2$ of a source wiring formed using a source or drain electrode layer 120A have appropriate values (see FIG. 20). This is because as the source or drain electrode layer 120A is etched more by the second etching, the minimum width $d_2$ of the source wiring is reduced; accordingly, the current density of the source wiring becomes excessive and electric characteristics are degraded. Therefore, the second etching is performed under the conditions by which the etching rate with respect to the first conductive film 102 is not too high and the etching rate with respect to the second conductive film 110 is as low as possible. In addition, third etching described later is performed under the conditions by which the etching rate with respect to the first conductive film 102 is as low as possible.

It is difficult to make the minimum width $d_2$ of the source wiring large. This is because the minimum width $d_2$ of the source wiring is determined by a minimum width $d_4$ of the semiconductor layer overlapping with the source wiring, the minimum width $d_4$ of the semiconductor layer is required to be increased in order to make the minimum width $d_2$ of the source wiring larger, and it becomes difficult to insulate the gate wiring and the capacitor wiring, which are adjacent to each other, from each other. To solve such a problem, the minimum width $d_4$ of the semiconductor layer is set smaller than approximately twice the distance $d_1$. In other words, the distance $d_1$ is set larger than approximately half the minimum width $d_4$ of the semiconductor layer.

It is acceptable as long as there is at least one portion where the width of the semiconductor layer overlapping with the source wiring is the minimum width $d_4$ between the gate wiring and the capacitor wiring which is adjacent to the gate wiring. It is preferable that the width of the semiconductor layer in a region adjacent to the gate wiring and a region adjacent to the capacitor wiring be the minimum width $d_4$ as illustrated in FIG. 20.

Note that the width of the electrode in a portion connected to a pixel electrode layer, which is formed using the source or drain electrode layer, be equal to the minimum width $d_2$ of the source wiring.

As described above, the second etching under the condition that side etching can also be performed is significantly important. This is because the second etching is accompanied by side etching of the first conductive film 102, whereby the gate wiring and the capacitor wiring, which are adjacent to each other and are formed using the gate electrode layer 116, can be insulated from each other (see FIG. 17).

Here, side etching refers to etching in which a film is etched in not only a thickness direction of the film (a direction perpendicular to the substrate surface or a direction perpendicular to the surface of a base film of the film) but also in a direction perpendicular to the thickness direction (a direction parallel to the substrate surface or a direction parallel to the surface of the base film of the film). An end portion of the film subjected to side etching can have various shapes depending on the etching rate of an etching gas or a chemical used for the etching with respect to the film. The end portion of the film is, in many cases, formed to have a curved surface.

Figure 17:
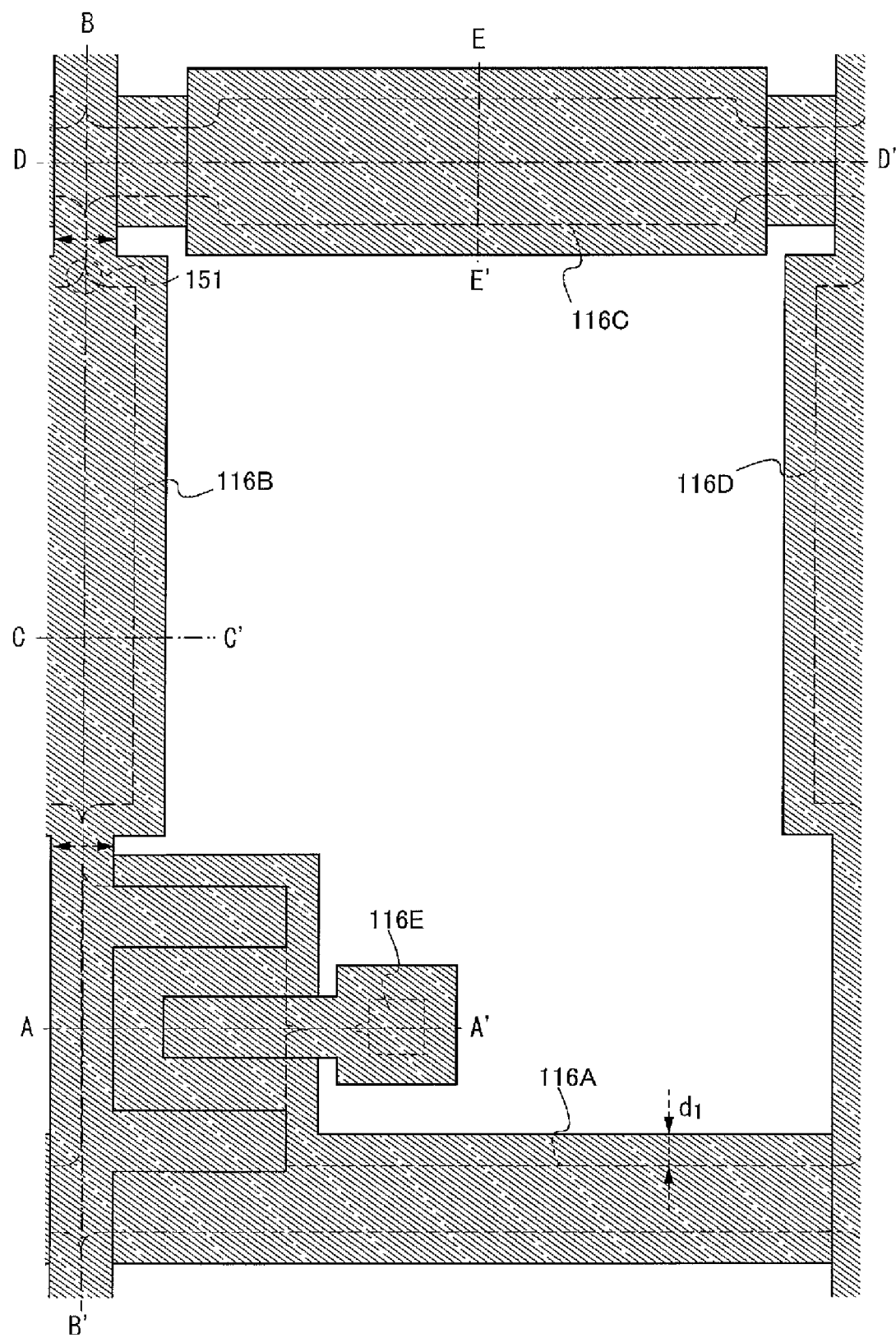
FIG. 17 illustrates an example of a method for manufacturing a thin film transistor and a display device.

Note that as illustrated in FIG. 17, the thin film stack 114 formed by the first etching is designed to be narrow in a portion adjacent to a supporting portion which is formed using the gate electrode layer 116B or the gate electrode layer 116D (see the portions indicated by the arrows in FIG. 17). With this structure, the gate electrode layer 116A and the gate electrode layer 116B or the gate electrode layer 116D can be disconnected to be insulated from each other by the second etching.

Note that the gate electrode layer 116B and the gate electrode layer 116D which are illustrated in FIG. 17 each serve as a supporting portion which supports the thin film stack 114. By providing the supporting portion, peeling of a film such as a gate insulating film formed over the gate electrode layer can be prevented. Further, by providing the supporting portion, a cavity region formed adjacent to the gate electrode layer 116 by the second etching can be prevented from being larger than necessary. Note that it is preferable to provide the supporting portion because the thin film stack 114 can be prevented from being broken or damaged under its own weight and accordingly, yield is increased. In particular, by providing a supporting portion formed using the gate electrode layer 116E, the thin film transistor can keep a mechanical balance and thus, the process for forming the thin film transistor can be simplified without reducing yield and reliability.

As described above, wet etching is preferably performed as the second etching.

In the case where wet etching is performed as the second etching, aluminum or molybdenum may be formed as the first conductive film 102, titanium or tungsten may be formed as the second conductive film 110, and a chemical containing nitric acid, acetic acid, and phosphoric acid may be used for etching. Alternatively, molybdenum may be formed as the first conductive film 102, titanium, aluminum, or tungsten may be formed as the second conductive film 110, and a chemical containing hydrogen peroxide water may be used for etching.

In the case where wet etching is performed as the second etching, it is most preferable that a layered film in which molybdenum is formed over aluminum to which neodymium is added be formed as the first conductive film 102, tungsten be formed as the second conductive film 110, and a chemical containing nitric acid at 2%, acetic acid at 10%, and phosphoric acid at 72% be used for etching. By using a chemical having such a composition ratio, the first conductive film 102 can be etched without the second conductive film 110 being etched. Note that neodymium is added to the first conductive film 102 for the purpose of reducing resistance of aluminum and preventing hillocks.

As illustrated in FIG. 17, the gate electrode layer 116 has a horn (for example, a horn 151) when seen from the above. This is because since the second etching for forming the gate electrode layer 116 is approximately isotropic, etching progresses so that the distance $d_1$ between the side surface of the gate electrode layer 116 and the side surface of the thin film stack 114 is mostly uniform.

Next, the first resist mask 112 is reduced in size; accordingly, the second conductive film 110 is exposed and a second resist mask 118 is formed. As a means for forming the second resist mask 118 by reducing the first resist mask 112 in size, for example, ashing using oxygen plasma can be given. However, the means for forming the second resist mask 118 by reducing the first resist mask 112 in size is not limited to this. Note that the case where the second resist mask 118 is formed after the second etching is described here; however, the invention to be disclosed is not limited to this and the second etching maybe performed after formation of the second resist mask 118.

Next, the second conductive film 110 in the thin film stack 114 is etched using the second resist mask 118 to form the source or drain electrode layer 120 (see FIG. 2A, FIG. 5A, FIG. 8A, FIG. 11A, FIG. 14A, and FIG. 18). Here, as the etching conditions, the conditions by which films other than the second conductive film 110 are not unintentionally etched or eroded or are not easily unintentionally etched or eroded are selected. In particular, it is important that etching is performed under the conditions by which the gate electrode layer 116 is not unintentionally etched or eroded or is not easily unintentionally etched or eroded.

Note that the source or drain electrode layer 120 forms the source wiring, the electrode which connects the thin film transistor and the pixel electrode to each other, and one electrode of a capacitor serving as a storage capacitor. When the source or drain electrode layer is referred to as the source or drain electrode layer 120A or a source or drain electrode layer 120C, the electrode layer serving as a source wiring is denoted. When the source or drain electrode layer is referred to as a source or drain electrode layer 120B, the electrode layer which connects a drain electrode of the thin film transistor and the pixel electrode to each other is denoted. When the source or drain electrode layer is referred to as a source or drain electrode layer 120D, the one electrode layer which forms the capacitor with the capacitor wiring is denoted. These source or drain electrode layers are collectively referred to as the source or drain electrode layer 120.

Note that for etching the second conductive film 110 in the thin film stack 114, either wet etching or dry etching may be performed.

Then, the impurity semiconductor film 108 and an upper portion of the semiconductor film 106 (back channel portion) in the thin film stack 114 are etched to form a source and drain region 122 (see FIG. 2B, FIG. 5B, FIG. 8B, FIG. 11B, FIG. 14B, and FIG. 19). Here, as the etching conditions, the conditions by which films other than the impurity semiconductor film 108 and the semiconductor film 106 are not unintentionally etched or eroded or are not easily unintentionally etched or eroded are selected. In particular, it is important that etching is performed under the conditions by which the gate electrode layer 116 is not unintentionally etched or eroded or is not easily unintentionally etched or eroded.

Note that dry etching or wet etching can be performed for etching the impurity semiconductor film 108 and the upper portion of the semiconductor film 106 (back channel portion) in the thin film stack 114.

Figure 2A:
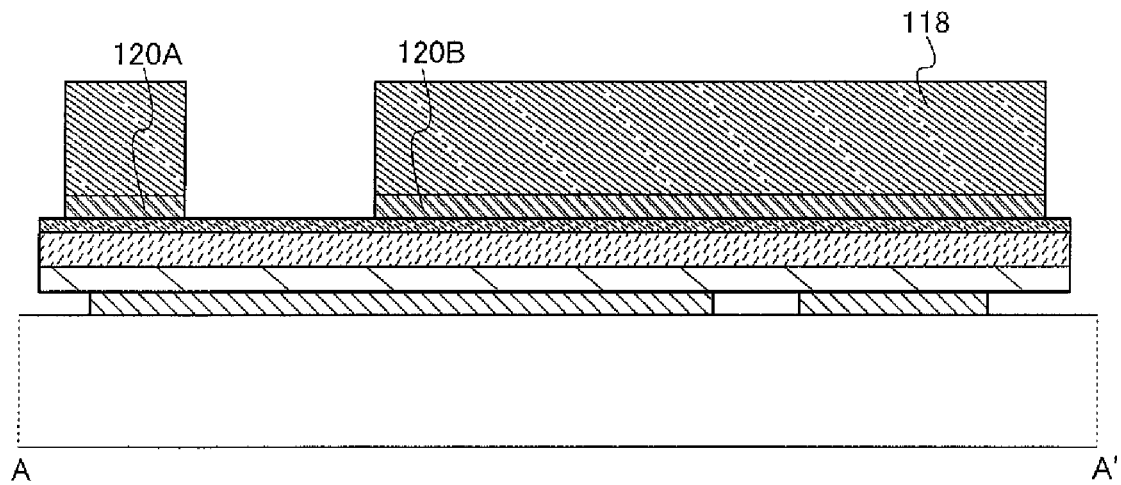
FIGS. 2A to 2C illustrate an example of a method for manufacturing a thin film transistor and a display device.
Figure 2B:
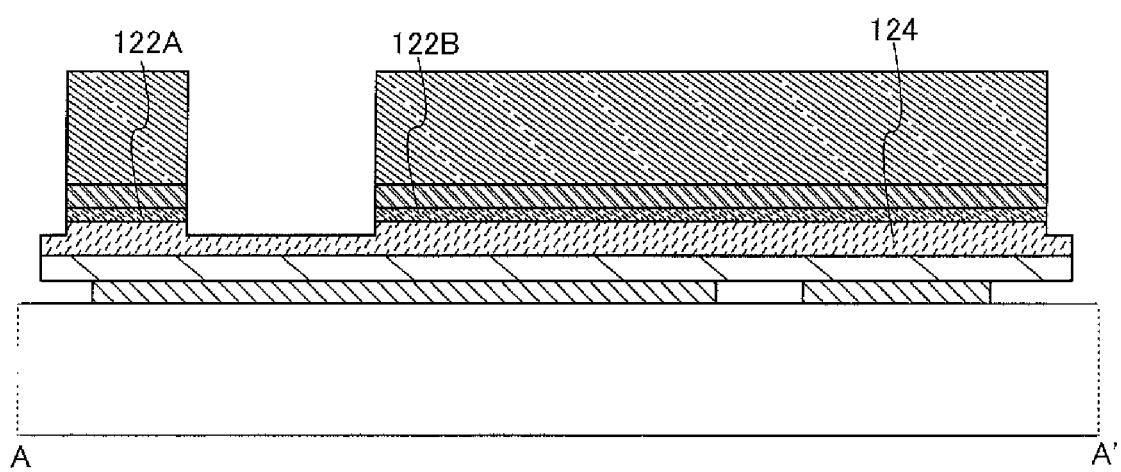
Figure 2C:
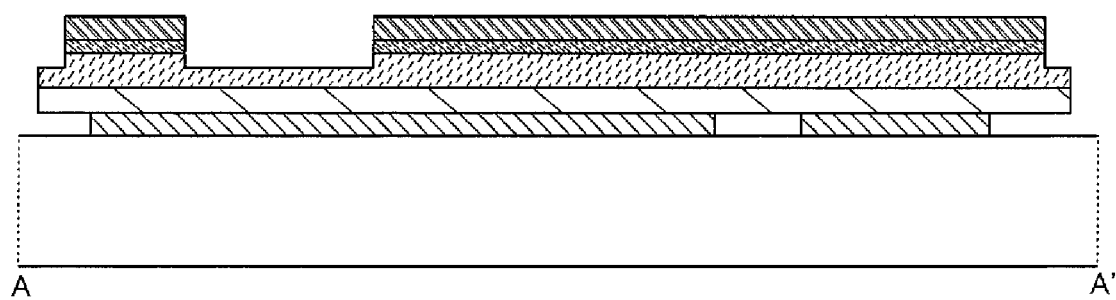

Then, the second resist mask 118 is removed (see FIG. 2C, FIG. 5C, FIG. 8C, FIG. 11C, and FIG. 14C); accordingly, a thin film transistor is completed (see FIG. 2C). As described above, the thin film transistor can be manufactured using one photomask (multi-tone mask).

Note that in this specification, the steps described with reference to FIG. 2A and FIG. 2B are collectively referred to as third etching. The third etching may be performed in separate steps as described above or may be performed in a single step.

A second insulating film is formed to cover the thin film transistor which is formed as described above. The second insulating film may be formed using only the first protective film 126 and here, the second insulating film is formed using the first protective film 126 and a second protective film 128 (see FIG. 3A, FIG. 6A, FIG. 9A, FIG. 12A, and FIG. 15A). The first protective film 126 may be formed similarly to the first insulating film 104.

The second protective film 128 is formed by a method by which the surface thereof is mostly planarized. This is because by mostly planarizing the surface of the second protective film 128, disconnection or the like of a pixel electrode layer 132 formed over the second protective film 128 can be prevented. Accordingly, the phrase "mostly planarizing" means planarizing in such an extent that the aforementioned aim can be achieved, and does not mean that a high level of planarity is required.

Note that the second protective film 128 can be formed by, for example, a spin coating method or the like using photosensitive polyimide, acrylic, an epoxy resin, or the like. Note that the invention to be disclosed is not limited to these materials and the formation method.

Next, a first opening portion 130 and a second opening portion 131 are formed in the second insulating film (see FIG. 3B, FIG. 6B, FIG. 9B, FIG. 12B, and FIG. 15B). The first opening portion 130 and the second opening portion 131 are formed so as to reach at least the surface of the source or drain electrode layer. The method for forming the first opening portion 130 and the second opening portion 131 is not limited to a particular method and may be determined as appropriate by a practitioner in accordance with the diameter of the first opening portion 130 or the like. For example, the first opening portion 130 and the second opening portion 131 can be formed by dry etching using a photolithography method.

The gate electrode layer 116E is provided below the first opening portion 130. By providing the gate electrode layer 116E, the source or drain electrode layer 120B, a semiconductor layer 124 overlapping with the source or drain electrode layer 120B, and the like can be prevented from being bent and thus damaged or broken in a formation process or in use. Therefore, the process for forming a display device can be simplified without reducing yield and reliability.

Note that in the case of forming the opening portions by a photolithography method, one photomask is used.

Next, the pixel electrode layer 132 is formed over the second insulating film (see FIG. 3C, FIG. 6C, FIG. 9C, FIG. 12C, FIG. 15C, and FIG. 20). The pixel electrode layer 132 is formed so as to be connected to the source or drain electrode layer 120 through the opening portions. Specifically, the pixel electrode layer 132 is formed so as to be connected to the source or drain electrode layer 120B through the first opening portion 130 and connected to the source or drain electrode layer 120D through the second opening portion 131. The pixel electrode layer 132 is preferably formed using a conductive material having a light-transmitting property. Here, as the conductive material having a light-transmitting property, indium tin oxide (hereinafter referred to as ITO), indium oxide containing tungsten oxide, indium zinc oxide containing tungsten oxide, indium oxide containing titanium oxide, indium tin oxide containing titanium oxide, indium zinc oxide, indium tin oxide to which silicon oxide is added, and the like are given. The film of the conductive material having a light-transmitting property may be formed by a sputtering method, a CVD method, or the like; however, the method for forming the film of the conductive material having a light-transmitting property is not limited to a particular method. In addition, the pixel electrode layer 132 may have a single-layer structure or a layered structure in which a plurality of films are stacked.

Note that in this embodiment mode, the conductive material having a light-transmitting property is used for only the pixel electrode layer 132; however, the invention to be disclosed is not limited to this. As materials of the first conductive film 102 and the second conductive film 110, conductive materials having a light-transmitting property may be used.

Note that in the case of forming the pixel electrode layer 132 by a photolithography method, one photomask is used.

As described above, formation of an active matrix substrate according to this embodiment mode (so-called array process) is completed. As described in this embodiment mode, the thin film transistor can be manufactured using one photomask in such a manner that the gate electrode layer is formed utilizing side etching and further, the source or drain electrode layer is formed using a multi-tone mask.

Figure 3A:
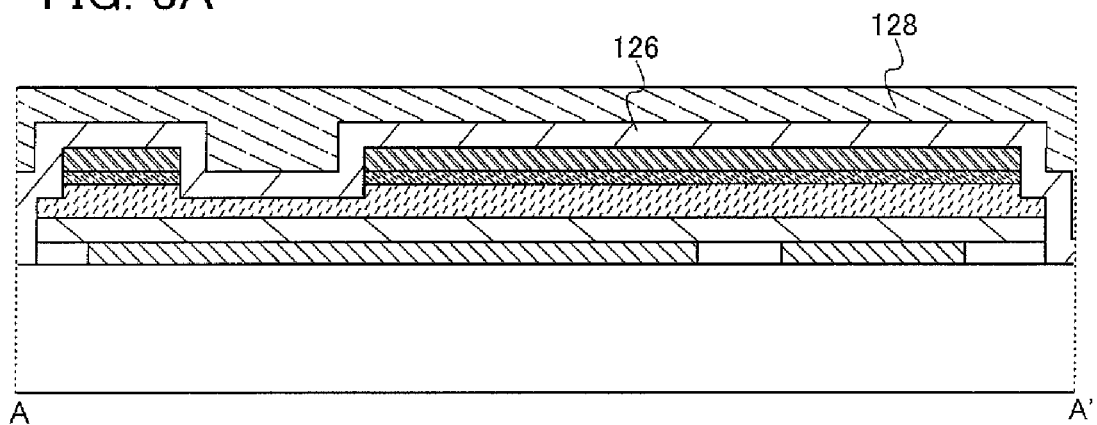
FIGS. 3A to 3C illustrate an example of a method for manufacturing a thin film transistor and a display device.
Figure 3B:
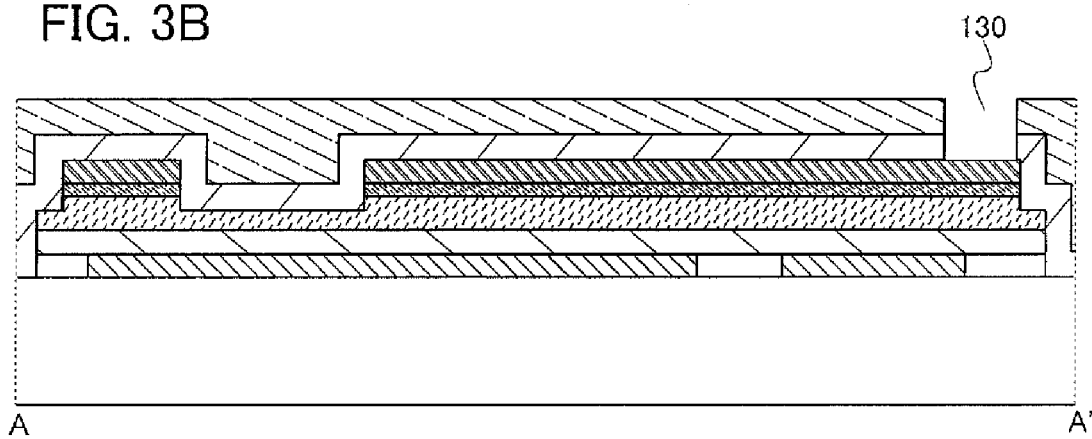
Figure 3C:
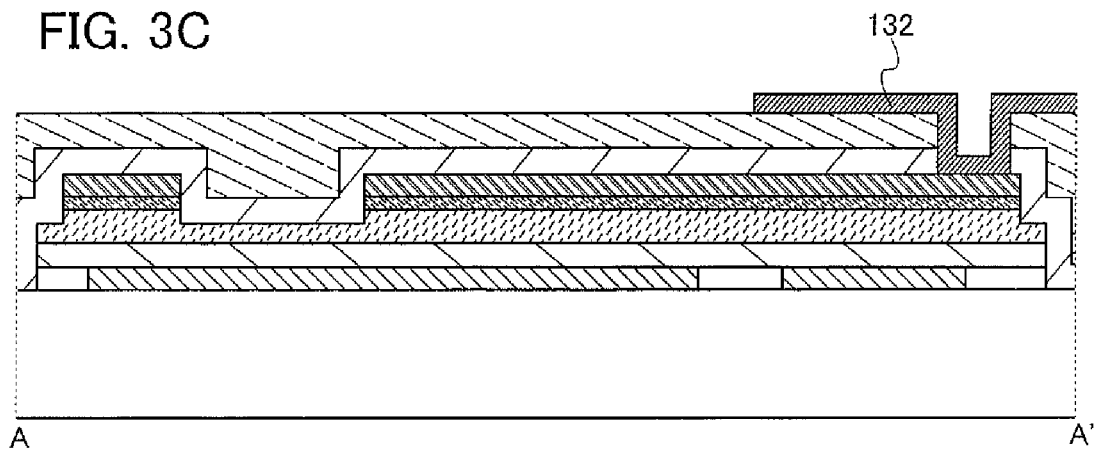
Figure 4A:
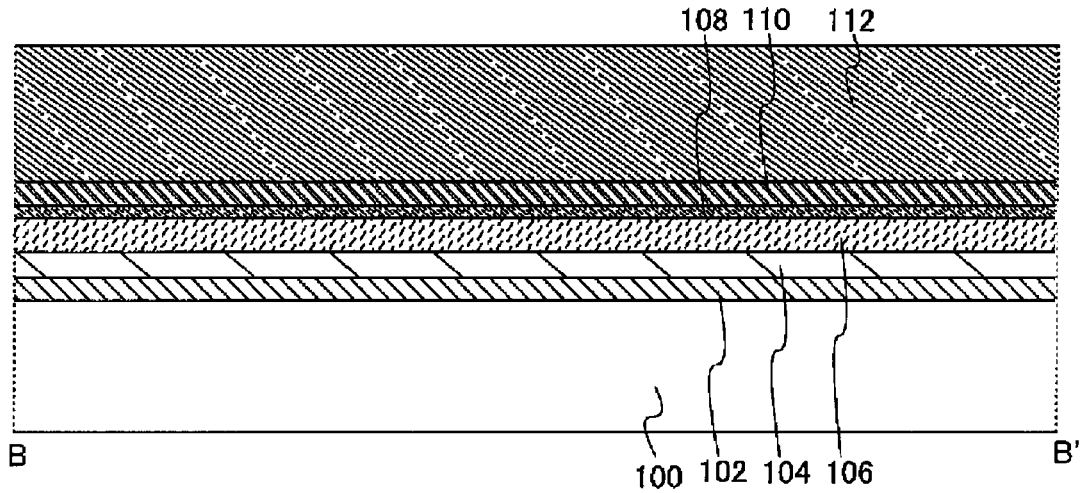
FIGS. 4A to 4C illustrate an example of a method for manufacturing a thin film transistor and a display device.
Figure 4B:
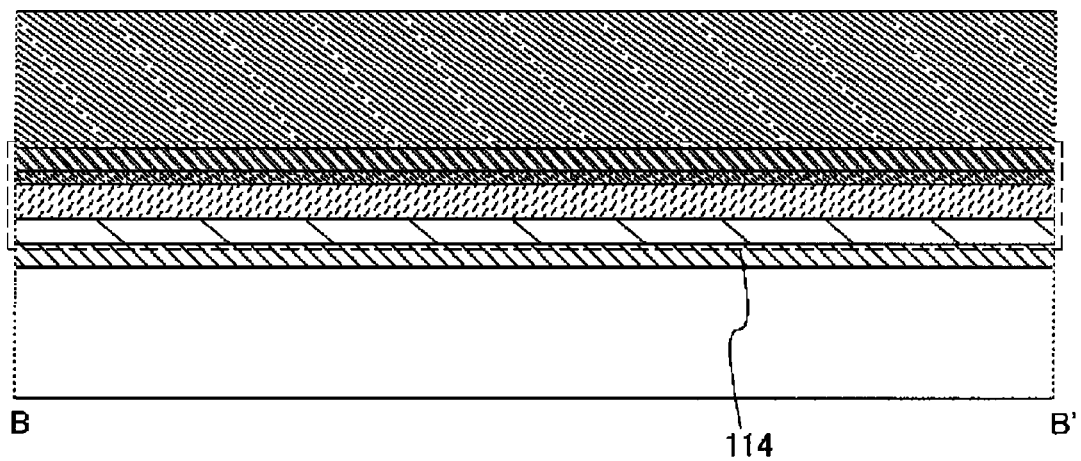
Figure 4C:
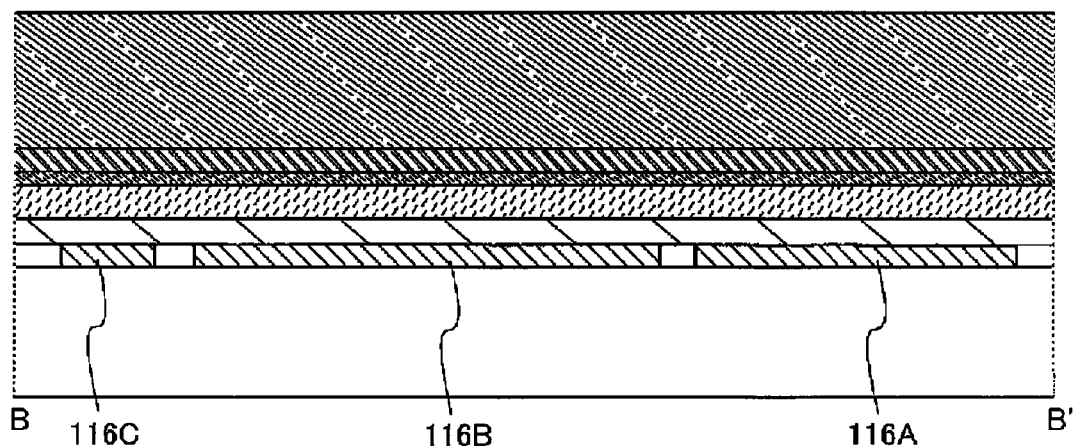
Figure 5A:
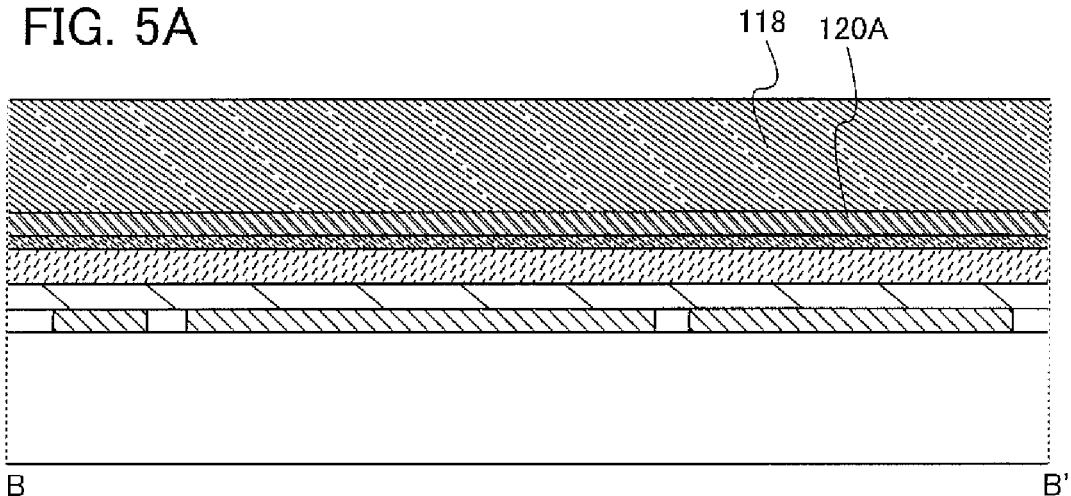
FIG. 5A to 5C illustrate an example of a method for manufacturing a thin film transistor and a display device.
Figure 5B:
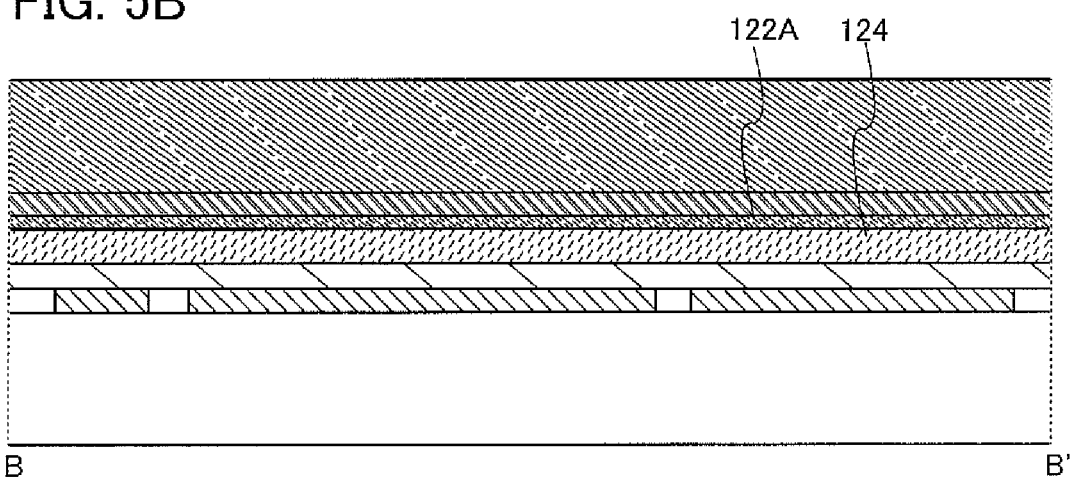
Figure 5C:
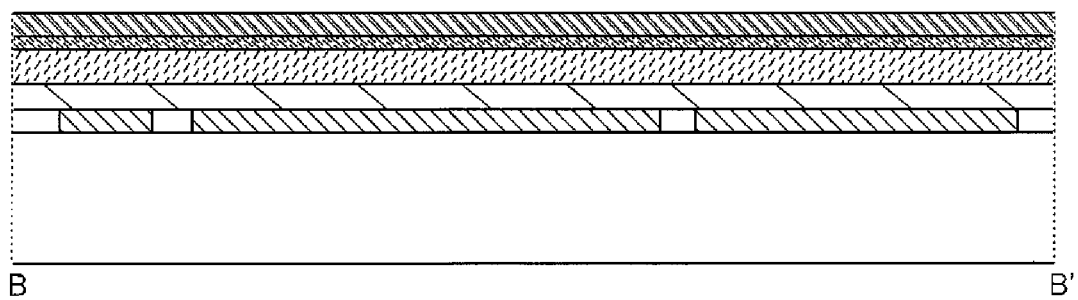
Figure 6A:
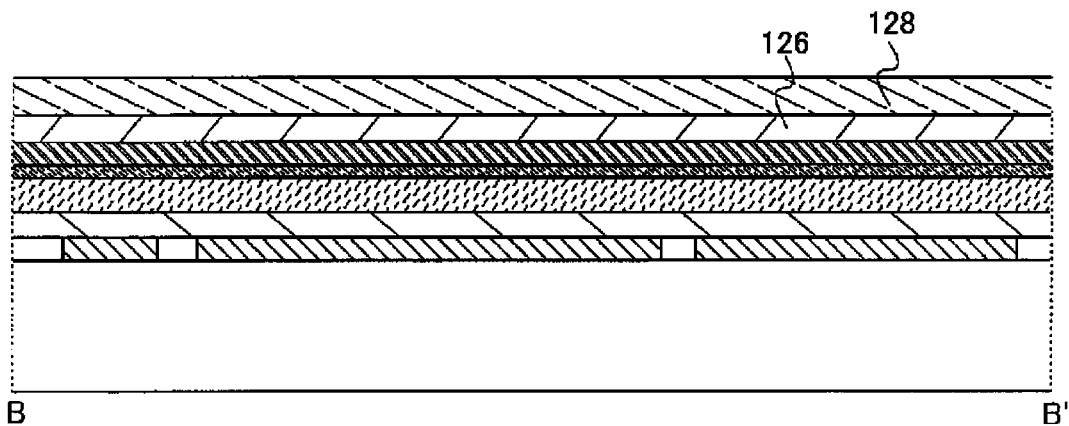
FIGS. 6A to 6C illustrate an example of a method for manufacturing a thin film transistor and a display device.
Figure 6B:
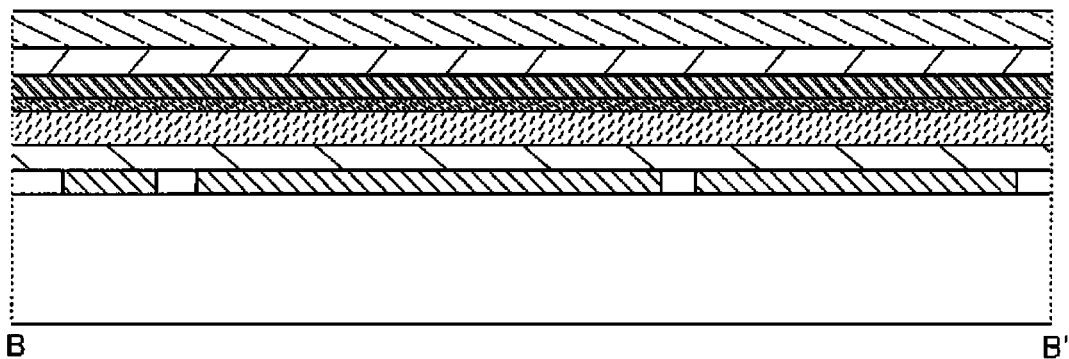
Figure 6C:
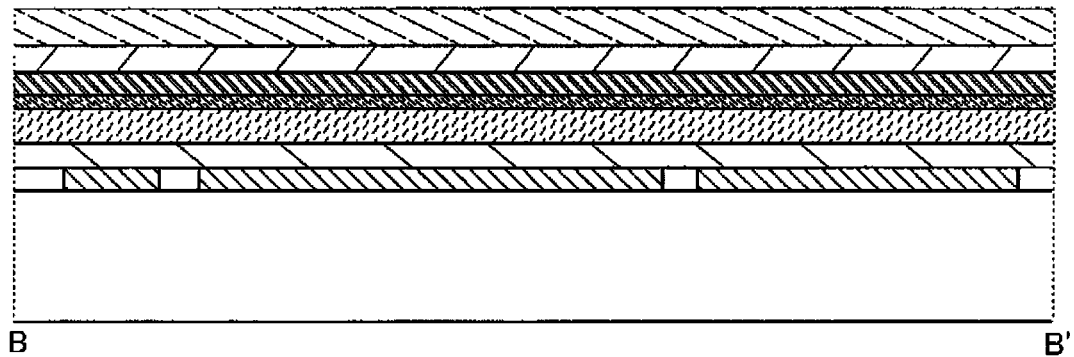
Figure 7A:
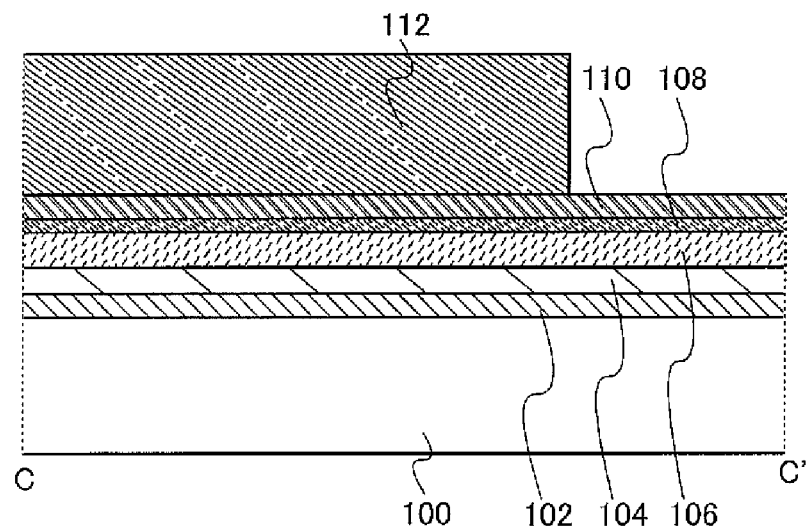
FIGS. 7A to 7C illustrate an example of a method for manufacturing a thin film transistor and a display device.
Figure 7B:
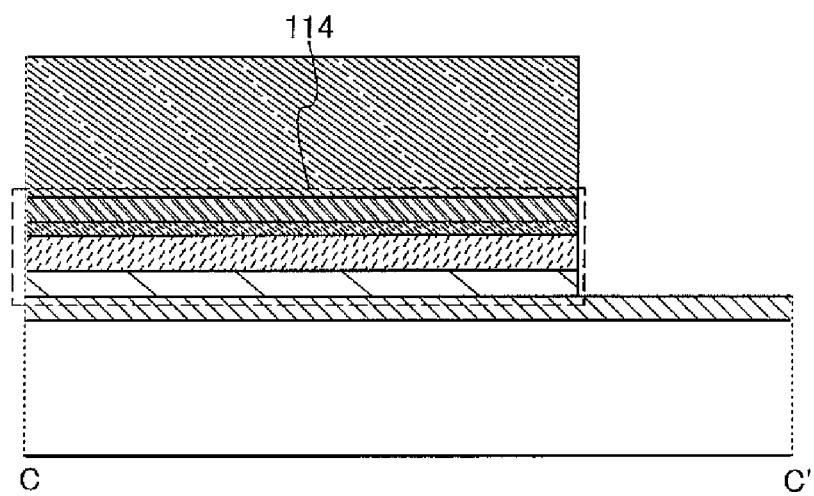
Figure 7C:
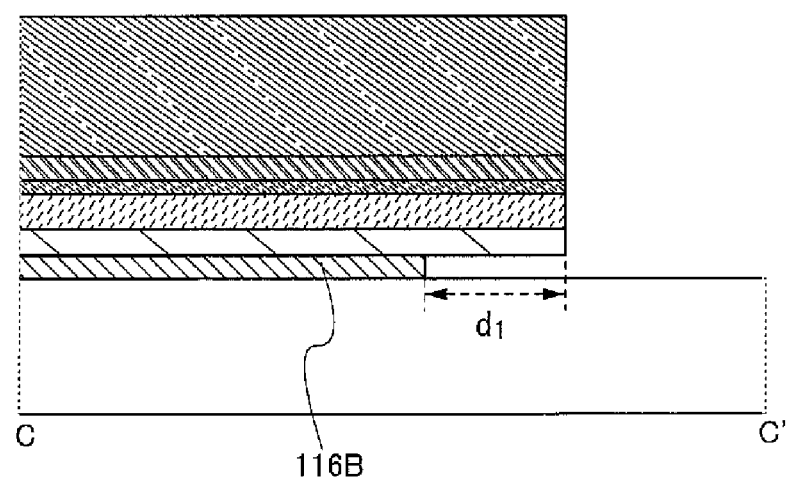
Figure 8A:
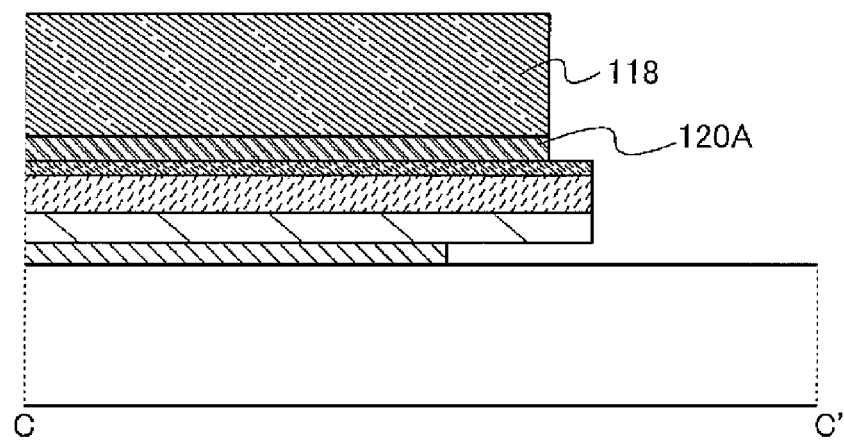
FIG. 8A to 8C illustrate an example of a method for manufacturing a thin film transistor and a display device.
Figure 8B:
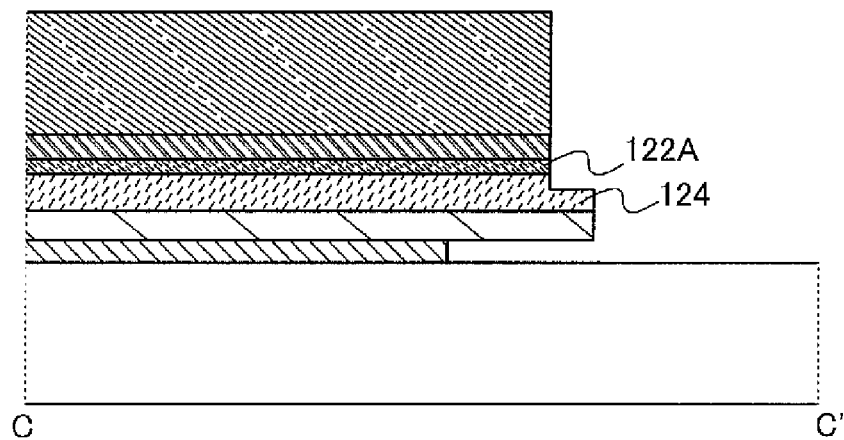
Figure 8C:
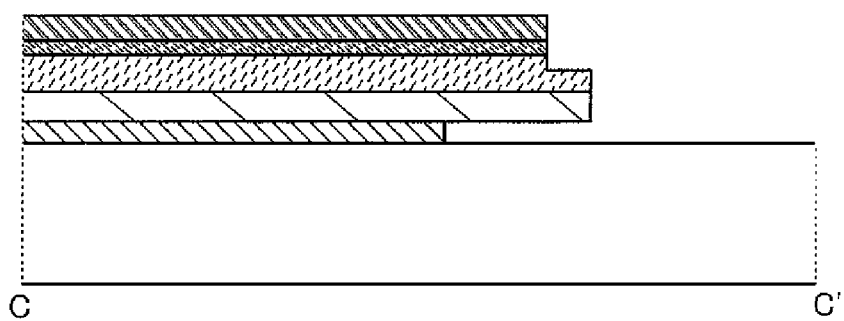
Figure 9A:
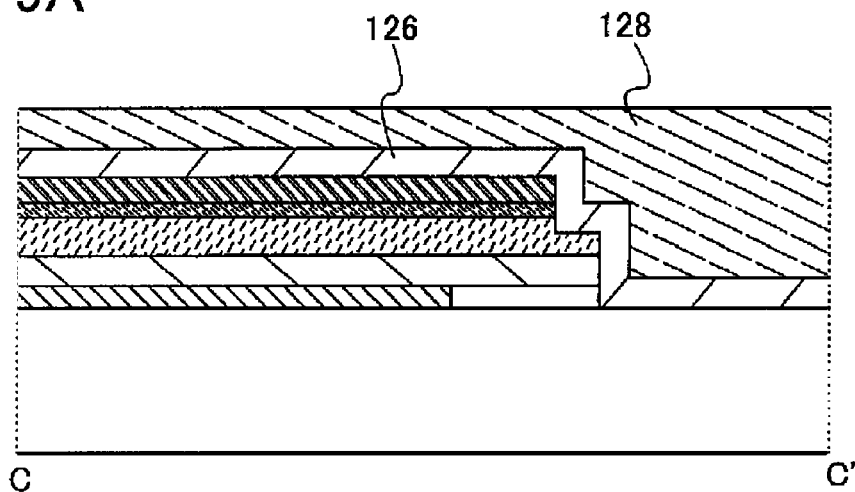
FIG. 9A to 9C illustrate an example of a method for manufacturing a thin film transistor and a display device.
Figure 9B:
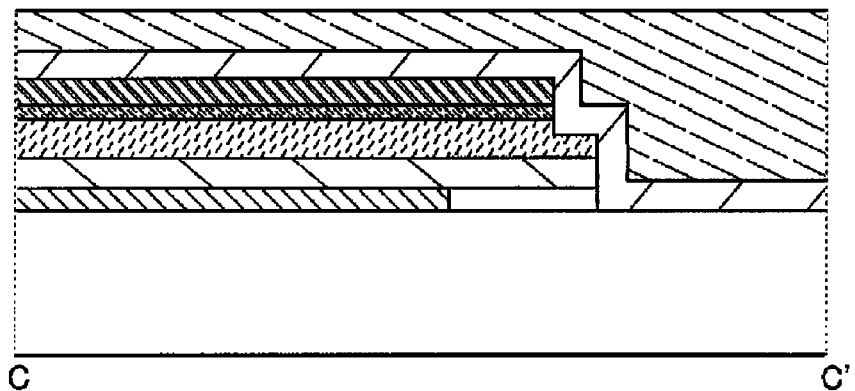
Figure 9C:
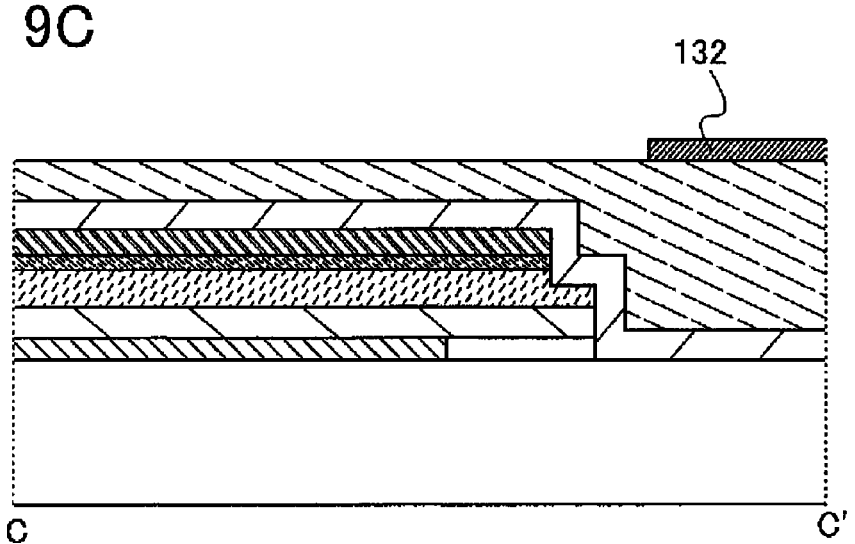
Figure 10A:
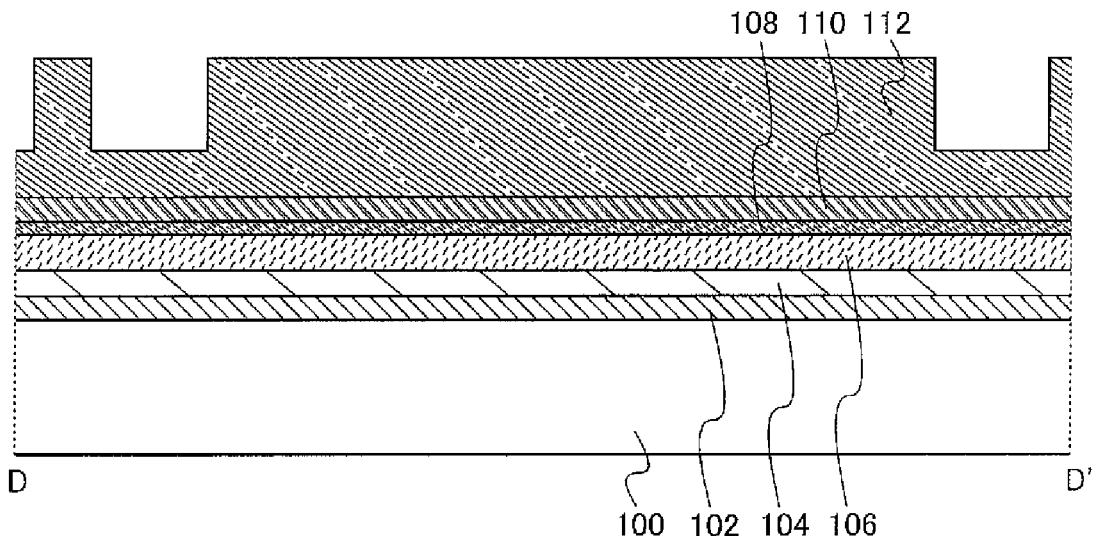
FIGS. 10A to 10C illustrate an example of a method for manufacturing a thin film transistor and a display device.
Figure 10B:
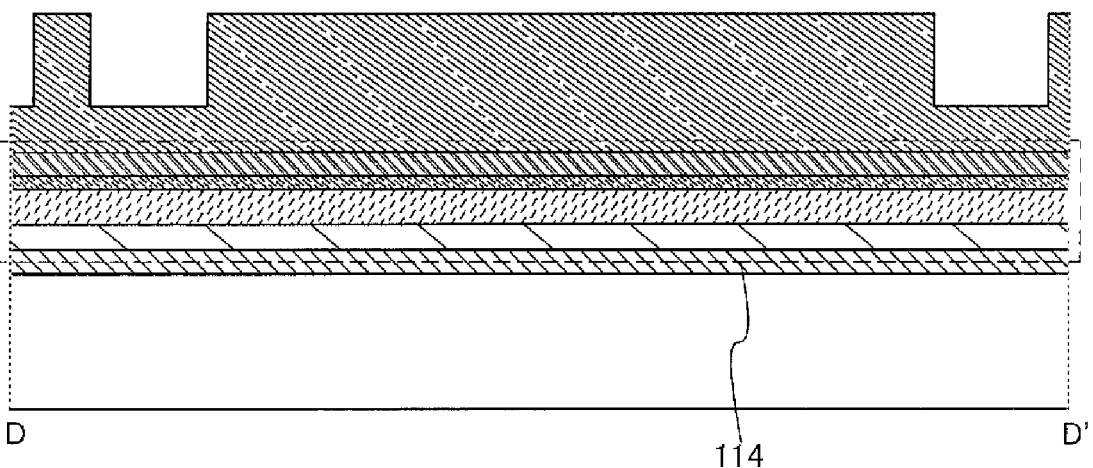
Figure 10C:
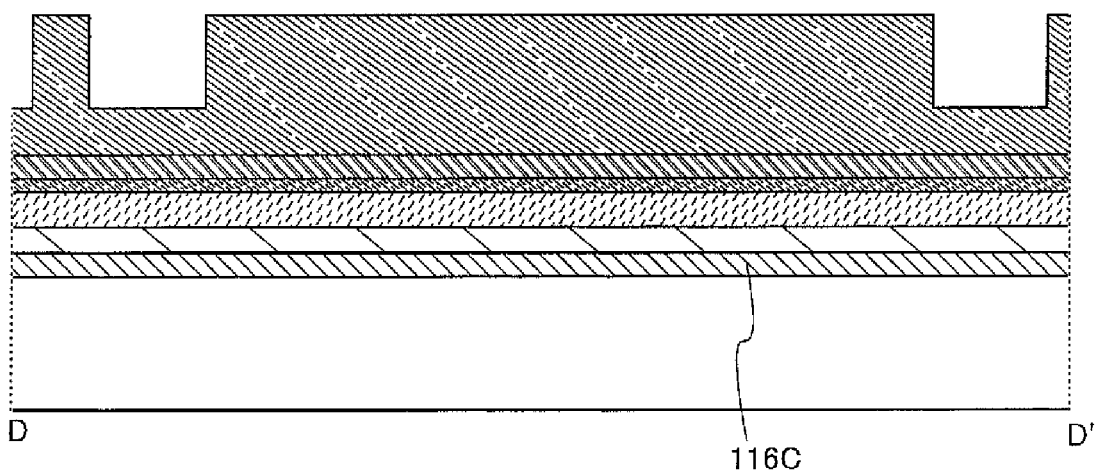
Figure 11A:
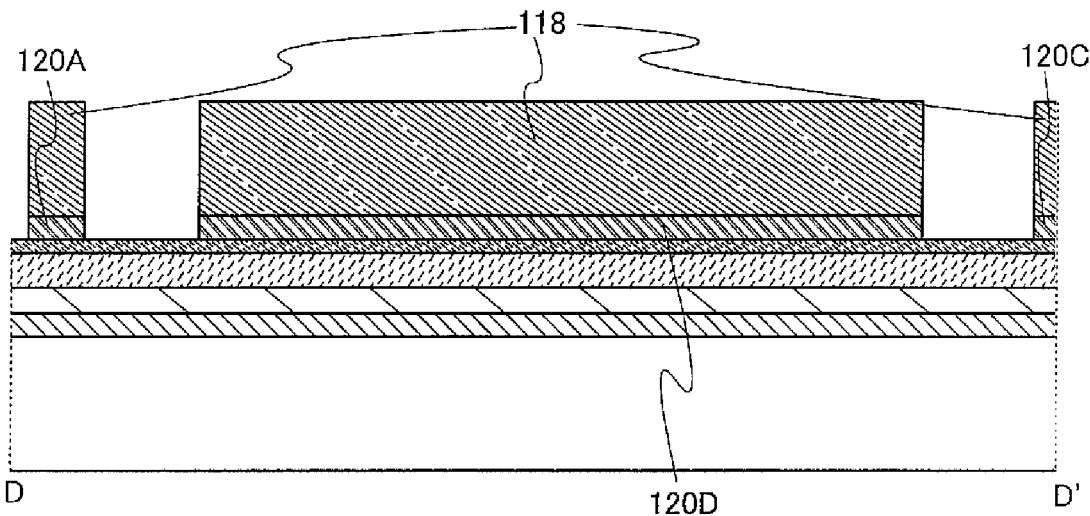
FIGS. 11A to 11C illustrate an example of a method for manufacturing a thin film transistor and a display device.
Figure 11B:
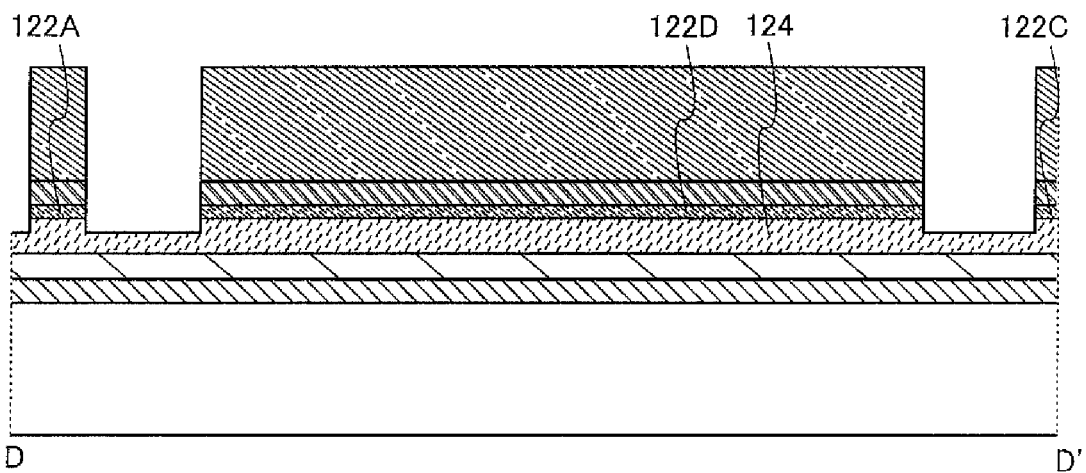
Figure 11C:
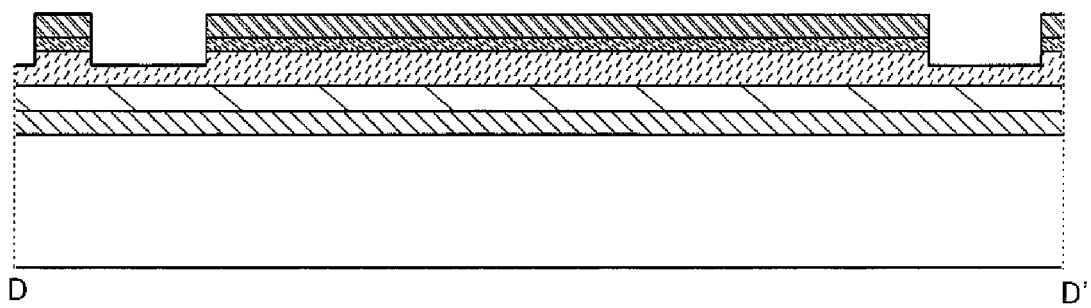
Figure 12A:
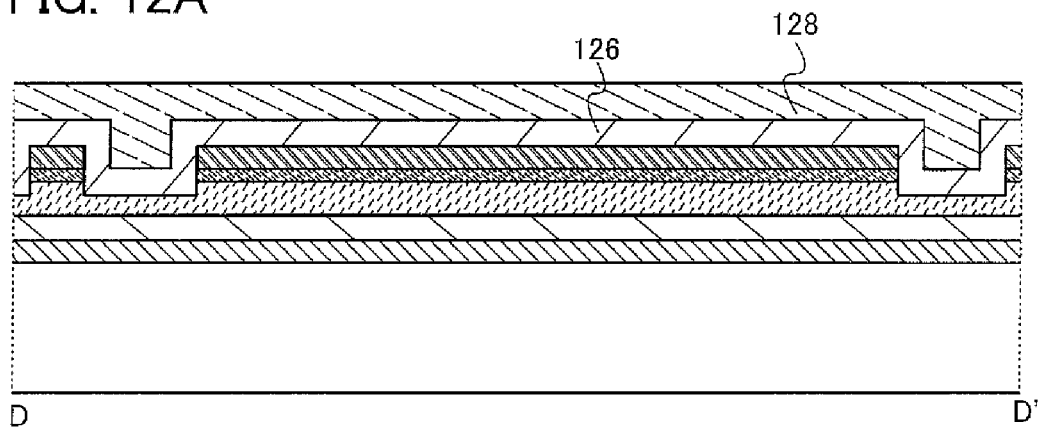
FIGS. 12A to 12C illustrate an example of a method for manufacturing a thin film transistor and a display device.
Figure 12B:
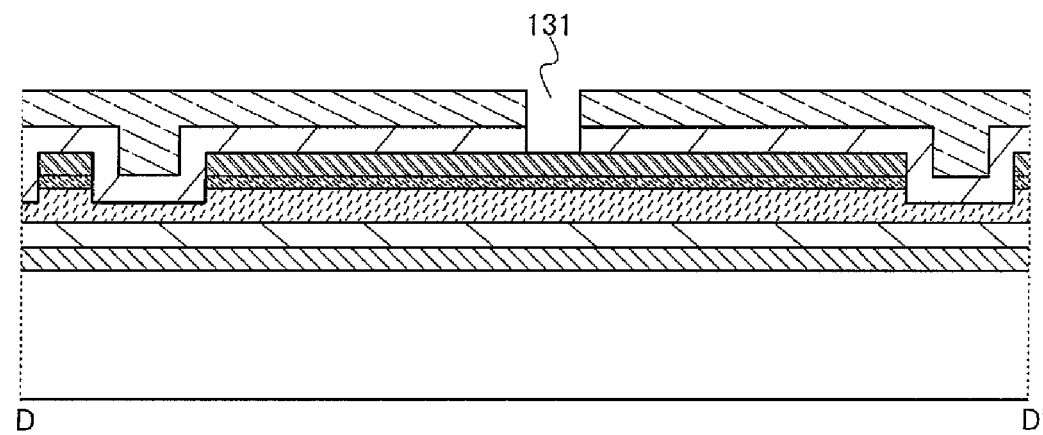
Figure 12C:
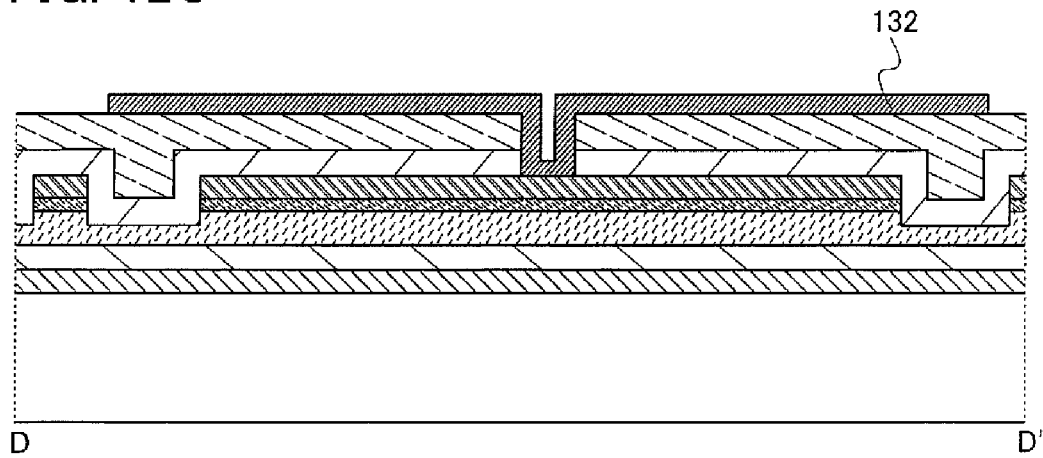
Figure 13A:
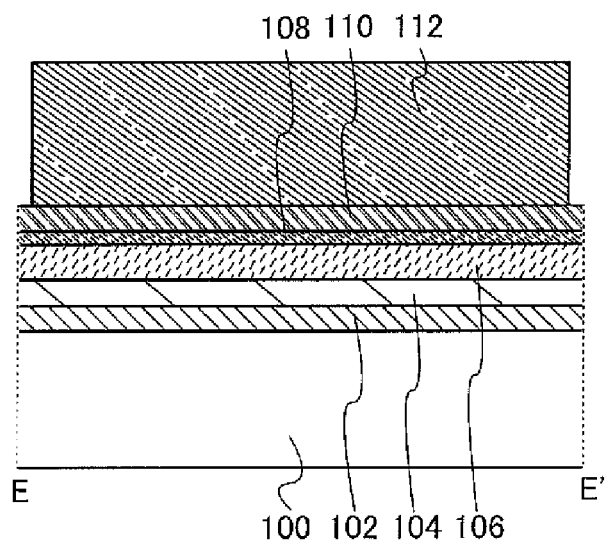
FIGS. 13A to 13C illustrate an example of a method for manufacturing a thin film transistor and a display device.
Figure 13B:
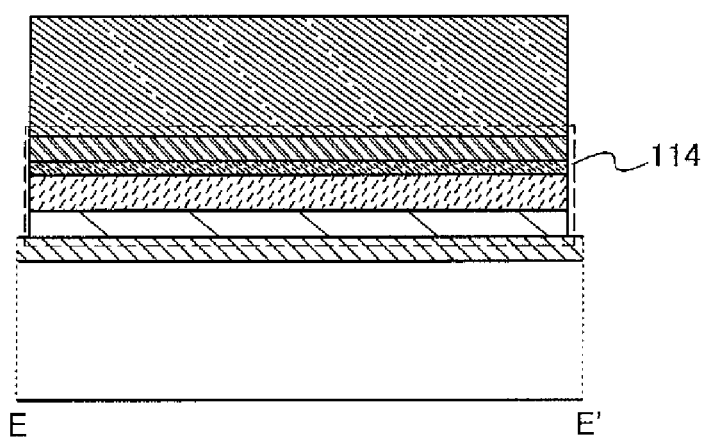
Figure 13C:
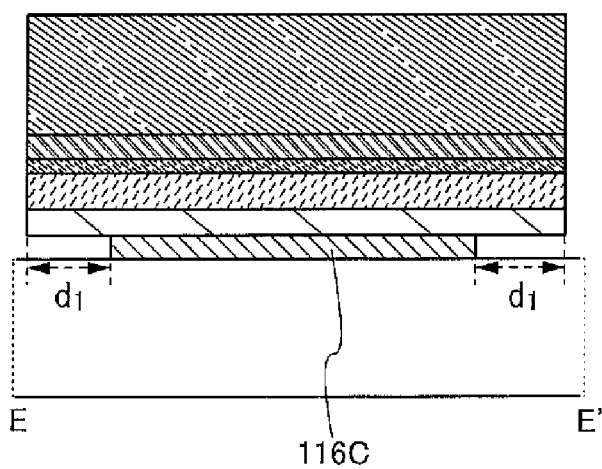
Figure 14A:
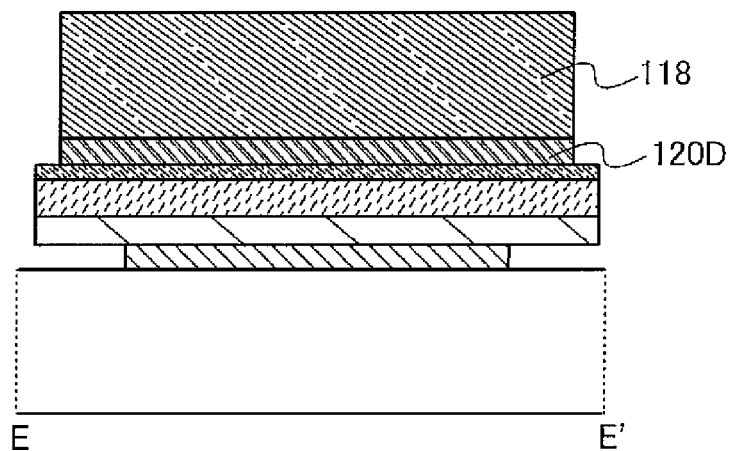
FIGS. 14A to 14C illustrate an example of a method for manufacturing a thin film transistor and a display device.
Figure 14B:
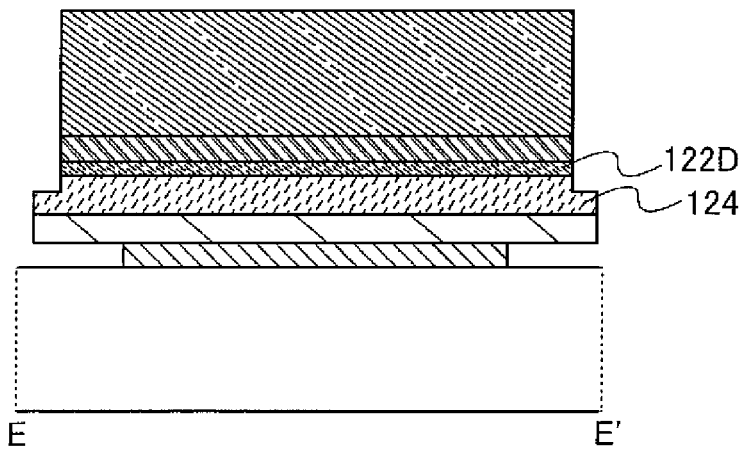
Figure 14C:
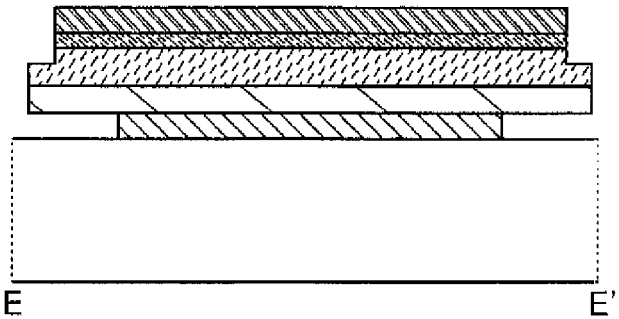
Figure 15A:
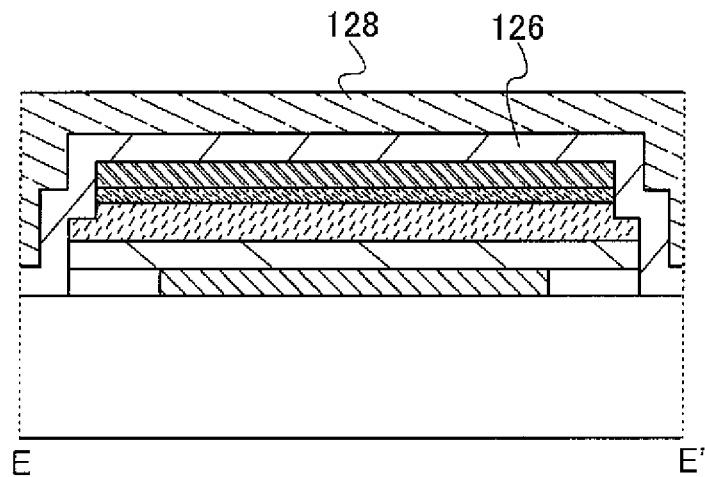
FIGS. 15A to 15C illustrate an example of a method for manufacturing a thin film transistor and a display device.
Figure 15B:
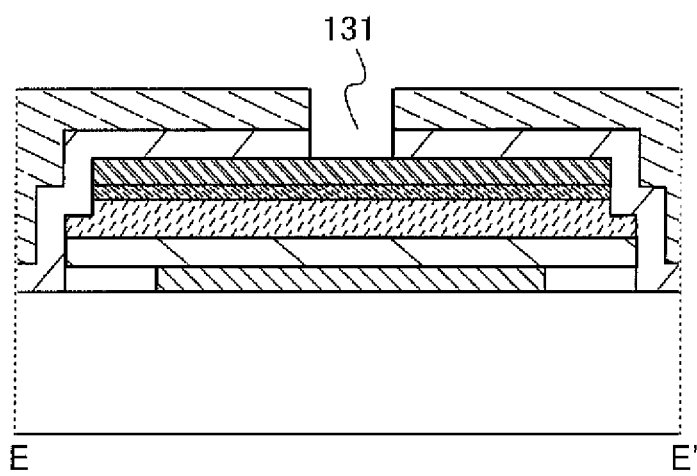
Figure 15C:
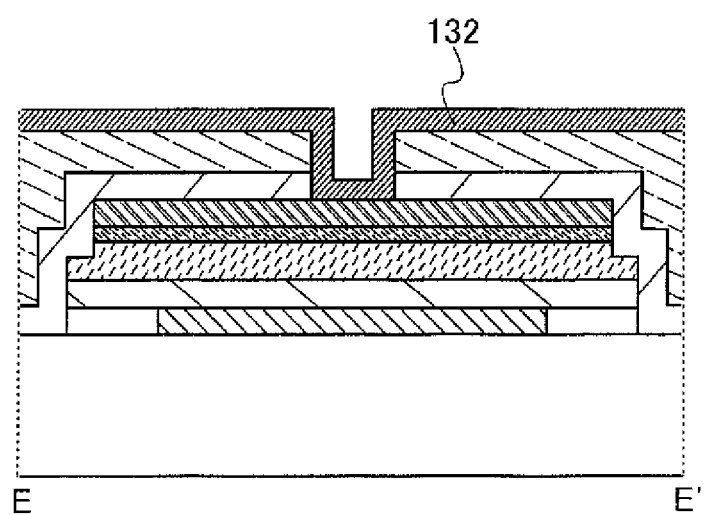

The thin film transistor manufactured using the manufacturing method described above has a structure including a gate insulating film over a gate electrode layer, a semiconductor layer over the gate insulating film, a source region and a drain region over the semiconductor layer, a source electrode and a drain electrode over the source region and the drain region, and a cavity adjacent to a side surface of the gate electrode layer (see FIG. 3C). By the cavity formed adjacent to the side surface of the gate electrode layer, a thin film transistor with a small leakage current at an end portion of the gate electrode layer can be manufactured.

Note that although a resist mask having a depressed portion is formed as the first resist mask in the above description, the invention to be disclosed is not limited to this. The first resist mask may be a normal photomask. The case where a multi-tone mask is not used for forming the first resist mask is briefly described with reference to FIG. 25, FIG. 26, and FIG. 27.

Figure 16:
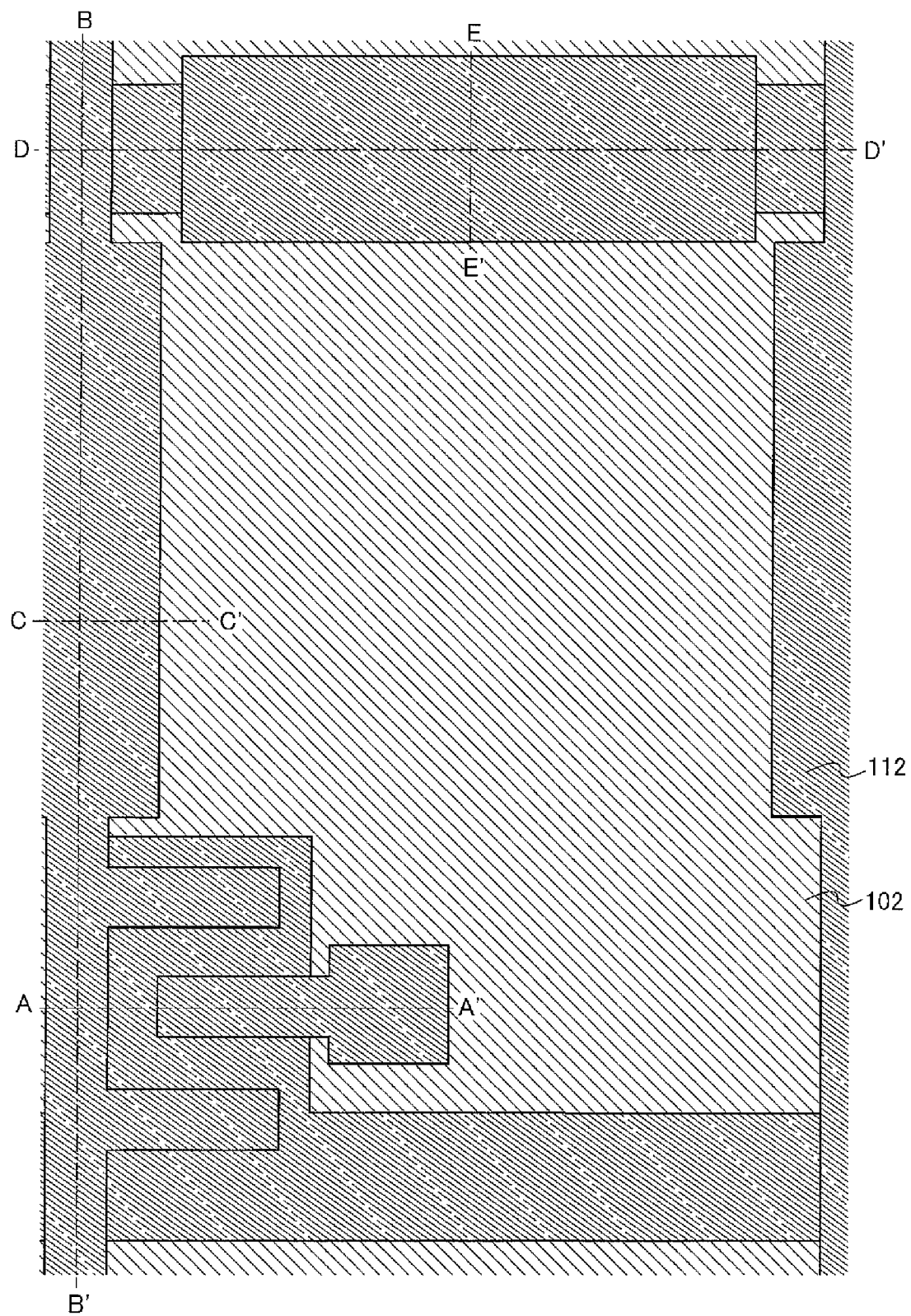
FIG. 16 illustrates an example of a method for manufacturing a thin film transistor and a display device.
Figure 18:
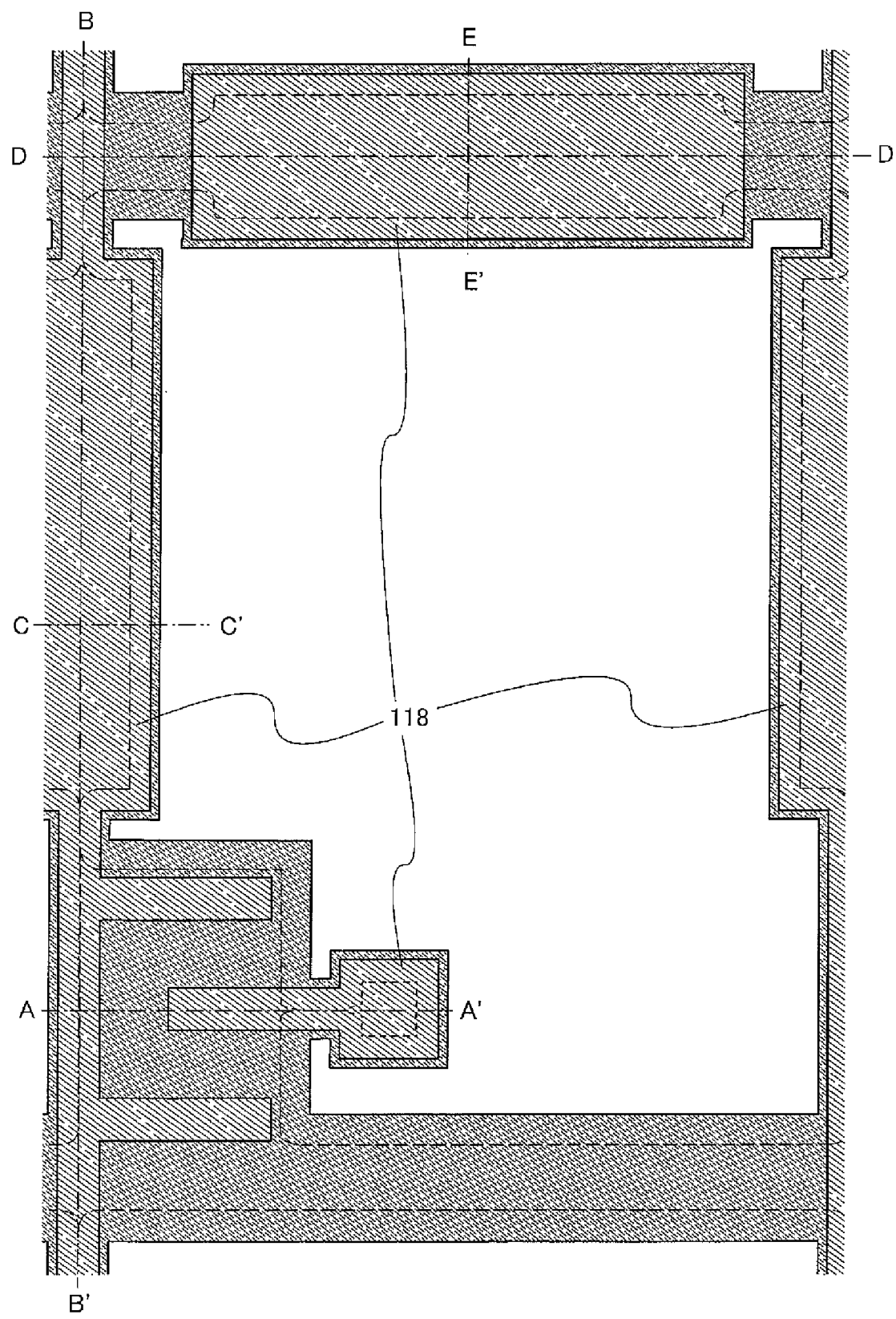
FIG. 18 illustrates an example of a method for manufacturing a thin film transistor and a display device.
Figure 19:
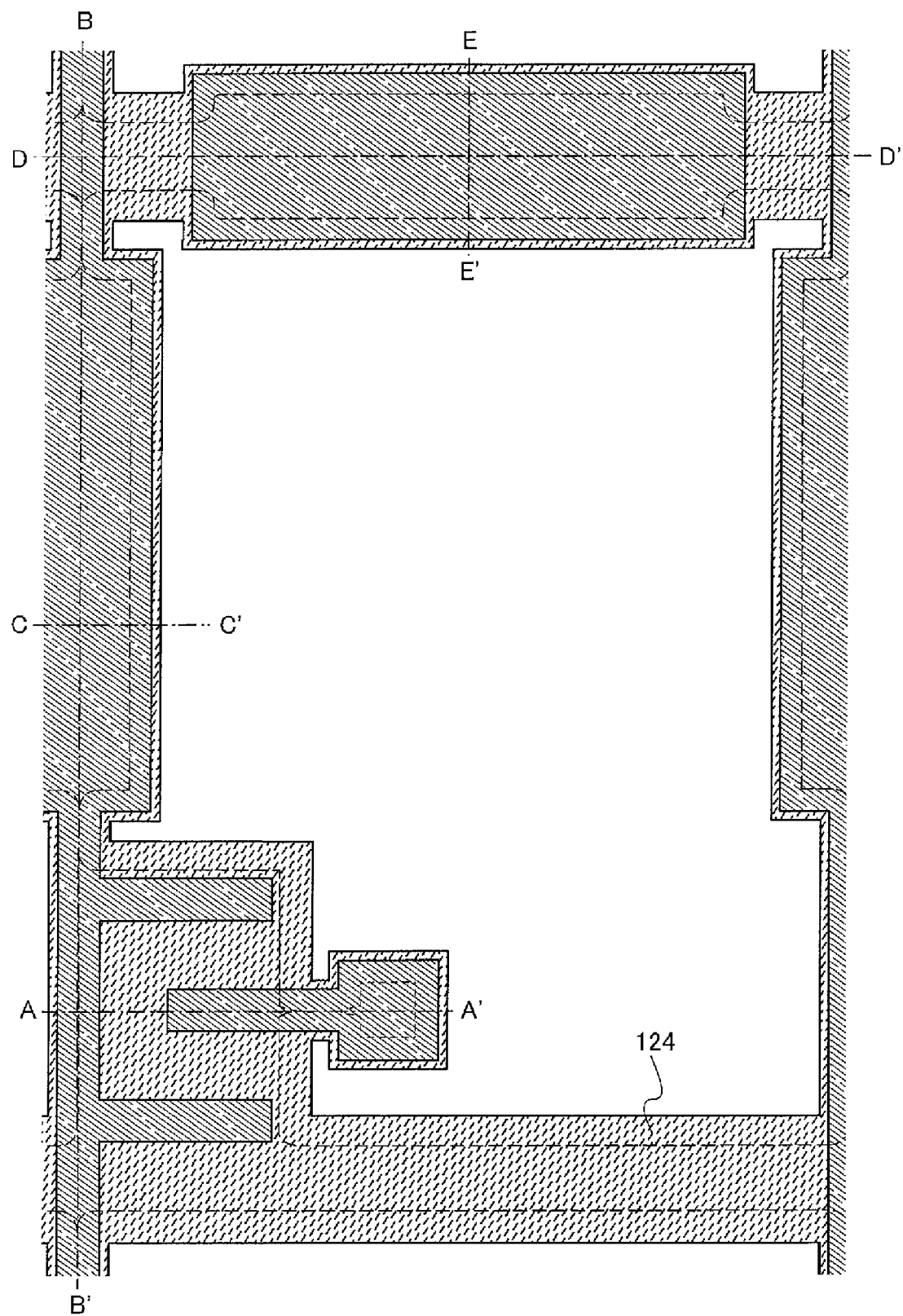
FIG. 19 illustrates an example of a method for manufacturing a thin film transistor and a display device.
Figure 25:
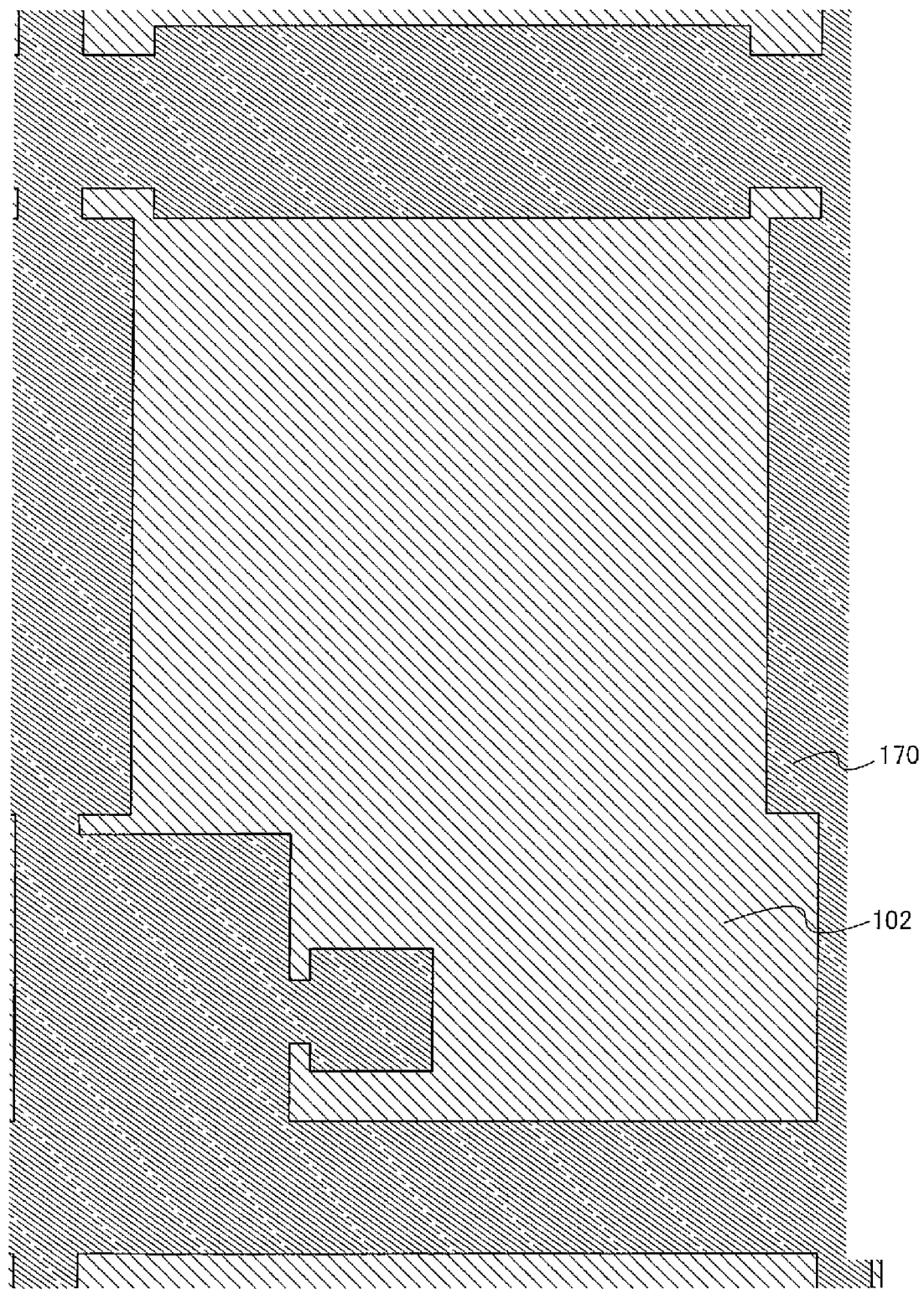
FIG. 25 illustrates an example of a method for manufacturing a thin film transistor and a display device.
Figure 26:
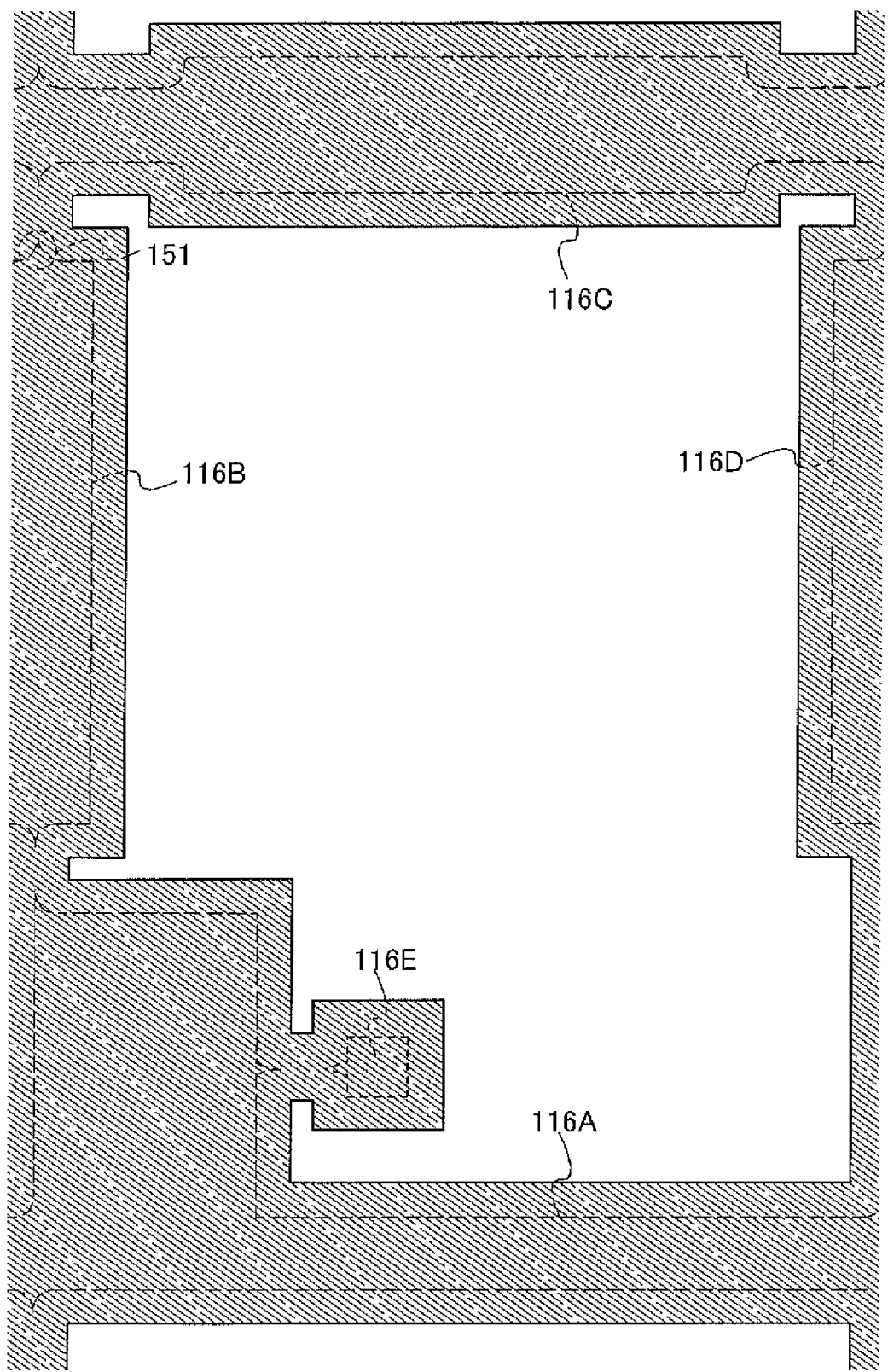
FIG. 26 illustrates an example of a method for manufacturing a thin film transistor and a display device.
Figure 27:
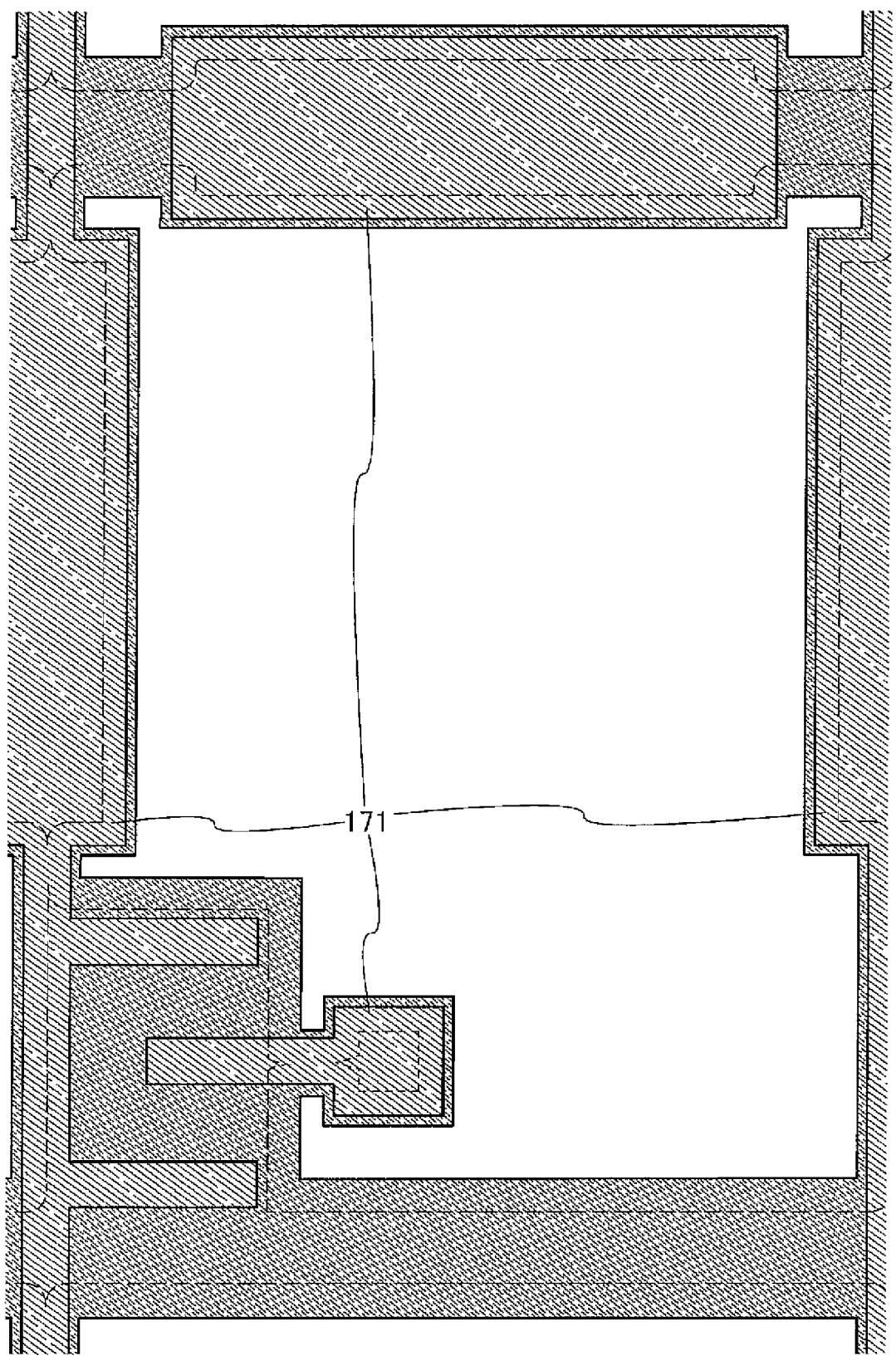
FIG. 27 illustrates an example of a method for manufacturing a thin film transistor and a display device.

Note that FIG. 25, FIG. 26, and FIG. 27 correspond to FIG. 16, FIG. 17, and FIG. 18, respectively.

First, the first conductive film 102, the first insulating film 104, the semiconductor film 106, the impurity semiconductor film 108, and the second conductive film 110 are formed over the substrate 100, and a first resist mask 170 is formed over the second conductive film 110. The first resist mask 170 is different from the first resist mask 112, does not have a depressed portion, and is formed so that an entire surface thereof has approximately the same thickness. That is, the first resist mask 170 can be a normal photomask instead of a multi-tone mask.

Then, first etching is performed using the first resist mask 170. That is, the first insulating film 104, the semiconductor film 106, the impurity semiconductor film 108, and the second conductive film 110 are etched to expose at least a surface of the first conductive film 102, so that the thin film stack 114 is formed over the first conductive film 102 (see FIG. 25).

Then, second etching is performed to form the gate electrode layer 116 (see FIG. 26). After that, the first resist mask 170 is removed by stripping or the like.

Next, a second resist mask 171 is formed over the thin film stack 114, and the source or drain electrode layer 120 is formed using the second resist mask 171 (see FIG. 27). The rest of the process is the same as that in the case where a multi-tone mask is used.

As described above, a thin film transistor can be manufactured without using a multi-tone mask. Note that one more mask is required as compared to the case where a multi-tone mask is used. That is, a thin film transistor can be manufactured using two photomasks. In this case, an active matrix substrate having a pixel transistor can be manufactured using four photomasks. Therefore, the number of photomasks to be used is reduced and thus, the number of steps for forming a thin film transistor and a display device can be significantly reduced. Further, manufacturing with high yield and cost reduction can also be achieved. Further, by providing a supporting portion formed using the gate electrode layer 116E, the thin film transistor can keep a mechanical balance and thus, the process for forming the thin film transistor can be simplified without reducing yield and reliability.

Here, a terminal connection portion of the active matrix substrate manufactured through the above steps will be described with reference to FIG. 21, FIG. 22, and FIGS. 23A to 23C.

FIG. 21, FIG. 22, and FIGS. 23A to 23C are a top view and cross-sectional views of a terminal connection portion on the gate wiring side and a terminal connection portion on the source wiring side of the active matrix substrate manufactured through the above steps.

Figure 21:
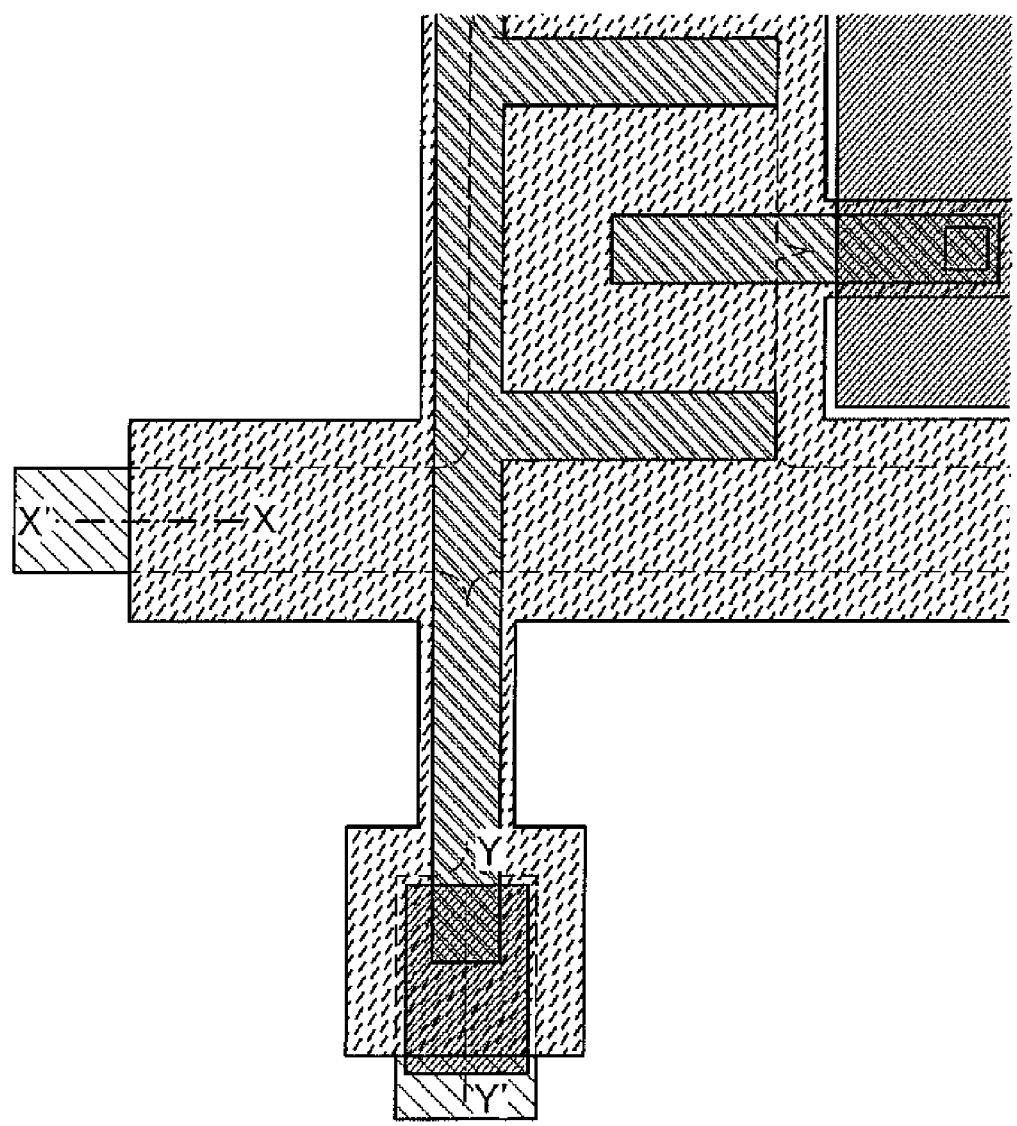
FIG. 21 illustrates a connecting portion of an active matrix substrate.

FIG. 21 is a top view of the gate wiring and the source wiring which are extended from the pixel portion, in the terminal connection portion on the gate wiring side and the terminal connection portion on the source wiring side.

Figure 22:
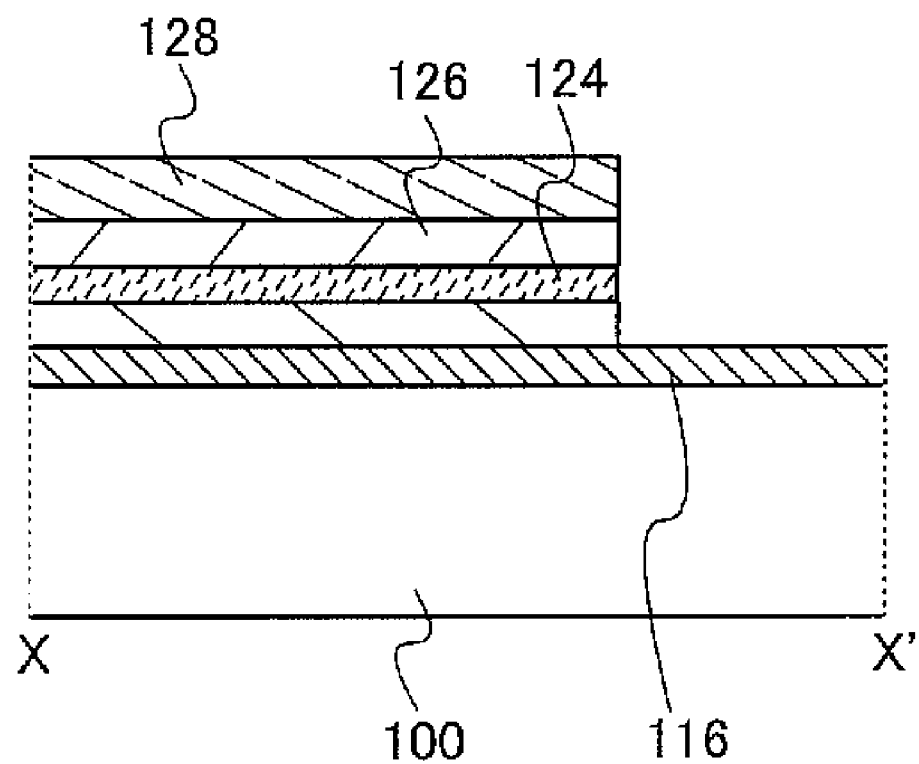
FIG. 22 illustrates a connecting portion of an active matrix substrate.

FIG. 22 is a cross-sectional view along X-X' in FIG. 21. That is, FIG. 22 is a cross-sectional view of the terminal connection portion on the gate wiring side. In FIG. 22, only the gate electrode layer 116 is exposed. A terminal portion is connected to the region in which the gate electrode layer 116 is exposed.

Figure 23A:
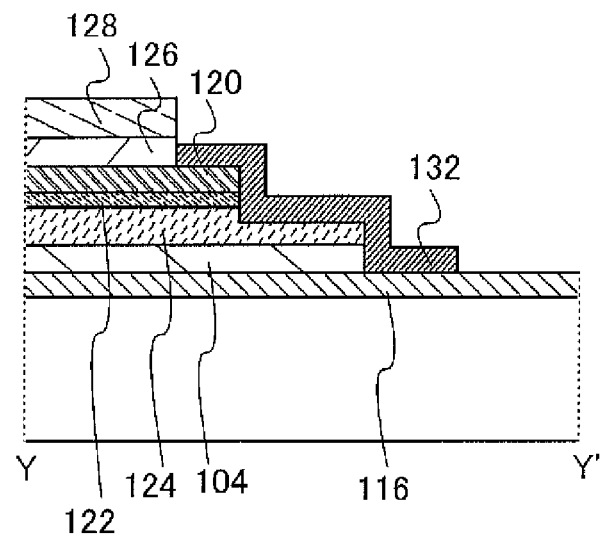
FIGS. 23A to 23C each illustrate a connecting portion of an active matrix substrate.
Figure 23B:
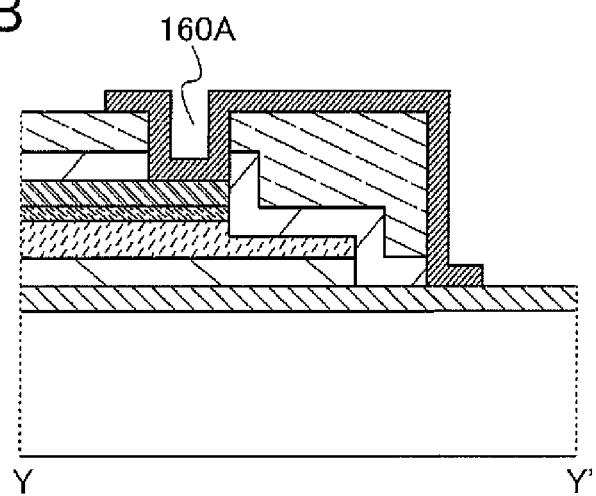
Figure 23C:
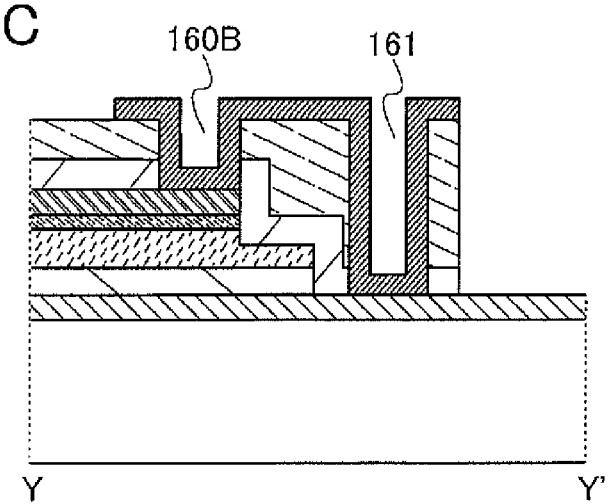

FIGS. 23A to 23C are cross-sectional views along Y-Y' in FIG. 21. That is, FIGS. 23A to 23C are cross-sectional views of the terminal connection portion on the source wiring side. In the cross section along Y-Y' in FIGS. 23A to 23C, the gate electrode layer 116 and the source or drain electrode layer 120 are connected to each other through the pixel electrode layer 132. FIGS. 23A to 23C illustrate various modes of connection between the gate electrode layer 116 and the source or drain electrode layer 120. Any of these modes or modes other than those illustrated in FIGS. 23A to 23C may be used for the terminal connection portion in a display device according to the invention to be disclosed. With the structure in which the source or drain electrode layer 120 is connected to the gate electrode layer 116, the height of the terminal connection portion can be made mostly uniform.

Note that the number of opening portions is not limited to those in FIGS. 23A to 23C. Either one opening portion or a plurality of opening portions maybe provided for one terminal. In the case where a plurality of opening portions are provided for one terminal, even when any of the opening portions is not formed favorably due to insufficient etching for forming the opening portion, electric connection can be realized at the other opening portion. Further, even in the case where all the opening portions are formed without any problems, the contact area can be made larger and contact resistance can be reduced, which is preferable.

In FIG. 23A, electric connection is realized in such a manner that end portions of the first protective film 126 and the second protective film 128 are removed by etching or the like to expose the gate electrode layer 116 and the source or drain electrode layer 120, and the pixel electrode layer 132 is formed over the exposed region. The top view illustrated in FIG. 21 corresponds to the top view of FIG. 23A.

Note that formation of the region in which the gate electrode layer 116 and the source or drain electrode layer 120 are exposed can be performed at the same time as formation of the first opening portion 130 and the second opening portion 131.

In FIG. 23B, electric connection is realized in such a manner that a third opening portion 160A is formed in the first protective film 126 and the second protective film 128, end portions of the first protective film 126 and the second protective film 128 are removed by etching or the like to expose the gate electrode layer 116 and the source or drain electrode layer 120, and the pixel electrode layer 132 is formed over the exposed region.

Note that formation of the third opening portion 160A and formation of the region in which the gate electrode layer 116 is exposed can be performed at the same time as formation of the first opening portion 130 and the second opening portion 131.

In FIG. 23C, electric connection is realized in such a manner that a third opening portion 160B and a fourth opening portion 161 are formed in the first protective film 126 and the second protective film 128 to expose the gate electrode layer 116 and the source or drain electrode layer 120, and the pixel electrode layer 132 is formed over the exposed region. Here, end portions of the first protective film 126 and the second protective film 128 are removed by etching or the like similarly to those in FIGS. 23A and 23B, and this etched region is used for a terminal connection portion.

Note that formation of the third opening portion 160B and the fourth opening portion 161 and formation of the region in which the gate electrode layer 116 is exposed can be performed at the same time as formation of the first opening portion 130 and the second opening portion 131.

Next, a method for manufacturing a liquid crystal display device using the active matrix substrate for a display device, which is manufactured through the above steps, will be described. That is, a cell process and a module process will be described. Note that the cell process and the module process are not particularly limited in the method for manufacturing a display device in this embodiment mode.

In the cell process, the active matrix substrate manufactured through the above steps and a substrate opposite to the active matrix substrate (hereinafter referred to as an opposite substrate) are attached to each other and liquid crystal is injected. First, a method for manufacturing the opposite substrate will be briefly described below. Note that a film formed on the opposite substrate may have a single-layer structure or a layered structure even if not particularly mentioned.

First, a light-shielding layer is formed over a substrate; a color filter layer of any of red, green, and blue is formed over the light-shielding layer; a pixel electrode layer is selectively formed over the color filter layer; and then, a rib is formed over the pixel electrode layer. Note that a substrate similar to the substrate 100 may be used here. That is, a glass substrate may be used.

As the light-shielding layer, a film of a material having a light-shielding property is selectively formed. As the material having a light-shielding property, for example, an organic resin containing a black resin (carbon black) can be used. Alternatively, a layered film which includes a film of a material containing chromium as its main component may be used. The film of a material containing chromium as its main component refers to a film containing chromium, chromium oxide, or chromium nitride. The material used for the light-shielding layer is not particularly limited as long as it has a light-shielding property. In order to selectively form the film of a material having a light-shielding property, a photolithography method or the like is adopted.

The color filter layer may be selectively formed using an organic resin film which transmits only light with any of red, green, and blue when irradiated with white light from a backlight. The color filter layer can be selectively formed by selective formation of color materials. The arrangement of the color filter may be a stripe arrangement, a delta arrangement, or a square arrangement.

The pixel electrode layer can be formed similarly to the pixel electrode layer 132 included in the active matrix substrate. Note that since selective formation is not necessary, the pixel electrode layer may be formed over the entire surface.

The rib formed over the pixel electrode is an organic resin film formed for the purpose of widening the viewing angle. Note that the rib is not required to be formed if not particularly necessary.

Note that as the method for manufacturing the opposite substrate, there are other various modes. For example, after formation of the color filter layer and before formation of the pixel electrode layer, an overcoat layer may be formed. By formation of the overcoat layer, planarity of a surface on which the pixel electrode is formed can be improved, whereby yield is increased. In addition, part of a material included in the color filter layer can be prevented from entering a liquid crystal material. For the overcoat layer, a thermosetting material containing an acrylic resin or an epoxy resin as a base is used.

Further, before or after formation of the rib, post spacers (columnar spacers) may be formed as spacers. The post spacers refer to structural objects formed at regular intervals on the opposite substrate in order to keep the gap between the active matrix substrate and the opposite substrate constant. In the case of using bead spacers (spherical spacers), the post spacers are not necessarily formed.

Next, an alignment film is formed on the active matrix substrate and the opposite substrate. Formation of the alignment film is performed, for example, in such a manner that a polyimide resin or the like is melted in an organic solvent; this solution is applied by a printing method, a spin coating method, or the like; and then the solution is dried and baked. The thickness of the formed alignment film is generally approximately larger than or equal to 50 nm and smaller than or equal to 100 nm. Rubbing treatment is performed on the alignment film so that liquid crystal molecules are aligned with a certain pretilt angle. The rubbing treatment is performed by, for example, rubbing an alignment film with a shaggy cloth such as a velvet.

Then, the active matrix substrate and the opposite substrate are attached with a sealant. In the case where post spacers are not provided on the opposite substrate, bead spacers may be dispersed in a desired region and attachment may be performed.

Next, a liquid crystal material is injected by dripping or the like in a space between the active matrix substrate and the opposite substrate, which are attached to each other. After injection of the liquid crystal material, an inlet for injection is sealed with an ultraviolet curing resin or the like. Alternatively, after dripping a liquid crystal material, the active matrix substrate and the opposite substrate may be attached to each other.

Next, a polarizing plate is attached to both surfaces of a liquid crystal cell, which is formed by attachment of the active matrix substrate and the opposite substrate. Then, the cell process is completed.

Next, as the module process, a flexible printed circuit (FPC) is connected to an input terminal (the exposed region of the gate electrode layer 116 in FIGS. 23A to 23C) of the terminal portion. The FPC has a wiring formed using a conductive film over an organic resin film of polyimide or the like, and is connected to the input terminal through an anisotropic conductive paste (hereinafter referred to as an ACP). The ACP includes a paste serving as an adhesive and particles plated with gold or the like to have a conductive surface, each of which has a diameter of several tens of micrometers to several hundred micrometers. When the particles mixed in the paste are in contact with the conductive layer over the input terminal and the conductive layer over the terminal connected to the wiring formed in the FPC, electric connection therebetween is achieved. Note that alternatively, after connection of the FPC, a polarizing plate may be attached to the active matrix substrate and the opposite substrate. Thus, a liquid crystal panel used for a display device can be manufactured.

As described above, the active matrix substrate having a pixel transistor, which is used for a display device, can be manufactured using three or four photomasks.

Accordingly, the number of steps for manufacturing a thin film transistor and a display device can be significantly reduced. Specifically, as described above, a thin film transistor can be manufactured using one photomask or two photomasks. Further, an active matrix substrate having a pixel transistor can be manufactured using three or four photomasks. Thus, since the number of photomasks to be used is reduced, the number of steps for manufacturing a thin film transistor and a display device can be significantly reduced.

In addition, the number of steps for manufacturing a thin film transistor can be significantly reduced without a complicated step such as backside light exposure, resist reflow, or a lift-off method. Therefore, the number of steps for manufacturing a display device can be significantly reduced without a complicated step.

Further, the number of steps for manufacturing a thin film transistor can be significantly reduced without changing electric characteristics of a thin film transistor.

Further, manufacturing cost can be significantly reduced by the above advantageous effect.

In addition to the above advantageous effect, a thin film transistor included in a display device is mechanically stable; therefore, a manufacturing process of a display device is simplified without reducing yield and reliability.

Note that the invention to be disclosed is not limited to a liquid crystal display device and may be applied to any other display device.

Embodiment Mode 2

In this embodiment mode, a different mode from Embodiment Mode 1 is described with reference to FIGS. 28A to 28C, FIGS. 29A to 29C, FIGS. 30A to 30C, FIGS. 31A to 31C, FIGS. 32A to 32C, FIGS. 33A to 33C, FIG. 34, FIG. 35, FIG. 36, FIG. 37, FIG. 38, FIG. 39, FIG. 40, and FIG. 41.

Figure 36:
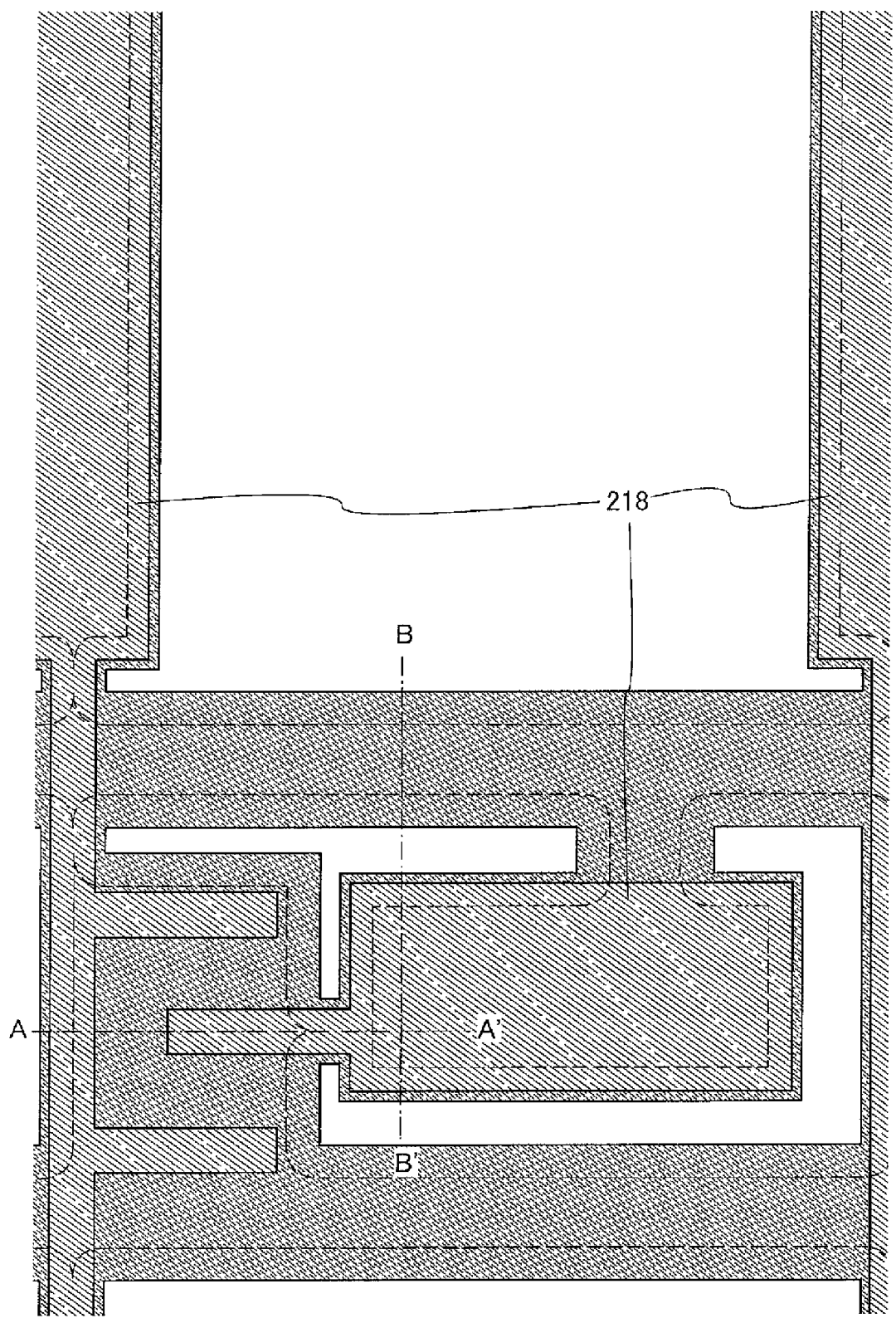
FIG. 36 illustrates an example of a method for manufacturing a thin film transistor and a display device.
Figure 37:
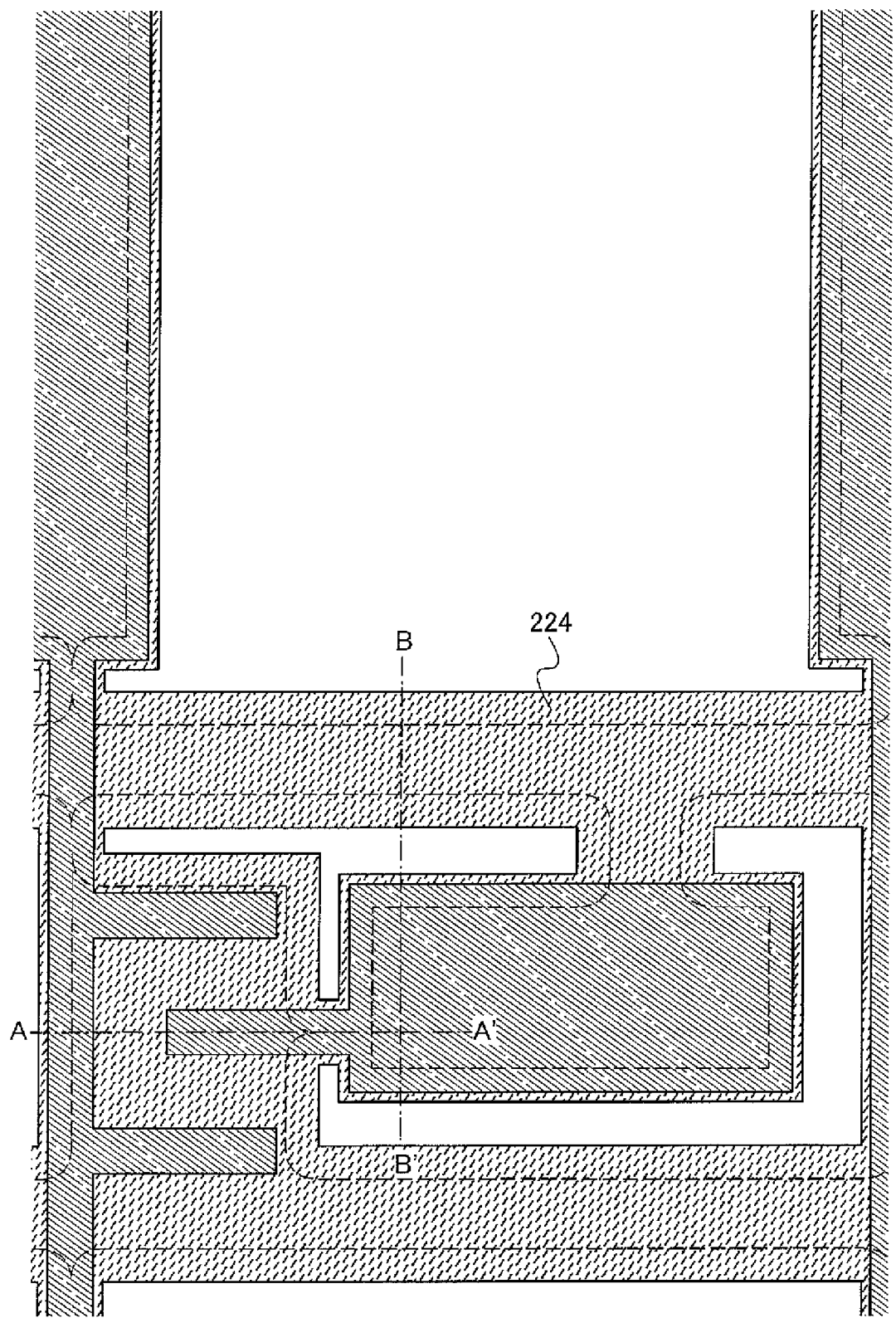
FIG. 37 illustrates an example of a method for manufacturing a thin film transistor and a display device.
Figure 38:
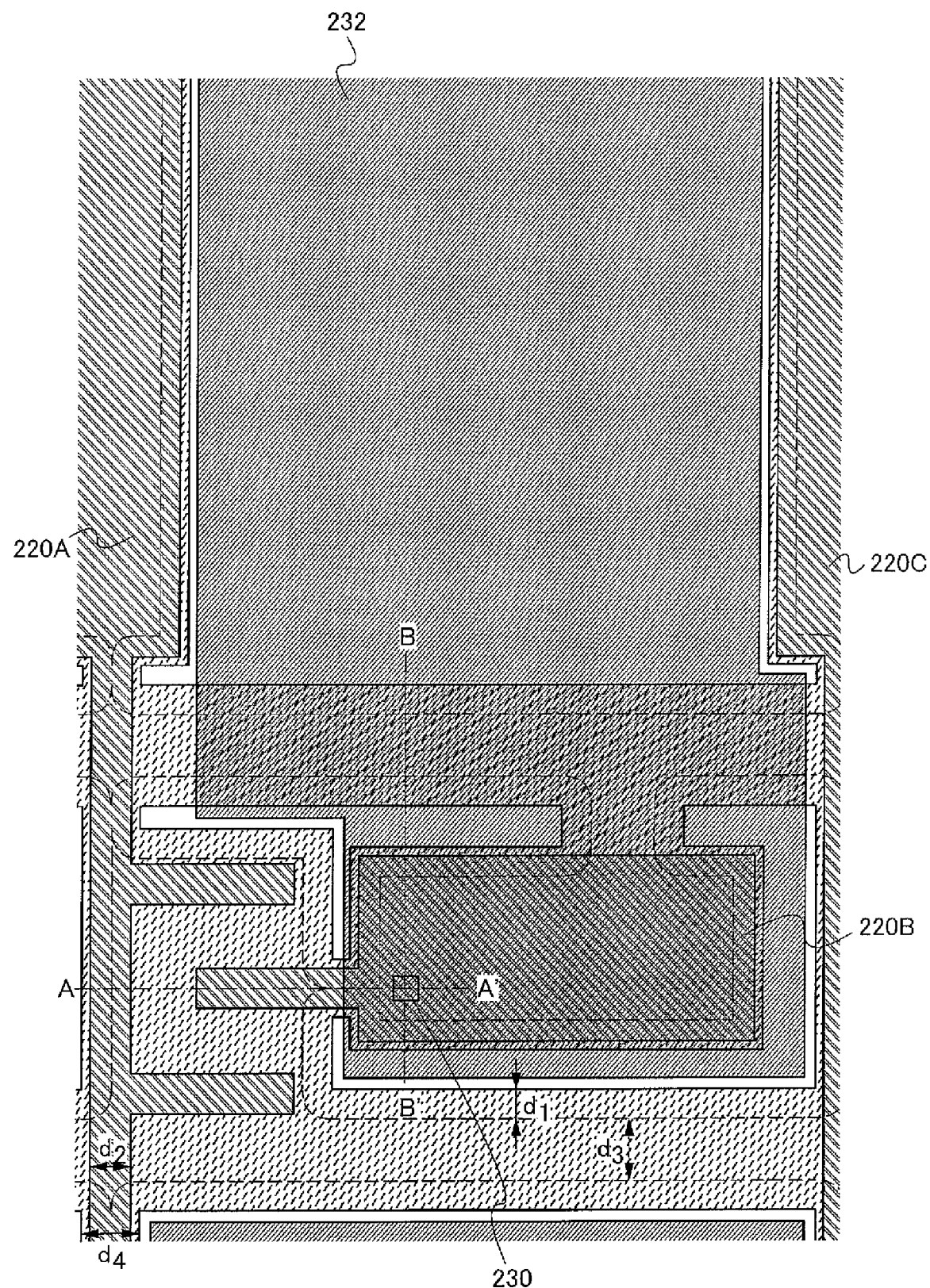
FIG. 38 illustrates an example of a method for manufacturing a thin film transistor and a display device.

Note that FIG. 34, FIG. 35, FIG. 36, FIG. 37, and FIG. 38 illustrate top plan views of a thin film transistor according to this embodiment mode, and FIG. 38 is a completion view in which components are formed up to a pixel electrode. FIGS. 28A to 28C, FIGS. 29A to 29C, and FIGS. 30A to 30C are cross-sectional views along A-A' in FIG. 34, FIG. 35, FIG. 36, FIG. 37, and FIG. 38. FIGS. 31A to 31C, FIGS. 32A to 32C, and FIGS. 33A to 33C are cross-sectional views along B-B' in FIG. 34, FIG. 35, FIG. 36, FIG. 37, and FIG. 38.

First, a first conductive film 202, a first insulating film 204, a semiconductor film 206, an impurity semiconductor film 208, and a second conductive film 210 are formed over a substrate 200. A substrate similar to the substrate 100 in Embodiment Mode 1 can be used as the substrate 200. The first conductive film 202 can be formed similarly to the first conductive film 102 in Embodiment Mode 1. The first insulating film 204 can be formed similarly to the first insulating film 104 in Embodiment Mode 1. The semiconductor film 206 can be formed similarly to the semiconductor film 106 in Embodiment Mode 1. The impurity semiconductor film 208 can be formed similarly to the impurity semiconductor film 108 in Embodiment Mode 1. The second conductive film 210 can be formed similarly to the second conductive film 110 in Embodiment Mode 1.

Figure 28A:
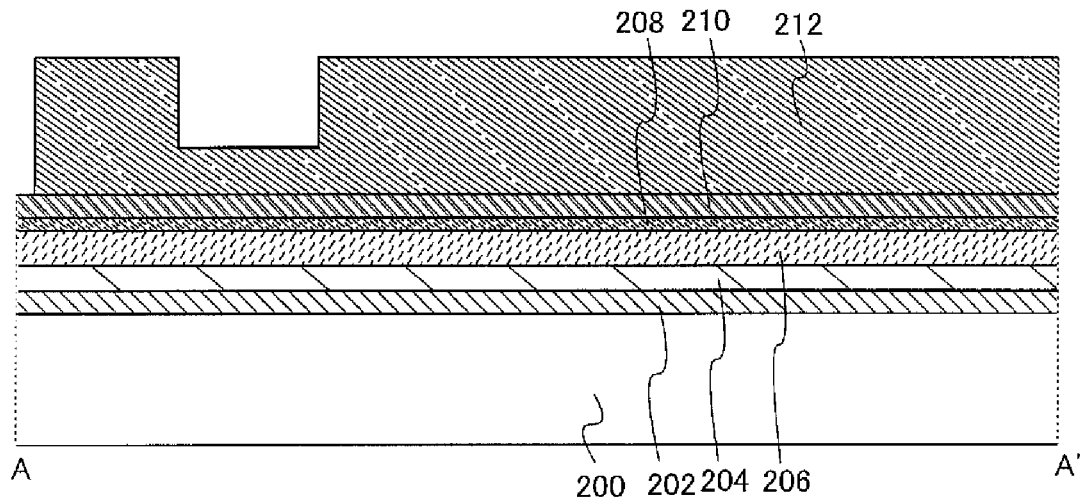
FIGS. 28A to 28C illustrate an example of a method for manufacturing a thin film transistor and a display device.
Figure 28B:
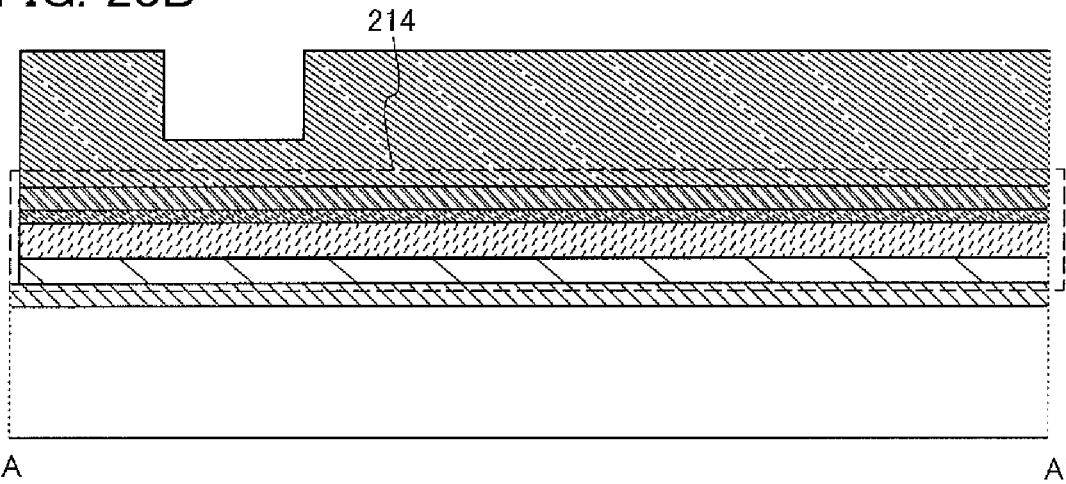
Figure 31A:
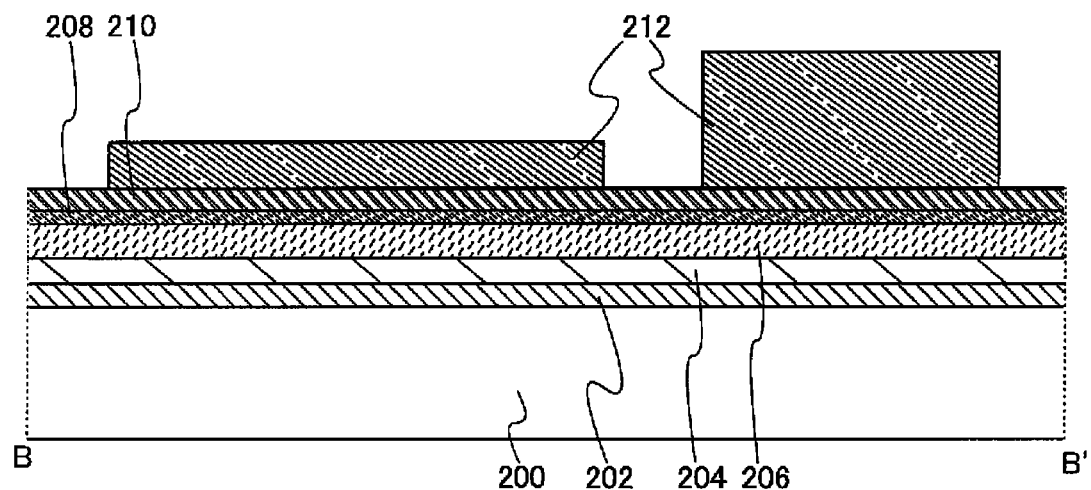
FIGS. 31A to 31C illustrate an example of a method for manufacturing a thin film transistor and a display device.
Figure 31B:
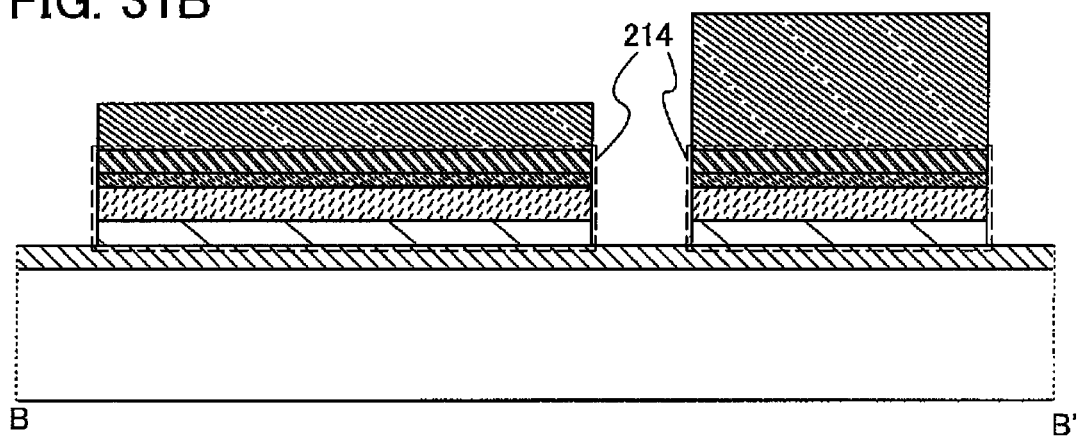
Figure 31C:
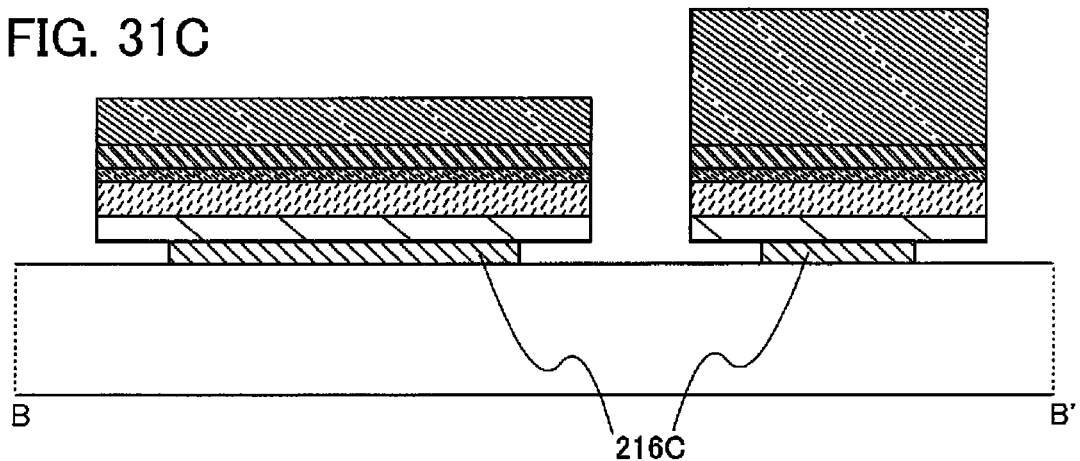

Next, a first resist mask 212 is formed over the second conductive film 210 (see FIG. 28A and FIG. 31A). The first resist mask 212 is a resist mask having a depressed portion and a projected portion similarly to the first resist mask 112 in Embodiment Mode 1. In other words, the first resist mask 212 can also be referred to as a resist mask including a plurality of regions (here, two regions) having different thicknesses. In the first resist mask 212, a thick region is referred to as a projected portion of the first resist mask 212 and a thin region is referred to as a depressed portion of the first resist mask 212.

In the first resist mask 212, a projected portion is formed in a region where a source or drain electrode layer 220 is formed, and a depressed portion is formed in a region where the source or drain electrode layer 220 is not provided and a semiconductor layer is exposed.

The first resist mask 212 can be formed using a common multi-tone mask similarly to the first resist mask 112 in Embodiment Mode 1.

Next, first etching is performed using the first resist mask 212. That is, the first insulating film 204, the semiconductor film 206, the impurity semiconductor film 208, and the second conductive film 210 are etched to form a thin film stack 214 (see FIG. 28B, FIG. 31B, and FIG. 34). The first etching can be performed to expose at least the first conductive film 202, similarly to the first etching described in Embodiment Mode 1.

Next, second etching is performed using the first resist mask 212. That is, the first conductive film 202 is etched to form a gate electrode layer 216 (see FIG. 28C, FIG. 31C, and FIG. 35). In this specification, this etching step is referred to as the second etching.

Note that the gate electrode layer 216 forms a gate wiring, a capacitor wiring, and a supporting portion. In the case where the gate electrode layer is referred to as a gate electrode layer 216A, the gate electrode layer serving as a gate wiring is denoted. In the case where the gate electrode layer is referred to as a gate electrode layer 216B or a gate electrode layer 216D, the gate electrode layer serving as a supporting portion is denoted. In the case where the gate electrode layer is referred to as a gate electrode layer 216C, the gate electrode layer serving as a capacitor wiring is denoted. These gate electrode layers are collectively referred to as the gate electrode layer 216.

The second etching is performed under the etching conditions by which a side surface of the gate electrode layer 216 formed from the first conductive film 202 is provided on the inner side than a side surface of the thin film stack 214. In other words, the second etching is performed so that the side surface of the gate electrode layer 216 is in contact with a bottom surface of the thin film stack 214. Further, the second etching is performed under the conditions by which the etching rate with respect to the second conductive film 210 is low and the etching rate with respect to the first conductive film 202 is high. In other words, the second etching is performed under the conditions by which the etching selectivity ratio of the first conductive film 202 to the second conductive film 210 is high. By performing the second etching under such conditions, the gate electrode layer 216 can be formed.

Note that there is no particular limitation on the shape of the side surface of the gate electrode layer 216. For example, the shape may be a tapered shape. The shape of the side surface of the gate electrode layer 216 is determined depending on the conditions such as a chemical used in the second etching.

Here, the phrase "the conditions by which the etching rate with respect to the second conductive film 210 is low and the etching rate with respect to the first conductive film 202 is high" or "the conditions by which the etching selectivity of the first conductive film 202 to the second conductive film 210 is high" refers to conditions meeting the following first requirement and second requirement.

Figure 28C:
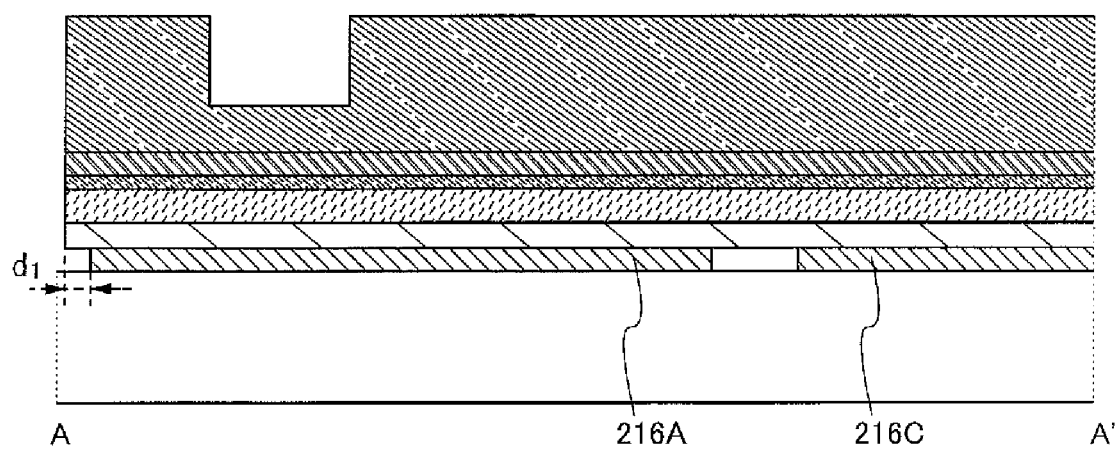
Figure 35:
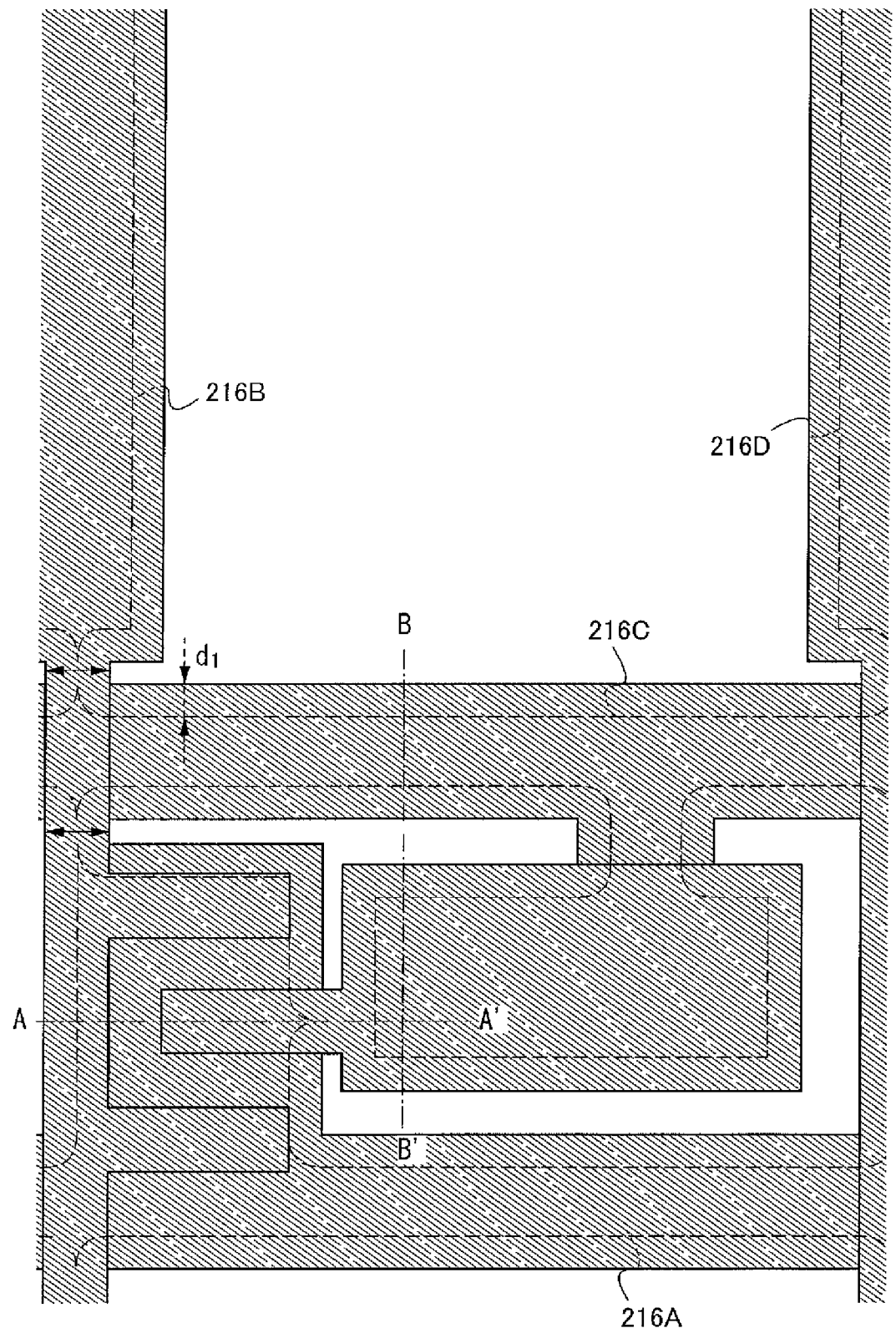
FIG. 35 illustrates an example of a method for manufacturing a thin film transistor and a display device.

The first requirement is that the gate electrode layer 216 is left in a portion necessarily provided with the gate electrode layer 216. The portion necessarily provided with the gate electrode layer 216 refers to regions indicated by dotted lines in FIG. 35, FIG. 36, FIG. 37, and FIG. 38. That is, it is necessary that the gate electrode layer 216 be left so as to form a gate wiring, a capacitor wiring, and a supporting portion after the second etching. In order that the gate electrode layer may form the gate wiring and the capacitor wiring, the second etching is required to be performed so as not to disconnect these wirings. As illustrated in FIG. 28C and FIG. 35, the side surface of the gate electrode layer 216 is preferably provided on the inner side than the side surface of the thin film stack 214 by a distance $d_1$, and the distance $d_1$ may be set as appropriate according to the layout by a practitioner.

The second requirement is that a width $d_3$ of the gate wiring or the capacitor wiring formed using the gate electrode layer 216 and a minimum width $d_2$ of a source wiring formed using a source or drain electrode layer 220A have appropriate values (see FIG. 38). This is because as the source or drain electrode layer 220A is etched more by the second etching, the minimum width $d_2$ of the source wiring is reduced; accordingly, the current density of the source wiring becomes excessive and electric characteristics are degraded. Therefore, the second etching is performed under the conditions by which the etching rate with respect to the first conductive film 202 is not too high and the etching rate with respect to the second conductive film 210 is as low as possible. In addition, third etching that is described later is performed under the conditions by which the etching rate with respect to the first conductive film 202 is as low as possible.

It is difficult to make the minimum width $d_2$ of the source wiring large. This is because the minimum width $d_2$ of the source wiring is determined by a minimum width $d_4$ of the semiconductor layer overlapping with the source wiring, the minimum width $d_4$ of the semiconductor layer is required to be increased in order to make the minimum width $d_2$ of the source wiring larger, and it becomes difficult that the gate wiring and the capacitor wiring, which are adjacent to each other, are insulated from each other. To solve such a problem, the minimum width $d_4$ of the semiconductor layer is set smaller than approximately twice the distance $d_1$. In other words, the distance $d_4$ is set larger than approximately half the minimum width $d_4$ of the semiconductor layer.

Note that it is acceptable as long as there is at least one portion where the width of the semiconductor layer overlapping with the source wiring is the minimum width $d_4$ between the gate wiring and the capacitor wiring which is adjacent to the gate wiring. It is preferable that the width of the semiconductor layer in a region adjacent to the gate wiring and a region adjacent to the capacitor wiring be the minimum width $d_4$ as illustrated in FIG. 38.

Note that the width of the electrode in a portion connected to a pixel electrode layer, which is formed using the source or drain electrode layer, be equal to the minimum width $d_2$ of the source wiring.

As described above, the second etching under the condition that side etching can also be performed is significantly important also in this embodiment mode as in Embodiment Mode 1. This is because the second etching is accompanied by side etching of the first conductive film 202, whereby the gate wiring and the capacitor wiring, which are adjacent to each other and are formed using the gate electrode layer 216, can be insulated from each other.

Note that as illustrated in FIG. 35, the thin film stack 214 formed by the first etching is designed to be narrow in a portion adjacent to a supporting portion which is formed using the gate electrode layer 216B or the gate electrode layer 216D (see the portions indicated by the arrows in FIG. 35). With this structure, the gate electrode layer 216A and the gate electrode layer 216B or the gate electrode layer 216D can be disconnected to be insulated from each other by the second etching.

Note that the gate electrode layer 216B and the gate electrode layer 216D which are illustrated in FIG. 35 each serve as a supporting portion which supports the thin film stack 214. By providing the supporting portion, peeling of a film such as a gate insulating film formed over the gate electrode layer can be prevented. Further, by providing the supporting portion, a cavity region formed adjacent to the gate electrode layer 216 by the second etching can be prevented form being larger than necessary. Note that it is preferable to provide the supporting portion because the thin film stack 214 can be prevented from being broken or damaged under its own weight and thus, yield is increased.

Further, owing to the gate electrode layer 216C serving as not only the capacitor wiring but also the supporting portion, the thin film transistor can keep a mechanical balance and thus, the process for forming the thin film transistor can be simplified without reducing yield and reliability.

As described above, wet etching is preferably performed as the second etching.

In the case where wet etching is performed as the second etching, aluminum or molybdenum may be formed as the first conductive film 202, titanium or tungsten may be formed as the second conductive film 210, and a chemical containing nitric acid, acetic acid, and phosphoric acid may be used for etching. Alternatively, molybdenum may be formed as the first conductive film 202, titanium, aluminum, or tungsten may be formed as the second conductive film 210, and a chemical containing hydrogen peroxide water may be used for etching.

In the case where wet etching is performed as the second etching, it is most preferable that a layered film in which molybdenum is formed over aluminum to which neodymium is added be formed as the first conductive film 202, tungsten be formed as the second conductive film 210, and a chemical containing nitric acid at 2%, acetic acid at 10%, and phosphoric acid at 72% be used for etching. By using a chemical having such a composition ratio, the first conductive film 202 can be etched without the second conductive film 210 being etched. Note that neodymium is added to the first conductive film 202 for the purpose of reducing resistance of aluminum and preventing hillocks.

Note that as illustrated in FIG. 35, the gate electrode layer 216 has a horn (for example, a horn 251) when seen from the above. This is because since the second etching for forming the gate electrode layer 216 is approximately isotropic, etching progresses so that the distance $d_1$ between the side surface of the gate electrode layer 216 and the side surface of the thin film stack 214 is mostly uniform.

Next, the first resist mask 212 is reduced in size; accordingly, the second conductive film 210 is exposed and a second resist mask 218 is formed.

Figure 29A:
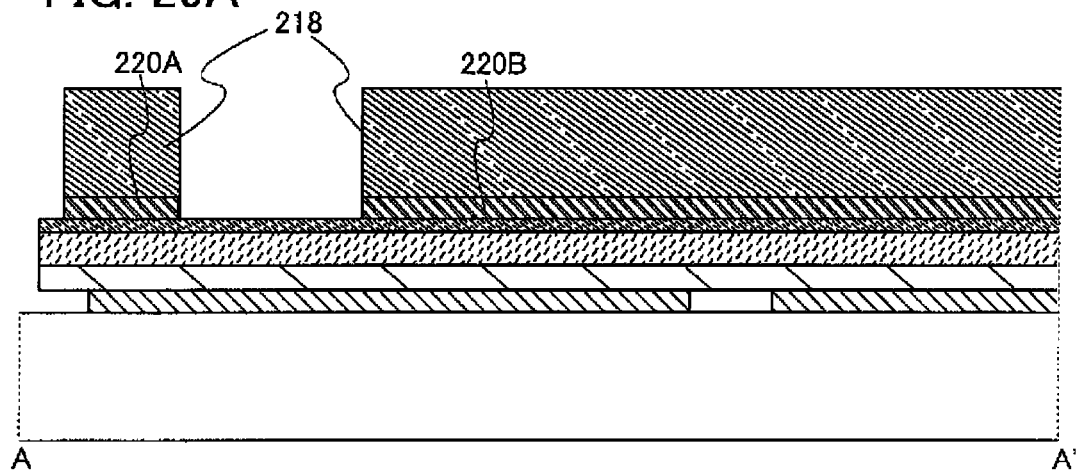
FIGS. 29A to 29C illustrate an example of a method for manufacturing a thin film transistor and a display device.
Figure 32A:
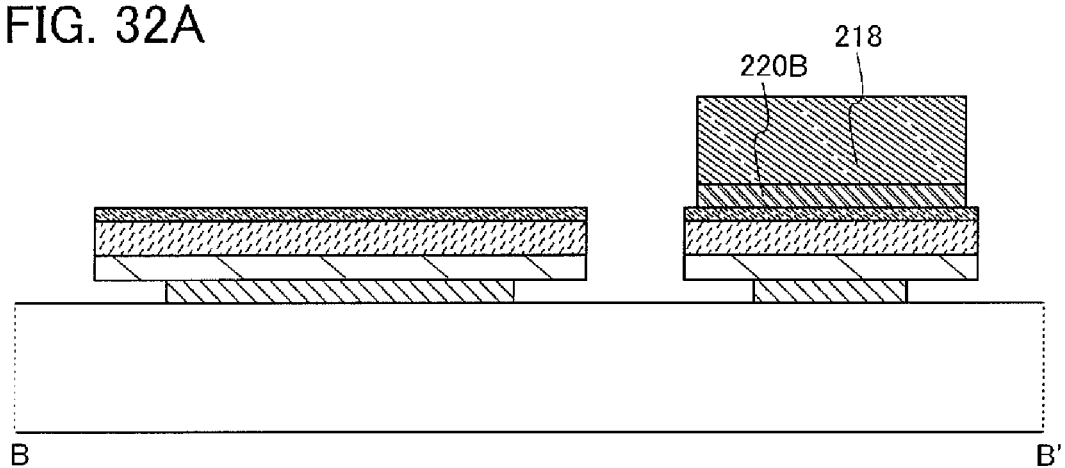
FIGS. 32A to 32C illustrate an example of a method for manufacturing a thin film transistor and a display device.

Next, the second conductive film 210 in the thin film stack 214 is etched using the second resist mask 218 to form the source or drain electrode layer 220 (see FIG. 29A, FIG. 32A, and FIG. 36). Here, as the etching conditions, the conditions by which films other than the second conductive film 210 are not unintentionally etched or eroded or are not easily unintentionally etched or eroded are selected. In particular, it is important that etching is performed under the conditions by which the gate electrode layer 216 is not unintentionally etched or eroded or is not easily unintentionally etched or eroded.

Note that the source or drain electrode layer 220 serves as the source wiring, the electrode which connects the thin film transistor and the pixel electrode to each other, and one electrode of a capacitor serving as a storage capacitor. In the case where the source or drain electrode layer is referred to as the source or drain electrode layer 220A or a source or drain electrode layer 220C, the electrode layer serving as a source wiring is denoted. In the case where the source or drain electrode layer is referred to as a source or drain electrode layer 220B, one electrode layer which connects a drain electrode of the thin film transistor and the pixel electrode to each other and forms the capacitor with the capacitor wiring is denoted. These source or drain electrode layers are collectively referred to as the source or drain electrode layer 220.

Note that for etching the second conductive film 210 in the thin film stack 214, either wet etching or dry etching may be performed.

Figure 29B:
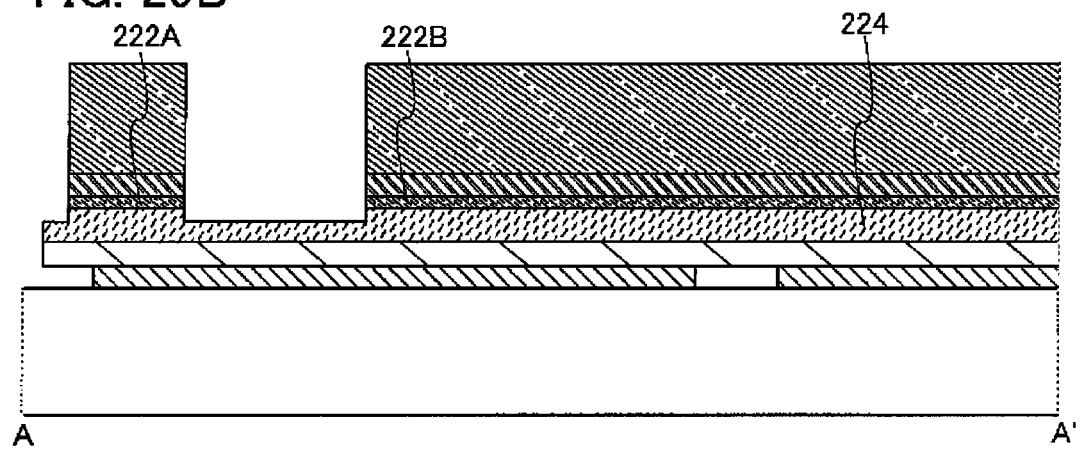
Figure 32B:
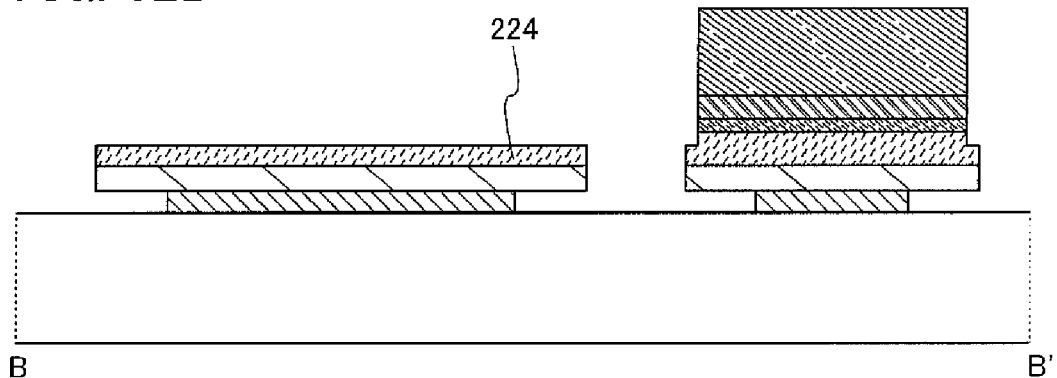
Figure 32C:
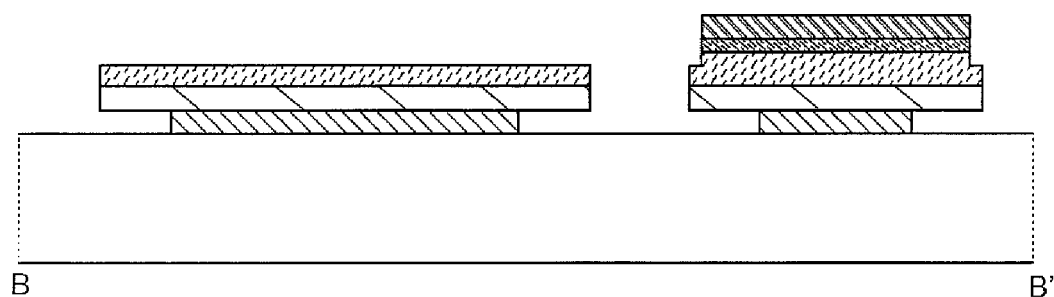

Then, the impurity semiconductor film 208 and an upper portion of the semiconductor film 206 (back channel portion) in the thin film stack 214 are etched to form a source or drain region 222 (see FIG. 29B, FIG. 32B, and FIG. 37). Here, as the etching conditions, the conditions by which films other than the impurity semiconductor film 208 and the semiconductor film 206 are not unintentionally etched or eroded or are not easily unintentionally etched or eroded are selected. In particular, it is important that etching is performed under the conditions by which the gate electrode layer 216 is not unintentionally etched or eroded or is not easily unintentionally etched or eroded.

Note that dry etching or wet etching can be performed for etching the impurity semiconductor film 208 and the upper portion of the semiconductor film 206 (back channel portion) in the thin film stack 214.

Figure 29C:
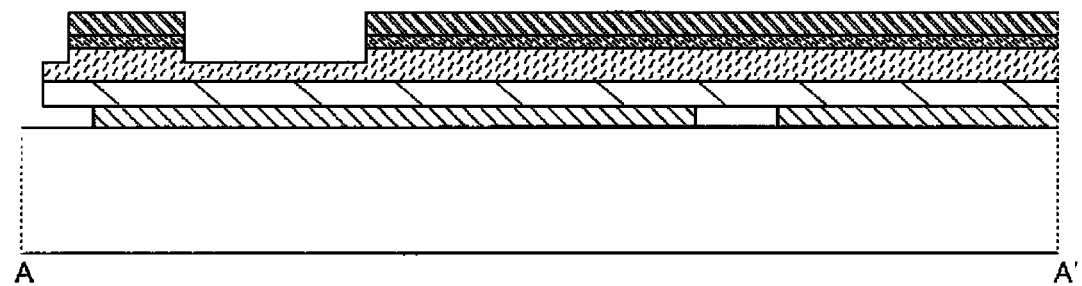

Then, the second resist mask 218 is removed (see FIG. 29C and FIG. 32C); accordingly, a thin film transistor is completed (see FIG. 29C). As described above, the thin film transistor can be manufactured using one photomask (multi-tone mask).

Note that in this specification, the steps described with reference to FIG. 29A and FIG. 29B are collectively referred to as third etching. The third etching may be performed in separate steps as described above or may be performed in a single step.

A second insulating film is formed to cover the thin film transistor which is formed as described above. Here, although the second insulating film may be formed using only a first protective film 226, the second insulating film is formed using the first protective film 226 and a second protective film 228 (see FIG. 30A and FIG. 33A). The first protective film 226 can be formed similarly to the first protective film 126 and the second protective film 128 in Embodiment Mode 1. The second protective film 228 can be formed by a method by which a film can be mostly planarized similarly to the second protective film 128 in Embodiment Mode 1.

Figure 30A:
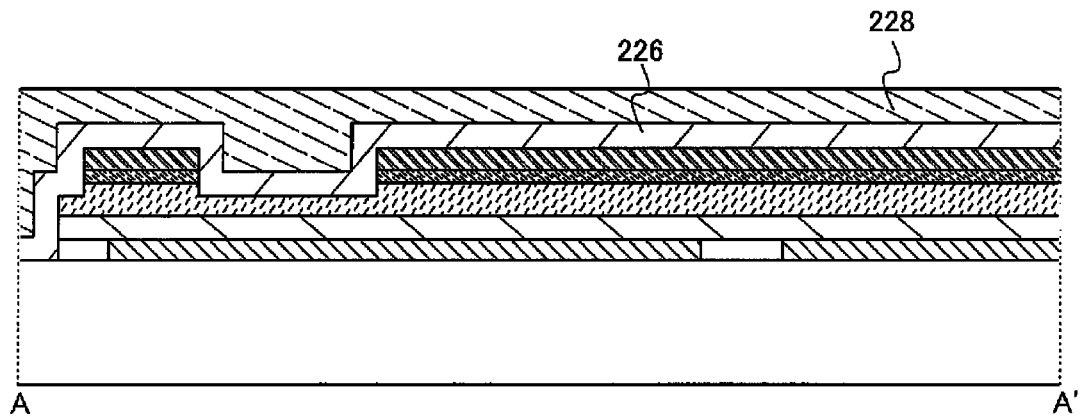
FIGS. 30A to 30C illustrate an example of a method for manufacturing a thin film transistor and a display device.
Figure 30B:
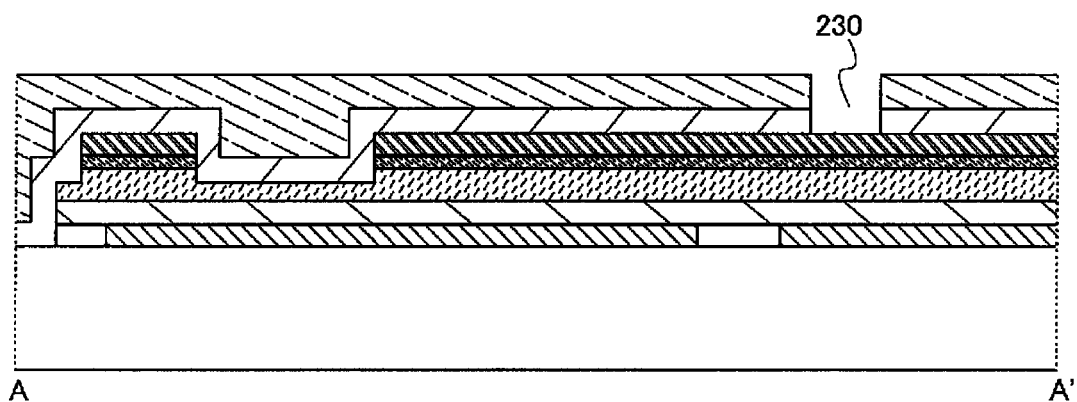
Figure 33A:
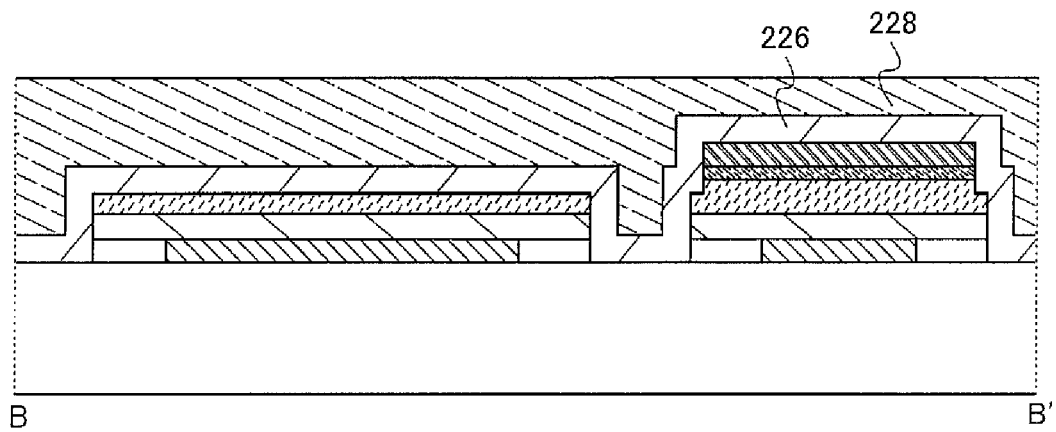
FIGS. 33A to 33C illustrate an example of a method for manufacturing a thin film transistor and a display device.
Figure 33B:
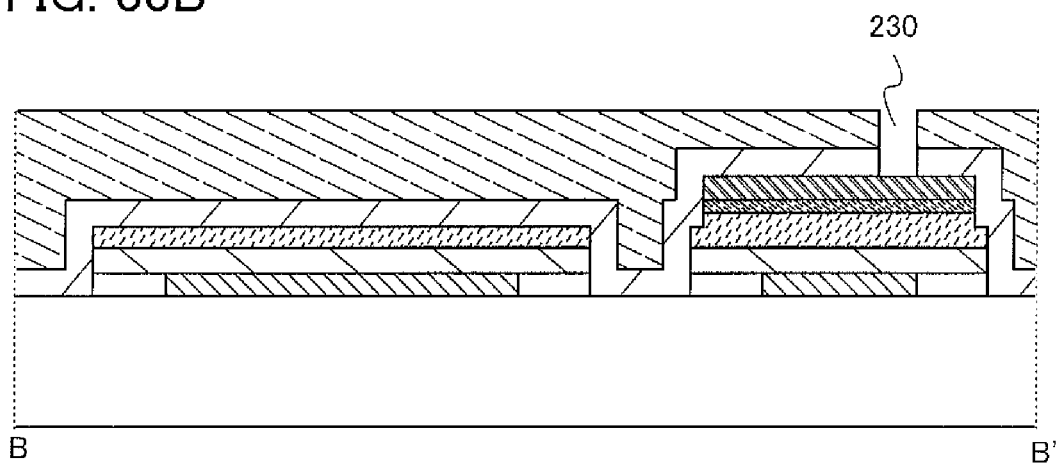

Next, a first opening portion 230 is formed in the second insulating film (see FIG. 30B and FIG. 33B). The first opening portion 230 is formed so as to reach at least the surface of the source or drain electrode layer. The method for forming the first opening portion 230 is not limited to a particular method and may be determined as appropriate by a practitioner in accordance with the diameter of the first opening portion 230 or the like. For example, the first opening portion 230 can be formed by dry etching using a photolithography method. Although two opening portions each for connecting the source or drain electrode layer and the pixel electrode layer to each other are required to be provided for one pixel in Embodiment Mode 1, only one opening portion is required to be provided for one pixel in this embodiment mode. Therefore, yield can be increased. Further, the margin of an opening portion can be wide and thus yield can be further increased.

The gate electrode layer 216C is provided below the first opening portion 230. By providing the gate electrode layer 216C, the source or drain electrode layer 220B, a semiconductor layer 224 overlapping with the source or drain electrode layer 220B, and the like can be prevented from being bent and thus damaged or broken in a formation process or in use. Therefore, the process for manufacturing a display device can be simplified without reducing yield and reliability.

Note that in the case of forming the opening portion by a photolithography method, one photomask is used.

Figure 30C:
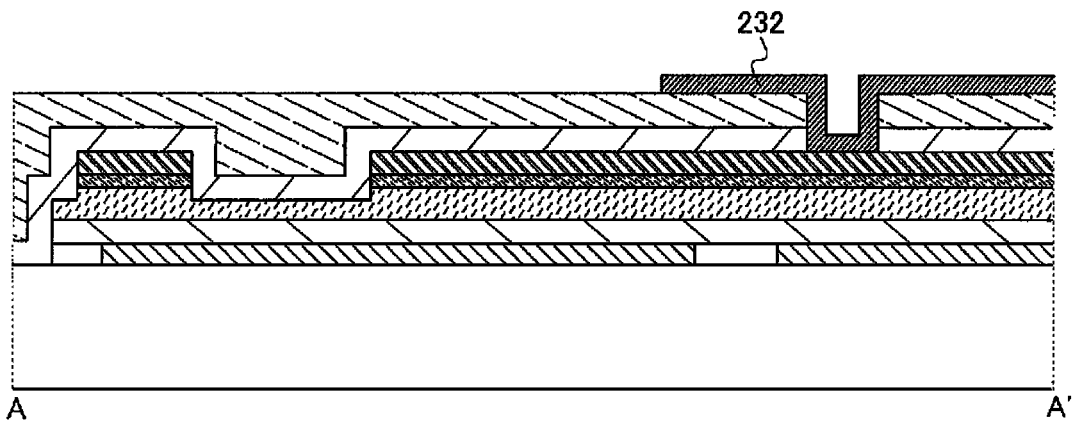
Figure 33C:
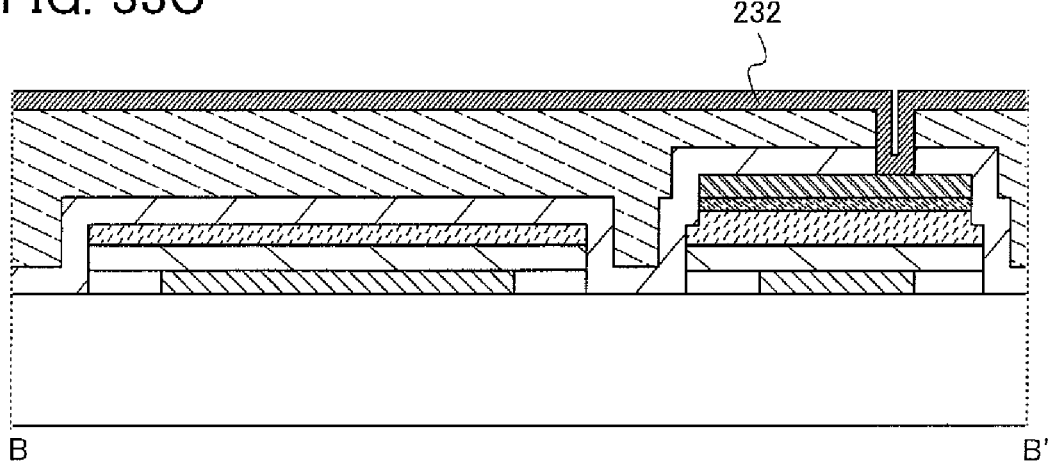

Next, the pixel electrode layer 232 is formed over the second insulating film (see FIG. 30C, FIG. 33C, and FIG. 38). The pixel electrode layer 232 is formed so as to be connected to the source or drain electrode layer 220 through the opening portion. Specifically, the pixel electrode layer 232 is formed so as to be connected to the source or drain electrode layer 220C through the first opening portion 230. The pixel electrode layer 232 is preferably formed using a conductive material having a light-transmitting property. Here, as the conductive material having a light-transmitting property, indium tin oxide (hereinafter referred to as ITO), indium oxide containing tungsten oxide, indium zinc oxide containing tungsten oxide, indium oxide containing titanium oxide, indium tin oxide containing titanium oxide, indium zinc oxide, indium tin oxide to which silicon oxide is added, and the like are given. The film of the conductive material having a light-transmitting property may be formed by a sputtering method, a CVD method, or the like; however, the present invention is not limited to a particular method. In addition, the pixel electrode layer 232 may have a single-layer structure or a layered structure in which a plurality of films are stacked.

Note that in this embodiment mode, the conductive material having a light-transmitting property is used for only the pixel electrode layer 232; however, the invention to be disclosed is not limited to this. As materials of the first conductive film 202 and the second conductive film 210, conductive materials having a light-transmitting property may be used.

Note that in the case of forming the pixel electrode layer 232 by a photolithography method, one photomask is used.

As described above, formation of an active matrix substrate according to this embodiment mode (so-called array process) is completed. As described in this embodiment mode, the thin film transistor can be manufactured using one photomask in such a manner that the gate electrode layer is formed utilizing side etching and further, the source electrode layer and the drain electrode layer are formed using a multi-tone mask.

The thin film transistor manufactured using the manufacturing method of the invention to be disclosed has a structure including a gate insulating film over a gate electrode layer, a semiconductor layer over the gate insulating film, a source region and a drain region over the semiconductor layer, a source electrode and a drain electrode over the source region and the drain region, and a cavity adjacent to a side surface of the gate electrode layer (see FIG. 30C). By the cavity formed adjacent to the side surface of the gate electrode layer, a thin film transistor with a small leakage current at an end portion of the gate electrode layer can be manufactured.

Note that although a resist mask having a depressed portion is formed as the first resist mask in the above description, the invention to be disclosed is not limited to this. The first resist mask may be a normal photomask. The case where a multi-tone mask is not used for forming the first resist mask is briefly described with reference to FIG. 39, FIG. 40, and FIG. 41.

Figure 34:
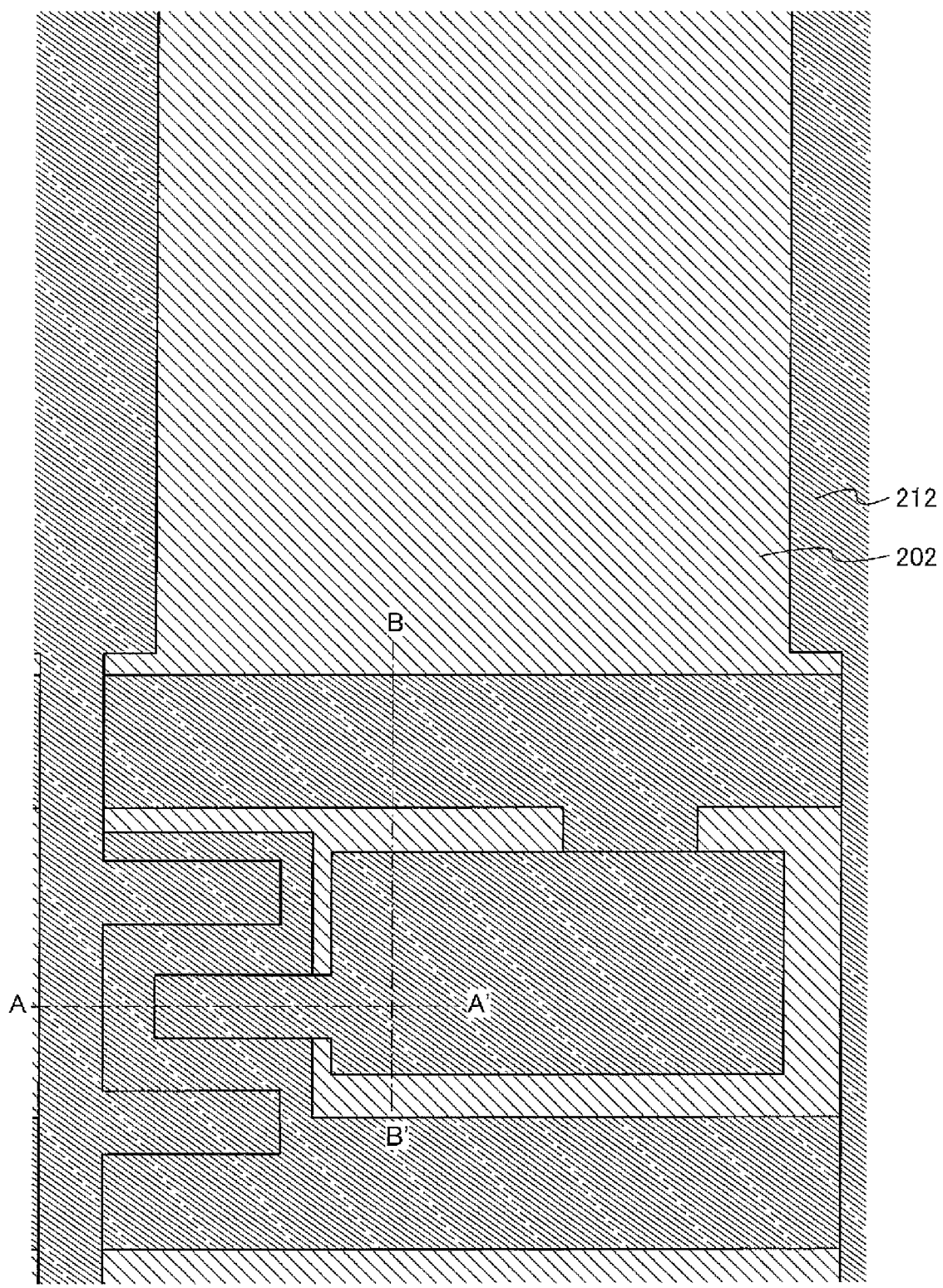
FIG. 34 illustrates an example of a method for manufacturing a thin film transistor and a display device.
Figure 39:
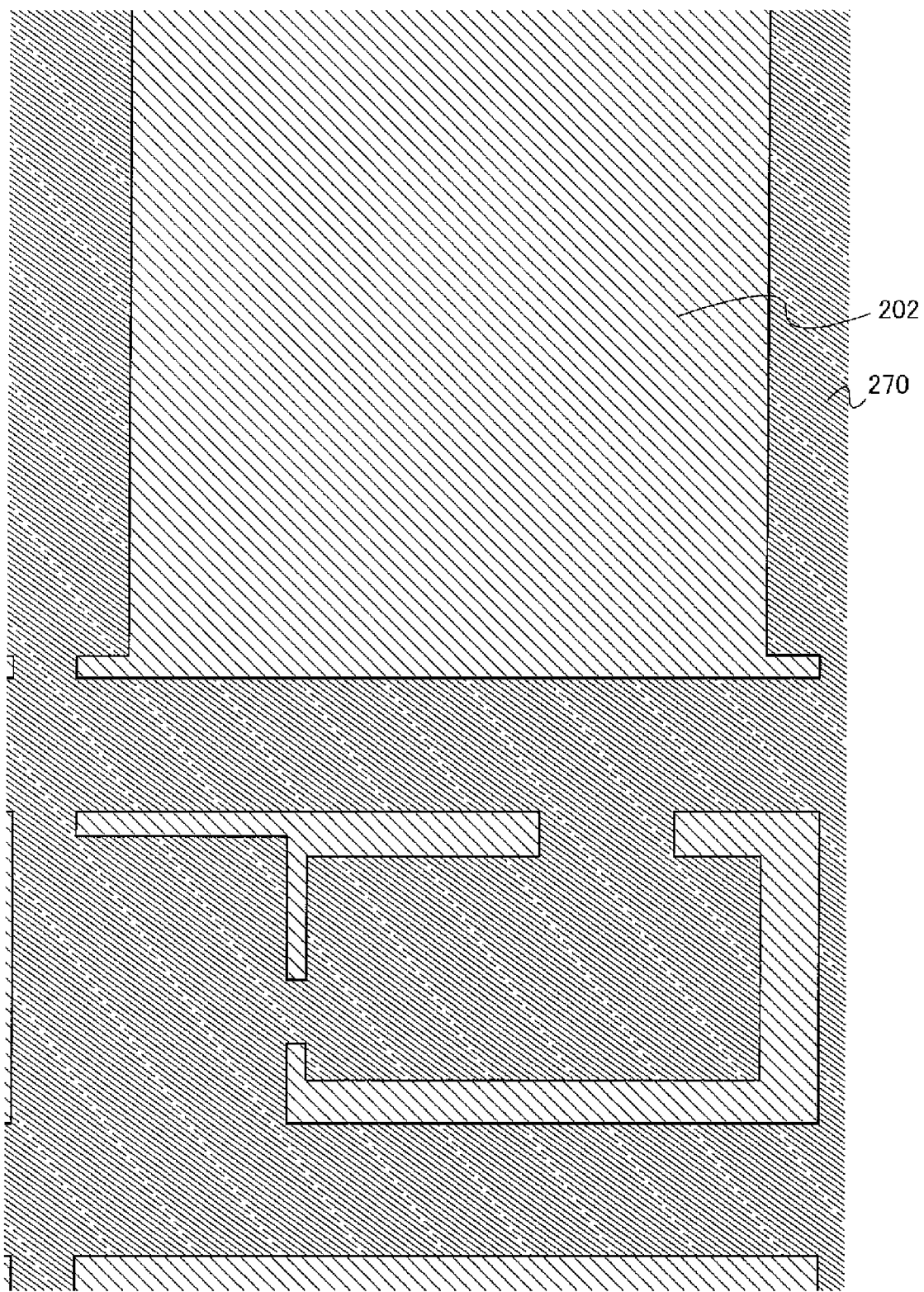
FIG. 39 illustrates an example of a method for manufacturing a thin film transistor and a display device.
Figure 40:
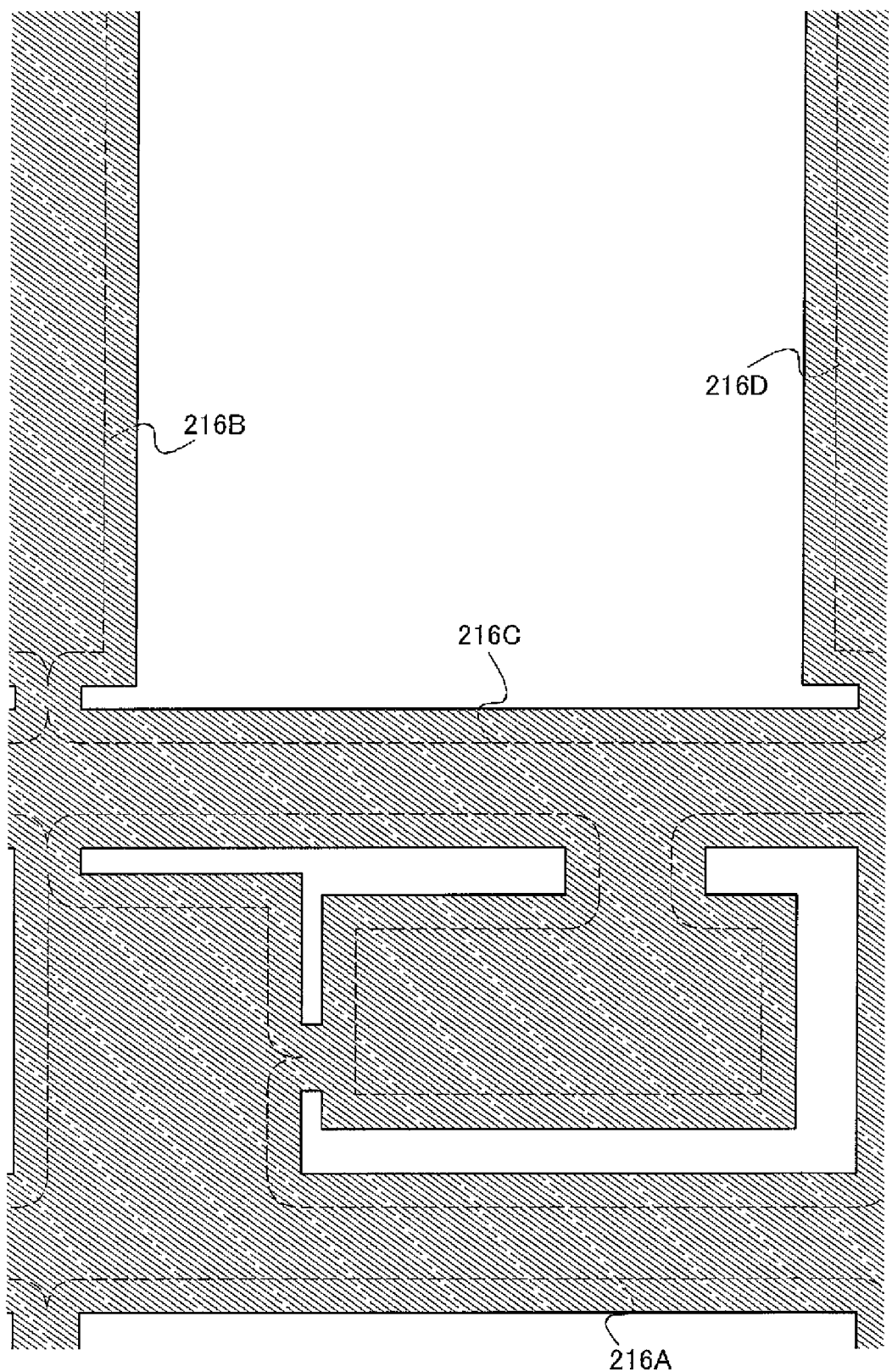
FIG. 40 illustrates an example of a method for manufacturing a thin film transistor and a display device.
Figure 41:
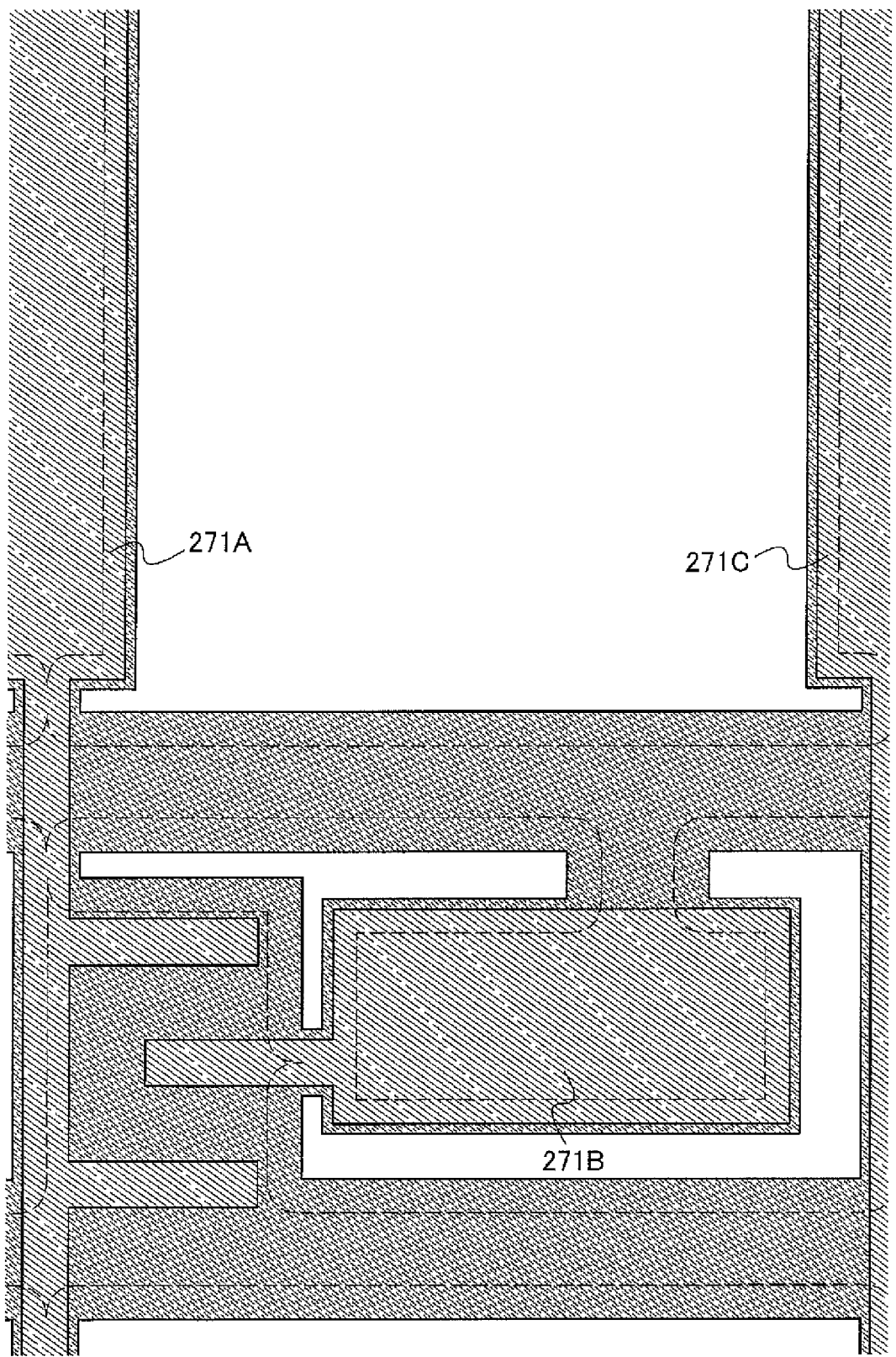
FIG. 41 illustrates an example of a method for manufacturing a thin film transistor and a display device.

Note that FIG. 39, FIG. 40, and FIG. 41 correspond to FIG. 34, FIG. 35, and FIG. 36, respectively.

First, the first conductive film 202, the first insulating film 204, the semiconductor film 206, the impurity semiconductor film 208, and the second conductive film 210 are formed over the substrate 200, and a first resist mask 270 is formed over the second conductive film 210. The first resist mask 270 is different from the first resist mask 212, does not have a depressed portion, and is formed so that an entire surface thereof has approximately the same thickness. That is, the first resist mask 270 can be a normal photomask instead of a multi-tone mask.

Then, first etching is performed using the first resist mask 270. That is, the first insulating film 204, the semiconductor film 206, the impurity semiconductor film 208, and the second conductive film 210 are etched to expose at least a surface of the first conductive film 202, so that the thin film stack 214 is formed over the first conductive film 202 (see FIG. 39).

Then, second etching is performed to form the gate electrode layer 216 (see FIG. 40). After that, the first resist mask 270 is removed by stripping or the like.

Next, a second resist mask 271 (second resist masks 271A to 271 C) is formed over the thin film stack 214, and the source or drain electrode layer 220 is formed using the second resist mask 271. The rest of the process is the same as that in the case where a multi-tone mask is used.

As described above, a thin film transistor can be manufactured without using a multi-tone mask. Note that one more mask is required as compared to the case where a multi-tone mask is used. That is, a thin film transistor can be manufactured using two photomasks. Further, an active matrix substrate having a pixel transistor can be manufactured using four photomasks. Therefore, the number of photomasks to be used is reduced and thus, the number of steps for manufacturing a thin film transistor and a display device can be significantly reduced. Further, manufacturing with high yield and cost reduction can also be achieved. Further, by providing a supporting portion formed using the gate electrode layer 216C, the thin film transistor can keep a mechanical balance and thus, the process for manufacturing a thin film transistor can be simplified without reducing yield and reliability.

As described above, the active matrix substrate having a pixel transistor, which is used for a display device, can be manufactured using three or four photomasks.

Accordingly, the number of steps for manufacturing a thin film transistor and a display device can be significantly reduced. Specifically, as described above, a thin film transistor can be manufactured using one photomask or two photomasks. Further, an active matrix substrate having a pixel transistor can be manufactured using three or four photomasks. Thus, since the number of photomasks to be used is reduced, the number of steps for manufacturing a thin film transistor and a display device can be significantly reduced.

In addition, the number of steps for manufacturing a thin film transistor can be significantly reduced without a complicated step such as backside light exposure, resist reflow, or a lift-off method. Therefore, the number of steps for manufacturing a display device can be significantly reduced without a complicated step.

Further, the number of steps for manufacturing a thin film transistor can be significantly reduced without changing electric characteristics of a thin film transistor Further, manufacturing cost can be significantly reduced by the above advantageous effect.

In addition to the above advantageous effect, a thin film transistor included in a display device is mechanically stable; therefore, a manufacturing process of a display device is simplified without reducing yield and reliability. Further, by applying the manufacturing method according to this embodiment mode, only one opening portion is required to be provided for one pixel and thus the margin of an opening portion can be wide; therefore, yield can be increased.

Note that the gate electrode layer 216C in this embodiment mode has a larger volume of a portion to be etched and a larger area to be exposed to an etching solution, an etching gas, or the like than those of the gate electrode layer 116E in Embodiment Mode 1. Therefore, the gate electrode layer 216C in this embodiment mode can be etched with excellent control and the margin in the process can be wide.

Note that the invention to be disclosed is not limited to a liquid crystal display device and may be applied to any other display device.

Embodiment Mode 3

In this embodiment mode, electronic appliances in each of which a display panel or a display device manufactured by any of the methods described in Embodiment Modes 1 and 2 is incorporated as a display portion will be described with reference to FIGS. 42A and 42B, FIG. 43, and FIGS. 44A to 44C. As such electronic appliances, for example, cameras such as video cameras or digital cameras; head mounted displays (goggle type displays); car navigation systems; projectors; car stereos; personal computers; and portable information terminals (such as mobile computers, mobile phones, and e-book readers) can be given. Examples of the electronic appliances are illustrated in FIGS. 42A and 42B.

Figure 42A:
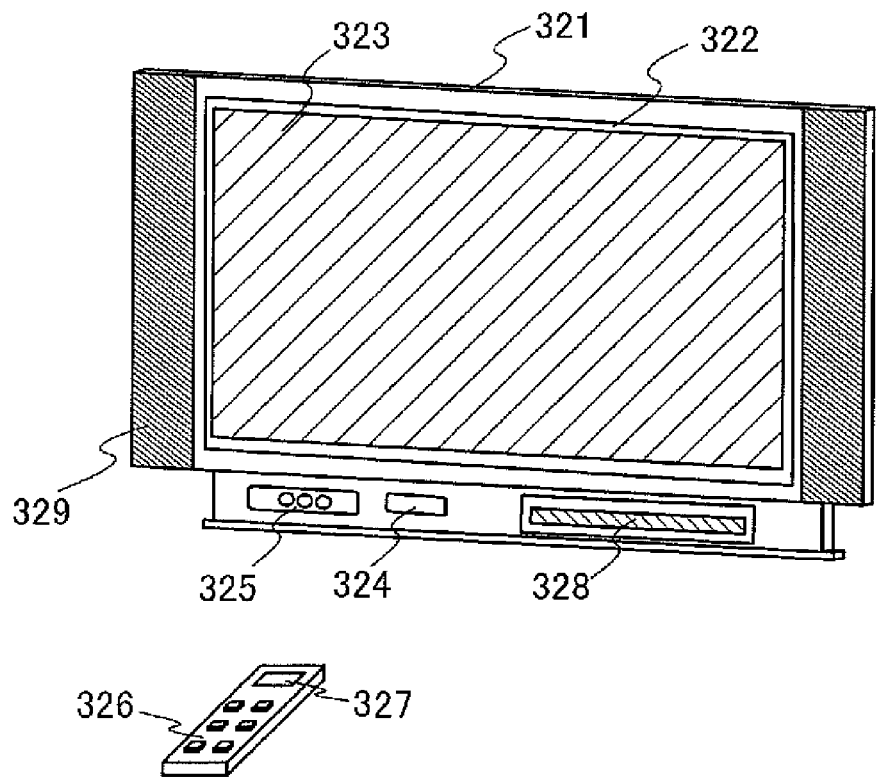
FIGS. 42A and 42B illustrate electronic appliances.
Figure 42B:
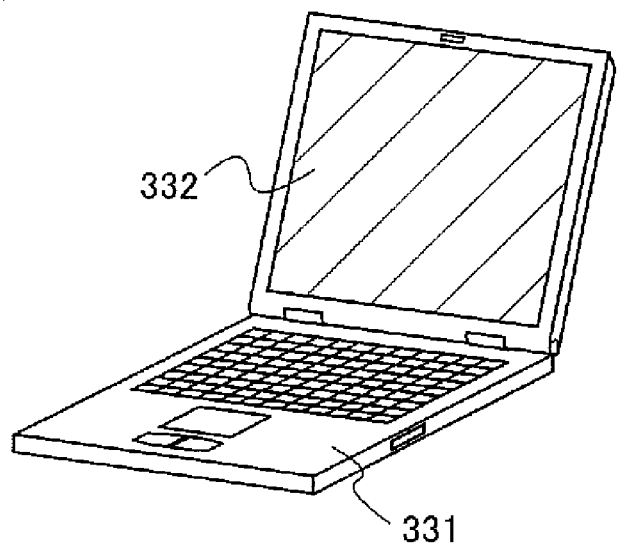

FIG. 42A illustrates a television device. A television device illustrated in FIG. 42A can be completed by incorporating a display panel manufactured using the invention to be disclosed into a housing. A main screen 323 is formed using the display panel manufactured by any of the manufacturing methods described in Embodiment Modes 1 and 2, and a speaker portion 329, operation switches, and the like are provided as its accessory equipment.

As illustrated in FIG. 42A, a display panel 322 manufactured by any of the manufacturing methods described in Embodiment Modes 1 and 2 is incorporated into a housing 321, and general TV broadcast can be received by a receiver 325. When the television device is connected to a communication network by wired or wireless connections via a modem 324, one-way (from a sender to a receiver) or two-way (between a sender and a receiver or between receivers) data communication can be performed. The television device can be operated using switches incorporated into the housing or by a remote controller 326 provided separately. A display portion 327 which displays output data may also be provided for the remote controller 326.

Further, the television device may include a subscreen 328 formed using a second display panel for displaying channels, volume, and the like, in addition to the main screen 323.

Figure 43:
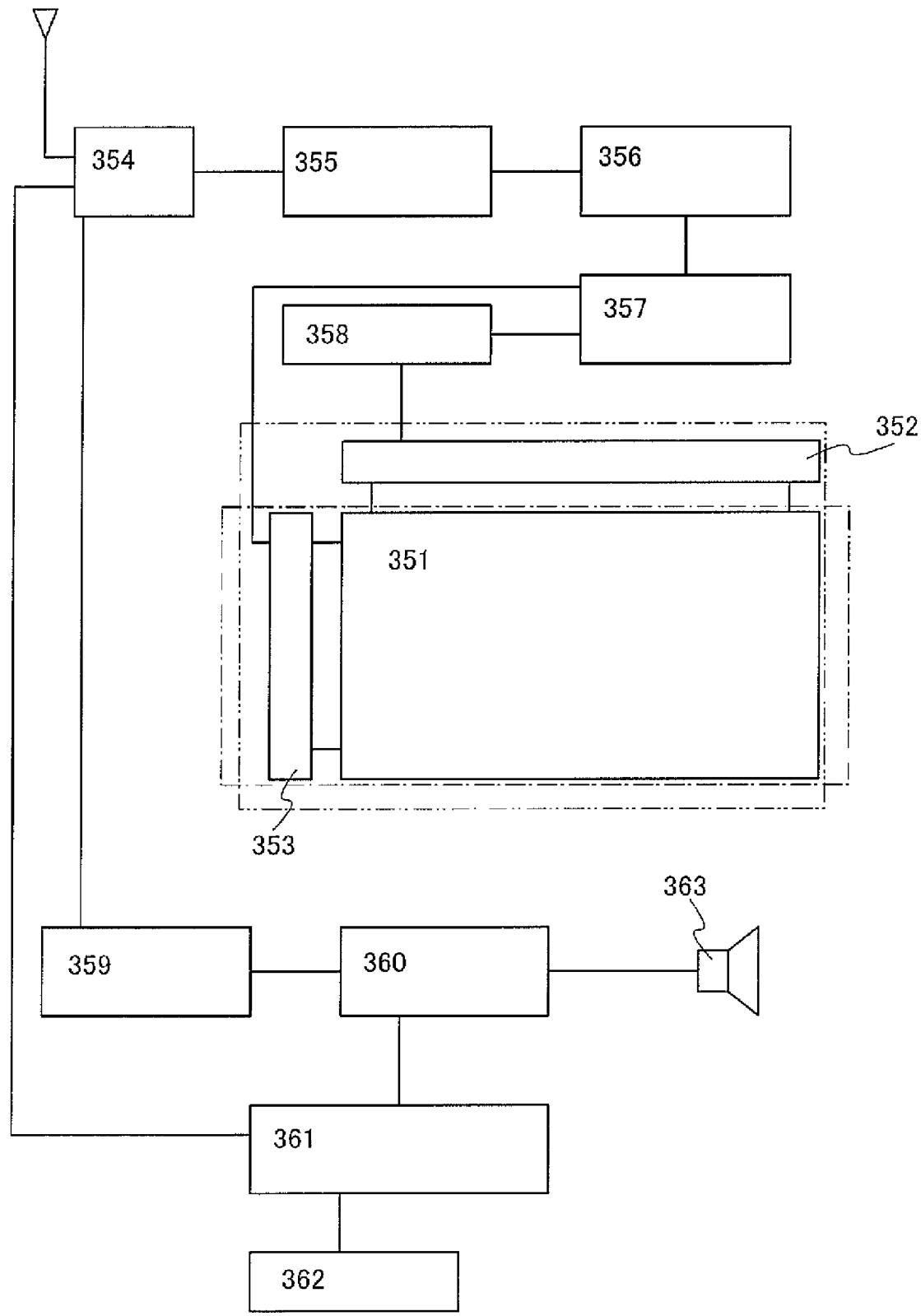
FIG. 43 illustrates an electronic appliance.

FIG. 43 is a block diagram of a main structure of a television device. A pixel portion 351 is formed in a display region. A signal line driver circuit 352 and a scan line driver circuit 353 may be mounted on the display panel by a COG method.

As structures of other external circuits, a video signal amplifier circuit 355 for amplifying a video signal among signals received by a tuner 354, a video signal processing circuit 356 for converting signals output from the video signal amplifier circuit 355 into chrominance signals corresponding to colors of red, green, and blue, a control circuit 357 for converting the video signal into a signal which meets input specifications of a driver IC, and the like are provided on the input side of the video signal. The control circuit 357 outputs signals to each of the scan line side and the signal line side. In the case of digital drive, a signal dividing circuit 358 may be provided on the signal line side and an input digital signal may be divided into m (m is an integer) pieces and supplied.

Among the signals received by the tuner 354, audio signals are transmitted to an audio signal amplifier circuit 359, and an output thereof is supplied to a speaker 363 through an audio signal processing circuit 360. A control circuit 361 receives control data on receiving station (receiving frequency) and volume from an input portion 362 and transmits signals to the tuner 354 and the audio signal processing circuit 360.

It is needless to say that the invention to be disclosed is not limited to the television device and can also be applied to a large-size display medium such as an information display board at a train station, an airport, and the like, or an advertisement display board on the street, as well as a monitor of a personal computer. Productivity of these display mediums can be improved.

When the display panel or display device manufactured by any of the methods for manufacturing a display device, which are described in Embodiment Modes 1 and 2, is applied to the main screen 323 and the subscreen 328, productivity of television devices can be increased.

A mobile computer illustrated in FIG. 42B includes a main body 331, a display portion 332, and the like. When the display panel or display device manufactured by any of the methods for manufacturing a display device, which are described in Embodiment Modes 1 and 2, is applied to the display portion 332, productivity of computers can be increased.

Figure 44A:
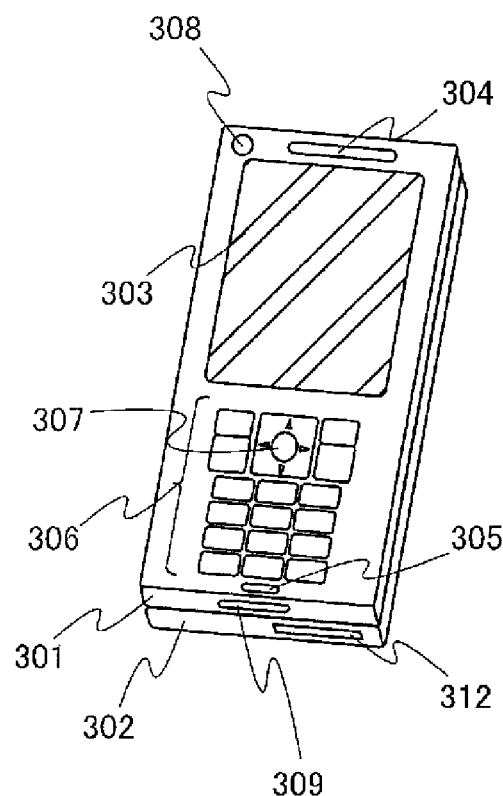
FIGS. 44A to 44C illustrate an electronic appliance.
Figure 44B:
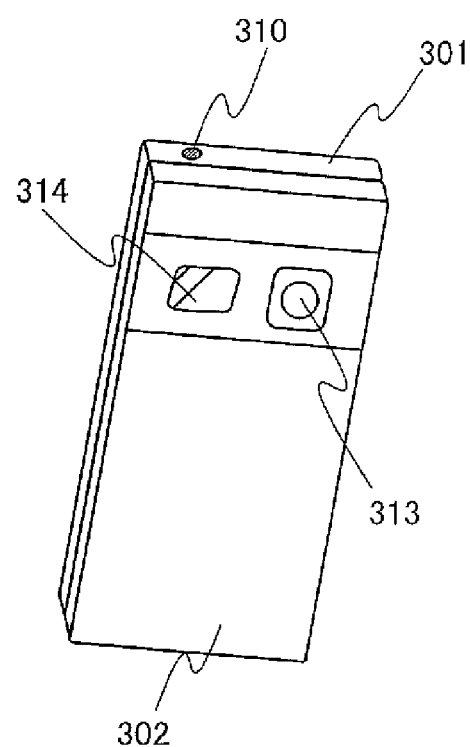
Figure 44C:
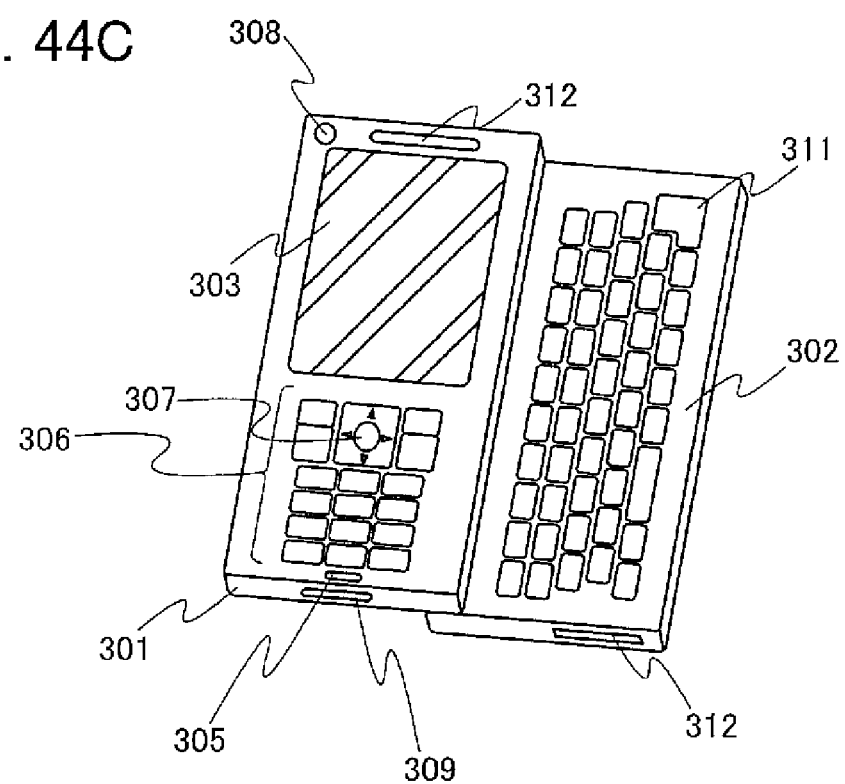

FIGS. 44A to 44C illustrate an example of a mobile phone. FIG. 44A is a front view, FIG. 44B is a rear view, and FIG. 44C is a development view when two housings slide. A mobile phone includes two housings 301 and 302. The mobile phone is a so-called smartphone which has both functions of a mobile phone and a portable information terminal, incorporates a computer, and can process a variety of data processing in addition to voice calls.

The mobile phone includes the housing 301 and the housing 302. The housing 301 includes a display portion 303, a speaker 304, a microphone 305, operation keys 306, a pointing device 307, a front camera lens 308, a jack 309 for an external connection terminal, an earphone terminal 310, and the like, while the housing 302 includes a keyboard 311, an external memory slot 312, a rear camera 313, a light 314, and the like. In addition, an antenna is incorporated in the housing 301.

In addition to the above structure, a wireless IC chip, a small-size memory device, or the like may be incorporated in the mobile phone.

The housings 301 and 302 overlapped with each other (illustrated in FIG. 44A) slide and can be developed as illustrated in FIG. 44C. The display panel or display device manufactured by any of the methods for manufacturing a display device, which are described in Embodiment Modes 1 and 2, can be incorporated in the display portion 303. Since the display portion 303 and the front camera lens 308 are provided in the same plane, the mobile phone can be used as a videophone. A still image and a moving image can be taken by the rear camera 313 and the light 314 by using the display portion 303 as a viewfinder.

By using the speaker 304 and the microphone 305, the mobile phone can be used as an audio recording device (sound recorder) or an audio reproducing device. With use of the operation keys 306, operation of incoming and outgoing calls, simple data input for electronic mail or the like, scrolling of a screen displayed on the display portion, cursor motion for selecting data to be displayed on the display portion, and the like are possible.

If much data is required to be handled, for example, in the case of creating documents or in the case of using the mobile phone as a portable information terminal, the use of the keyboard 311 is convenient. Further, the housings 301 and 302 overlapped with each other (FIG. 44A) slide and can be developed as illustrated in FIG. 44C. In the case where the mobile phone is used as a portable information terminal, smooth operation with the keyboard 311 and the pointing device 307 can be performed. The jack 309 for an external connection terminal can be connected to various cables such as an AC adopter and a USB cable, whereby the mobile phone can be charged or can perform data communication with a personal computer or the like. Moreover, by inserting a recording medium into the external memory slot 312, the mobile phone can deal with storing and moving a larger amount of data.

In the rear surface of the housing 302 (FIG. 44B), the rear camera 313 and the light 314 are provided, and a still image and a moving image can be taken by using the display portion 303 as a viewfinder.

Further, the mobile phone may have an infrared communication function, a USB port, a function of receiving one segment television broadcast, a non-contact IC chip, an earphone jack, or the like, in addition to the above functions and structures.

Since various electronic appliances described in this embodiment mode can be manufactured by any of the methods for manufacturing a thin film transistor and a display device, which are described in Embodiment Modes 1 and 2, productivity of these electronic appliances can be increased.

Accordingly, manufacturing cost of these electronic appliances can be significantly reduced.

This application is based on Japanese Patent Application serial no. 2008-043856 filed with Japan Patent Office on Feb. 26, 2008, the entire contents of which are hereby incorporated by reference.

What is claimed is:
1. A method for manufacturing a display device, comprising:
forming a first conductive film;
forming a first insulating film over the first conductive film;
forming a semiconductor film over the first insulating film;
forming an impurity semiconductor film over the semiconductor film;
forming a second conductive film over the impurity semiconductor film;
forming a first resist mask over the second conductive film;

first etching the first insulating film, the semiconductor film, the impurity semiconductor film, and the second conductive film by using the first resist mask so that at least a surface of the first conductive film is exposed;

second etching a portion of the first conductive film by side etching to form a gate electrode and a supporting portion;

forming a second resist mask over the second conductive film;

third etching the second conductive film, the impurity semiconductor film, and a portion of the semiconductor film by using the second resist mask to form a source electrode layer, a drain electrode layer, a source region, a drain region, and a semiconductor layer so that a thin film transistor is formed;

removing the second resist mask;

forming a second insulating film to cover the thin film transistor;

forming an opening portion in the second insulating film so that the source electrode layer or the drain electrode layer is partially exposed; and selectively forming a pixel electrode in the opening portion and over the second insulating film, wherein the supporting portion is formed in a region overlapping with the opening portion.

2. The method for manufacturing a display device, according to claim 1, wherein the first resist mask is formed using a multi-tone mask.

3. The method for manufacturing a display device, according to claim 1, wherein an element region is formed by the first etching; and wherein a side surface of the gate electrode and a side surface of the supporting portion are recessed with respect to side surfaces of the element region by the second etching.

4. The method for manufacturing a display device, according to claim 1, wherein the first etching is dry etching, and wherein the second etching is wet etching.

5. The method for manufacturing a display device, according to claim 1, wherein the second insulating film is formed by stacking an insulating film formed by a CVD method or a sputtering method and an insulating film formed by a spin coating method.

6. The method for manufacturing a display device, according to claim 1, wherein a portion of the supporting portion overlaps with the opening portion.

7. The method for manufacturing a display device, according to claim 1, wherein the second etching is performed after forming the second resist mask.

8. A method for manufacturing a display device, comprising:

forming a first conductive film;

forming a first insulating film over the first conductive film;

forming a semiconductor film over the first insulating film;

forming an impurity semiconductor film over the semiconductor film;

forming a second conductive film over the impurity semiconductor film;

forming a first resist mask having a depressed portion over the second conductive film;

first etching the first insulating film, the semiconductor film, the impurity semiconductor film, and the second conductive film by using the first resist mask so that at least a surface of the first conductive film is exposed;

second etching a portion of the first conductive film by side etching to form a gate electrode and a supporting portion;

exposing the second conductive film overlapping with the depressed portion of the first resist mask by reducing the first resist mask in size and forming a second resist mask;

third etching the second conductive film, the impurity semiconductor film, and a portion of the semiconductor film by using the second resist mask to form a source electrode layer, a drain electrode layer, a source region, a drain region, and a semiconductor layer so that a thin film transistor is formed;

removing the second resist mask;

forming a second insulating film to cover the thin film transistor;

forming an opening portion in the second insulating film so that the source electrode layer or the drain electrode layer is partially exposed; and selectively forming a pixel electrode in the opening portion and over the second insulating film, wherein the supporting portion is formed in a region overlapping with the opening portion.

9. The method for manufacturing a display device, according to claim 8, wherein the first resist mask is formed using a multi-tone mask.

10. The method for manufacturing a display device, according to claim 8, wherein an element region is formed by the first etching; and wherein a side surface of the gate electrode and a side surface of the supporting portion are recessed with respect to side surfaces of the element region by the second etching.

11. The method for manufacturing a display device, according to claim 8, wherein the first etching is dry etching, and wherein the second etching is wet etching.

12. The method for manufacturing a display device, according to claim 8, wherein the second insulating film is formed by stacking an insulating film formed by a CVD method or a sputtering method and an insulating film formed by a spin coating method.

13. The method for manufacturing a display device, according to claim 8, wherein a portion of the supporting portion overlaps with the opening portion.

14. The method for manufacturing a display device, according to claim 8, wherein the second etching is performed after forming the second resist mask.

* * * * *